US011507642B2

(12) United States Patent
Tran et al.

(10) Patent No.: US 11,507,642 B2
(45) Date of Patent: Nov. 22, 2022

(54) CONFIGURABLE INPUT BLOCKS AND OUTPUT BLOCKS AND PHYSICAL LAYOUT FOR ANALOG NEURAL MEMORY IN DEEP LEARNING ARTIFICIAL NEURAL NETWORK

(71) Applicant: Silicon Storage Technology, Inc., San Jose, CA (US)

(72) Inventors: Hieu Van Tran, San Jose, CA (US); Stephen Trinh, San Jose, CA (US); Thuan Vu, San Jose, CA (US); Stanley Hong, San Jose, CA (US); Vipin Tiwari, Dublin, CA (US); Mark Reiten, Alamo, CA (US); Nhan Do, Saratoga, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 746 days.

(21) Appl. No.: 16/449,201

(22) Filed: Jun. 21, 2019

(65) Prior Publication Data
US 2020/0349421 A1    Nov. 5, 2020

Related U.S. Application Data

(60) Provisional application No. 62/842,279, filed on May 2, 2019.

(51) Int. Cl.
 *G06F 17/16* (2006.01)
 *G11C 16/08* (2006.01)
(Continued)

(52) U.S. Cl.
 CPC .......... *G06F 17/16* (2013.01); *G06N 3/0635* (2013.01); *G11C 11/54* (2013.01);
(Continued)

(58) Field of Classification Search
 CPC .... G06F 17/16; G06N 3/0635; G06N 3/0445; G06N 3/0454; G06N 3/0481; G06N 3/04;
(Continued)

(56) References Cited

U.S. PATENT DOCUMENTS 5,029,130 A    7/1991  Yeh
5,298,796 A    3/1994  Tawel
(Continued)

FOREIGN PATENT DOCUMENTS

CN    108932548 A  * 12/2018  ............. G06N 3/082
EP      0385436 A2     9/1990
(Continued)

OTHER PUBLICATIONS

The Taiwanese Search Report dated Jun. 2, 2021 for the related Taiwanese Patent Application No. 109109710.
(Continued)

*Primary Examiner* — Fernando Hidalgo
(74) *Attorney, Agent, or Firm* — DLA Piper LLP US

(57) ABSTRACT

Configurable input blocks and output blocks and physical layouts are disclosed for analog neural memory systems that utilize non-volatile memory cells. An input block can be configured to support different numbers of arrays arranged in a horizontal direction, and an output block can be configured to support different numbers of arrays arranged in a vertical direction. Adjustable components are disclosed for use in the configurable input blocks and output blocks.

63 Claims, 44 Drawing Sheets

(51) Int. Cl.
*G06N 3/063* (2006.01)
*G11C 11/54* (2006.01)
*G11C 16/04* (2006.01)

(52) U.S. Cl.
CPC .......... *G11C 16/0483* (2013.01); *G11C 16/08* (2013.01); *G11C 2216/04* (2013.01)

(58) Field of Classification Search
CPC ..... G11C 11/54; G11C 16/0483; G11C 16/08; G11C 2216/04; G11C 2029/4402; G11C 2029/5006; G11C 27/005; G11C 29/44; G11C 11/5642; G11C 29/028; G11C 29/50
USPC .......................................................... 706/36
See application file for complete search history.

(56) References Cited

U.S. PATENT DOCUMENTS

| | | | |
|---|---|---|---|
| 6,747,310 | B2 | 6/2004 | Fan |
| 9,646,685 | B2 | 5/2017 | Park et al. |
| 10,123,143 | B2 | 11/2018 | Parupalli et al. |
| 10,205,463 | B1 | 2/2019 | Milkov et al. |
| 10,594,334 | B1* | 3/2020 | Far .......................... G06G 7/24 |
| 10,756,748 | B1* | 8/2020 | Khatavkar .............. H01L 29/94 |
| 2008/0310245 | A1 | 12/2008 | Baker et al. |
| 2014/0085985 | A1* | 3/2014 | Pan ........................ G11C 5/145 327/536 |
| 2017/0337466 | A1 | 11/2017 | Bayat et al. |
| 2019/0019564 | A1 | 1/2019 | Li |
| 2019/0058483 | A1* | 2/2019 | Kim ........................ H03M 1/14 |
| 2019/0164617 | A1 | 5/2019 | Tran et al. |
| 2020/0105346 | A1* | 4/2020 | Yang ................. H01L 27/11521 |
| 2020/0202586 | A1* | 6/2020 | Li .......................... G06T 11/003 |
| 2020/0349440 | A1* | 11/2020 | Gokmen ................ G06N 20/10 |

FOREIGN PATENT DOCUMENTS

| | | | |
|---|---|---|---|
| KR | 20140099858 A | * 8/2014 | |
| TW | 201837737 | 10/2018 | |
| WO | WO-2016164049 A1 | * 10/2016 | ......... G11C 13/0007 |

OTHER PUBLICATIONS

Klachko, et al., "Improving Noise Tolerance of Mixed-Signal Neural Networks," Cornell University Library, Apr. 3, 2019, 2020 IEEE.

Lin, et al., "A Novel Voltage-Accumulation Vector-Matrix Multiplication Architecture Using Resistor-shunted Floating Gate Flash Memory Device for Low-power and High-density Neural Network Applications," p. 2.4.1-2.4.4, 2018 IEEE International Electron Devices Meeting, Dec. 1, 2018.

Guo, et al., "Temperature-Insensitive Analog Vector-by-Matrix Multiplier Based on 55nm NOR Flash Memory Cells," Apr. 30, 2017, IEEE.

Bavandpour, et al., "Energy-Efficient Time-Domain Vector-by-Matrix Multiplier for Neurocomputing and Beyond," pp. 1-6, Nov. 29, 2017 (retrieved from the Internet: url:https://arxiv.org/pdf/1711.10673.pdf).

Bayat, et al., "Model-Based High-Precision Runing of NOR Flash Memory Cells for Analog Computing Applications," pp. 1-2, 2016 74th Annual Device Research Conference, IEEE Jun. 19, 2016.

AVR127: "Understanding ADC Parameters," https://www.microchip.com/wwwAppNotes/AppNotes.aspx?appnote=en590903—Dec. 10, 2016.

Yuan Du et al., "A Memristive Neural Network Computing Engine Using CMOS-Compatible Charge-Trap-Transistor," pp. 1-8, retrieved from the Internet, Sep. 2017, (See attached).

PCT Search Report & Written Opinion corresponding to the related PCT/US2019/062073.

\* cited by examiner

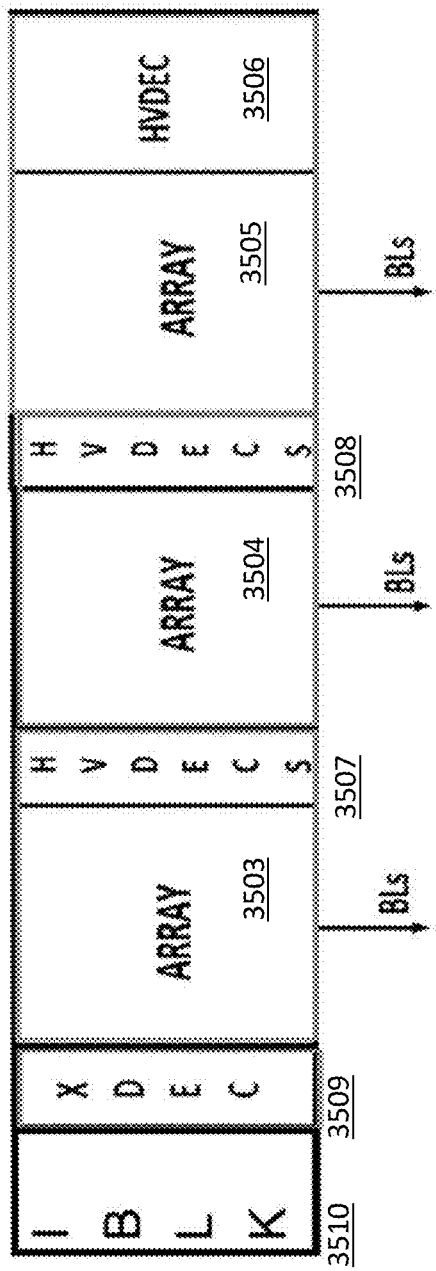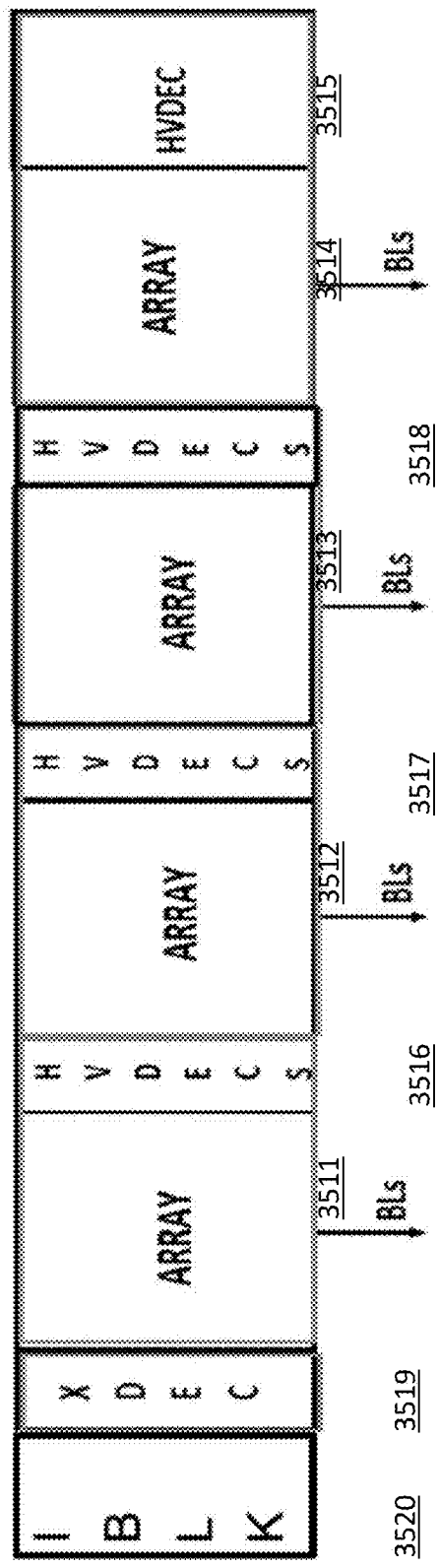
FIGURE 35A
FIGURE 35B

Real Time Calibration
5010

5011 — Perform a leakage and/or offset calibration, comprising measuring the leakage and/or offset and storing the measured values as leakage value and/or offset_value 5012 — Determine the LSB using the following formula:
LSB = leakage_value and/or offset_value + deltaLmin 5013 — Determine the MSB using the following formula:
MSB = LSB + (N-1)*deltaL, where N is the number of levels

FIGURE 50B   Background Calibration
5020

5021 — Store offset_value and/or leakage_value + temperature data in fuses in a calibration step 5022 — Recall offset_value and/or leakage_value temperature data 5023 — Perform a temperature adjustment for level_value and/or leakage_value 5024 — Determine the LSB using the following formular LSB level = offset_value and/or leakage_value+ deltaLmin 5025 — Determine the MSB using the following formula: MSB = LSB + (N-1)*deltaL, where N is the number of levels

CONFIGURABLE INPUT BLOCKS AND OUTPUT BLOCKS AND PHYSICAL LAYOUT FOR ANALOG NEURAL MEMORY IN DEEP LEARNING ARTIFICIAL NEURAL NETWORK

PRIORITY CLAIM

This application claims priority to U.S. Provisional Application No. 62/842,279, filed on May 2, 2019, and titled, "CONFIGURABLE INPUT BLOCKS AND OUTPUT BLOCKS AND PHYSICAL LAYOUT FOR ANALOG NEURAL MEMORY IN DEEP LEARNING ARTIFICIAL NEURAL NETWORK," which is incorporated by reference herein.

FIELD OF THE INVENTION

Configurable input blocks and output blocks and associated physical layouts are disclosed for analog neural memory systems that utilize non-volatile memory cells.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses required.

Applicant previously disclosed an artificial (analog) neural network that utilizes one or more non-volatile memory arrays as the synapses in U.S. patent application Ser. No. 15/594,439, published as US Patent Publication No. 2017/0337466, which is incorporated by reference. The non-volatile memory arrays operate as an analog neural memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Each non-volatile memory cells used in the analog neural memory system must be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256.

One challenge in vector by matrix multiplication (VMM) systems is the ability to quickly and accurately deliver an output from a VMM as an input to another VMM, and to do so while efficiently utilizing the physical space within a semiconductor die.

What is needed are configurable input blocks and output blocks and physical layouts for analog neural memory systems that utilize non-volatile memory cells.

SUMMARY OF THE INVENTION

Configurable input blocks and output blocks and associated physical layouts are disclosed for analog neural memory systems that utilize non-volatile memory cells.

One embodiment of an analog neural memory system comprises a plurality of vector-by-matrix multiplication arrays, each array comprising non-volatile memory cells organized into rows and columns; and an input block capable of providing an input to a configurable number N of the plurality of vector-by-matrix multiplication arrays, where N can range between 1 and the total number of arrays in the plurality of vector-by-matrix multiplication arrays; wherein the arrays that receive the input provide an output in response to the input.

Another embodiment of an analog neural memory system comprises a plurality of vector-by-matrix multiplication arrays, each plurality of vector-by-matrix multiplication array comprising non-volatile memory cells organized into rows and columns; and an output block capable of providing an output from a configurable number N of the plurality of vector-by-matrix multiplication arrays, where N can range between 1 and the total number of arrays in the plurality of vector-by-matrix multiplication arrays; wherein the output is provided in response to a received input.

Another embodiment of an analog neural memory system comprises a plurality of vector-by-matrix multiplication arrays, each array comprising non-volatile memory cells organized into rows and columns; and an output block for performing a verify operation after a programming operation for a configurable number N of the vector-by-matrix multiplication arrays, where N can range between 1 and the total number of arrays in the plurality of vector-by-matrix multiplication arrays.

Another embodiment of an analog neural memory system comprises a plurality of vector-by-matrix multiplication arrays, each array comprising non-volatile memory cells organized into rows and columns; an input block capable of providing an input to a first configurable number N of the vector-by-matrix multiplication arrays, where N can range between 1 and the total number of arrays in the plurality of vector-by-matrix multiplication arrays; and an output block capable of providing an output from a second configurable number M of the vector-by-matrix multiplication arrays, where M can range between 1 and the total number of arrays in the plurality of vector-by-matrix multiplication arrays; wherein the output block generates the output in response to the input.

Another embodiment of an analog neural memory system comprises a plurality of vector-by-matrix multiplication arrays, each vector-by-matrix multiplication array comprising non-volatile memory cells organized into rows and columns; and an output block capable of receiving output neuron current from one or more of the vector-by-matrix multiplication arrays and generating digital output bits using a ramp analog-to-digital converter.

Another embodiment of an analog neural memory system comprises a plurality of vector-by-matrix multiplication arrays, each vector-by-matrix multiplication array comprising non-volatile memory cells; and an input block capable of converting a plurality of digital input bits into a binary-indexed, time-summation signal as a timing input for at least one of the vector-by-matrix multiplication arrays.

An embodiment of a method of performing output conversion for an analog neural memory comprising a plurality of vector-by-matrix multiplication arrays, each vector-by-matrix multiplication array comprising non-volatile memory cells, comprises receiving output neuron current from one or more of the plurality of vector-by-matrix multiplication arrays; and generating digital output bits using the output neuron current and a ramp analog-to-digital converter, the converter operating in a coarse comparison mode and a fine comparison mode.

BRIEF DESCRIPTION OF THE DRAWINGS

FIG. 35A depicts an exemplary block diagram of a vector-by-matrix multiplication system, where horizontally-adjacent arrays share an input block.

FIG. 35B depicts an exemplary block diagram of a vector-by-matrix multiplication system, where horizontally-adjacent arrays share an input block.

FIG. 50A depicts a real-time calibration method.

FIG. 50B depicts a background calibration method.

DETAILED DESCRIPTION OF THE INVENTION

The artificial neural networks of the present invention utilize a combination of CMOS technology and non-volatile memory arrays.

Non-Volatile Memory Cells

Figure 1:
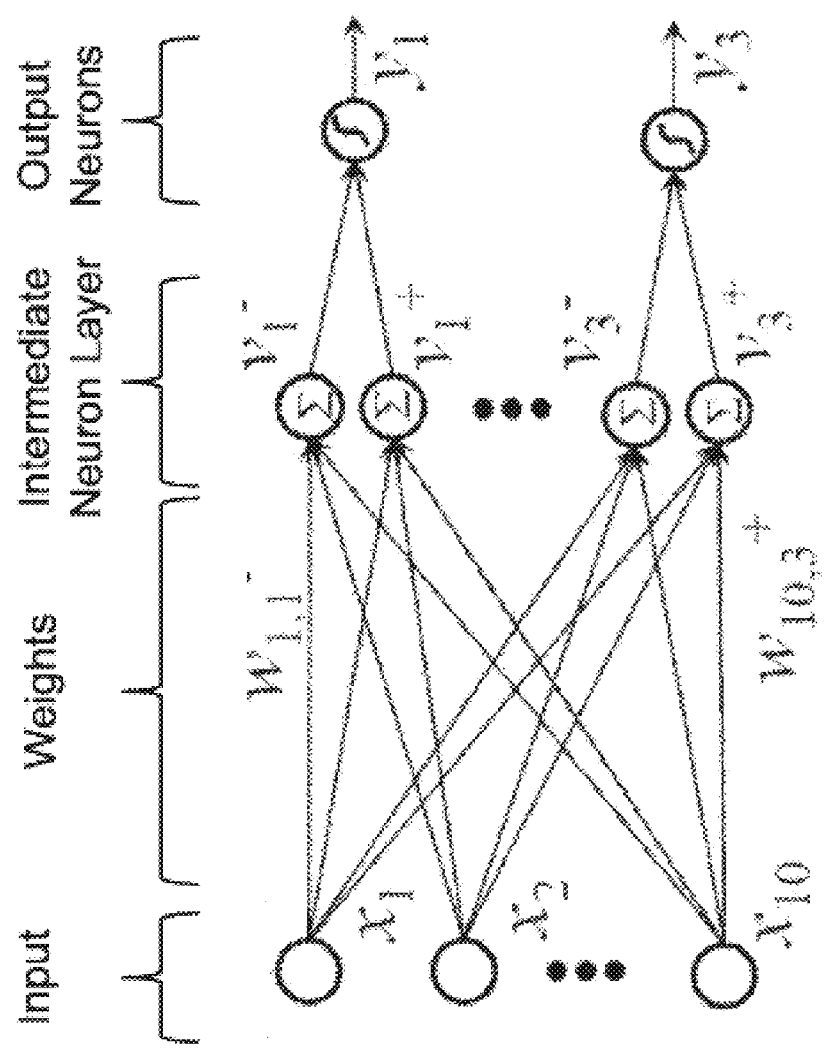
FIG. 1 is a diagram that illustrates a prior art artificial neural network.
Figure 2:
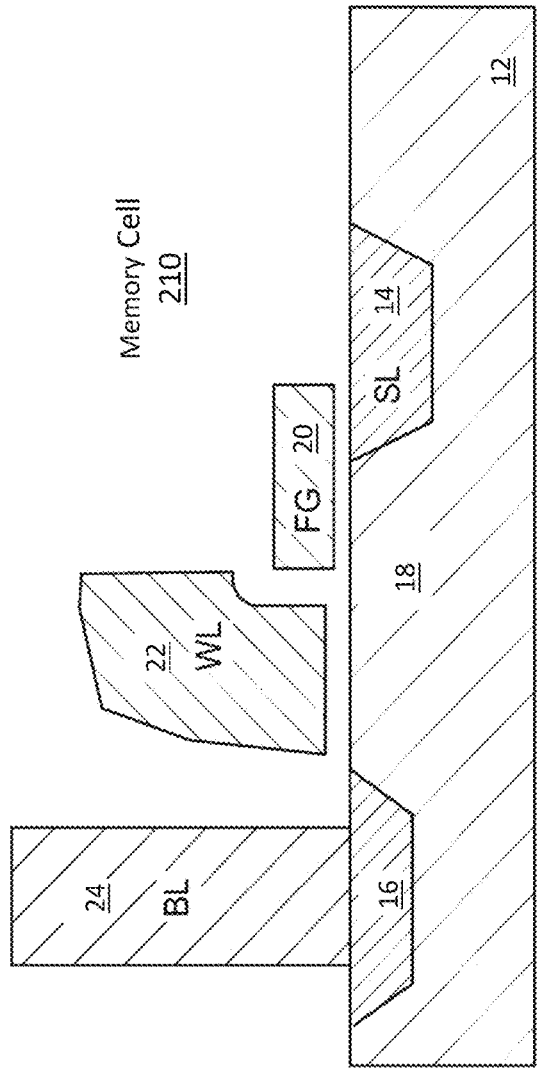
FIG. 2 depicts a prior art split gate flash memory cell

Digital non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the source region 14 towards the drain region 16. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE NO. 1

| Operation of Flash Memory Cell 210 of FIG. 2 | | | |
|---|---|---|---|
|  | WL | BL | SL |
| Read 1 | 0.5-3 V | 0.1-2 V | 0 V |
| Read 2 | 0.5-3 V | 0-2 V | 2-0.1 V |
| Erase | ~11-13 V | 0 V | 0 V |
| Program | 1-2 V | 1-3 µA | 9-10 V |

"Read 1" is a read mode in which the cell current is output on the bit line. "Read 2" is a read mode in which the cell current is output on the source line.

Figure 3:
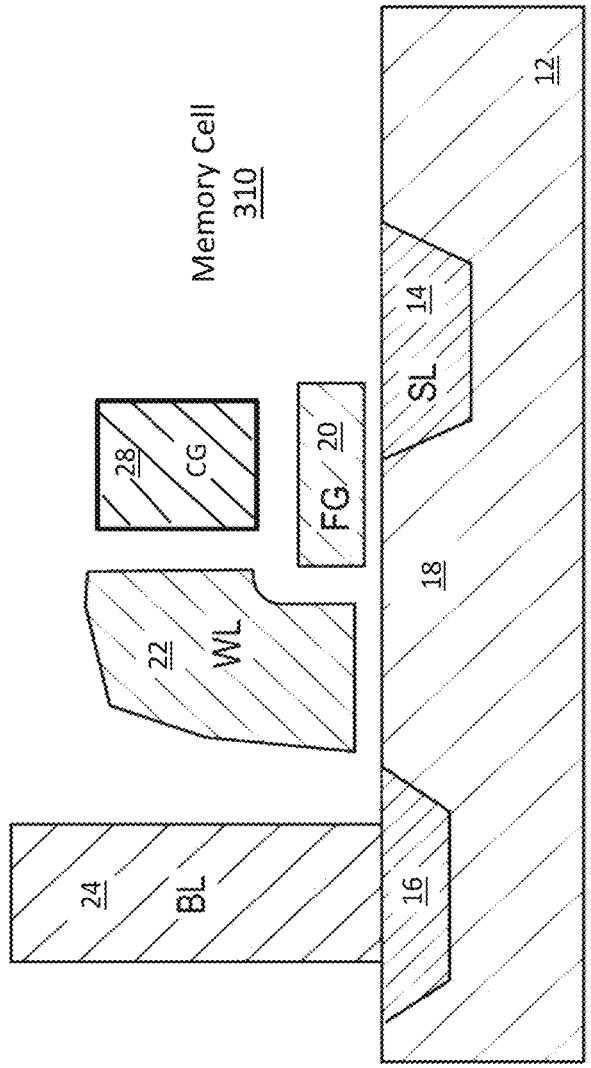
FIG. 3 depicts another prior art split gate flash memory cell

FIG. 3 shows memory cell 310, which is similar to memory cell 210 of FIG. 2 with the addition of control gate (CG) 28. Control gate 28 is biased at a high voltage, e.g., 10V, in programming, low or negative in erase, e.g., 0 v/−8V, low or mid range in read, e.g., 0 v/2.5V. Other terminals are biased similarly to that of FIG. 2.

Figure 4:
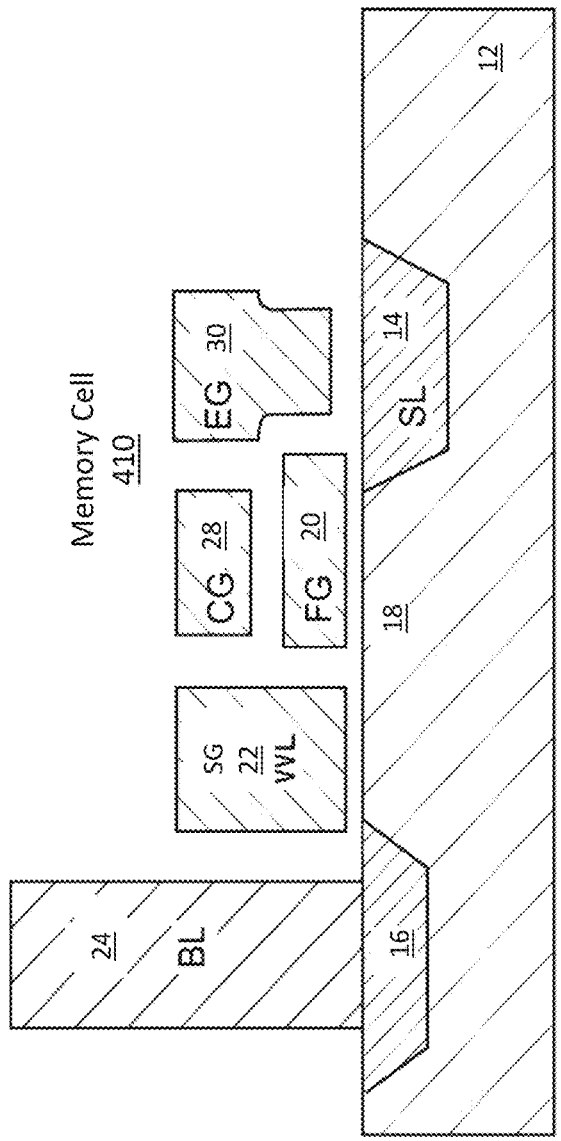
FIG. 4 depicts another prior art split gate flash memory cell.

FIG. 4 depicts four-gate memory cell 410 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 310 for performing read, erase, and program operations:

TABLE NO. 2

| Operation of Flash Memory Cell 410 of FIG. 4 | | | | | |
|---|---|---|---|---|---|
|  | WL/SG | BL | CG | EG | SL |
| Read 1 | 0.5-2 V | 0.1-2 V | 0-2.6 V | 0-2.6 V | 0 V |
| Read 2 | 0.5-2 V | 0-2 V | 0-2.6 V | 0-2.6 V | 2-0.1 V |
| Erase | −0.5 V/0 V | 0 V | 0 V/−8 V | 8-12 V | 0 V |
| Program | 1 V | 1 µA | 8-11 V | 4.5-9 V | 4.5-5 V |

"Read 1" is a read mode in which the cell current is output on the bit line. "Read 2" is a read mode in which the cell current is output on the source line.

Figure 5:
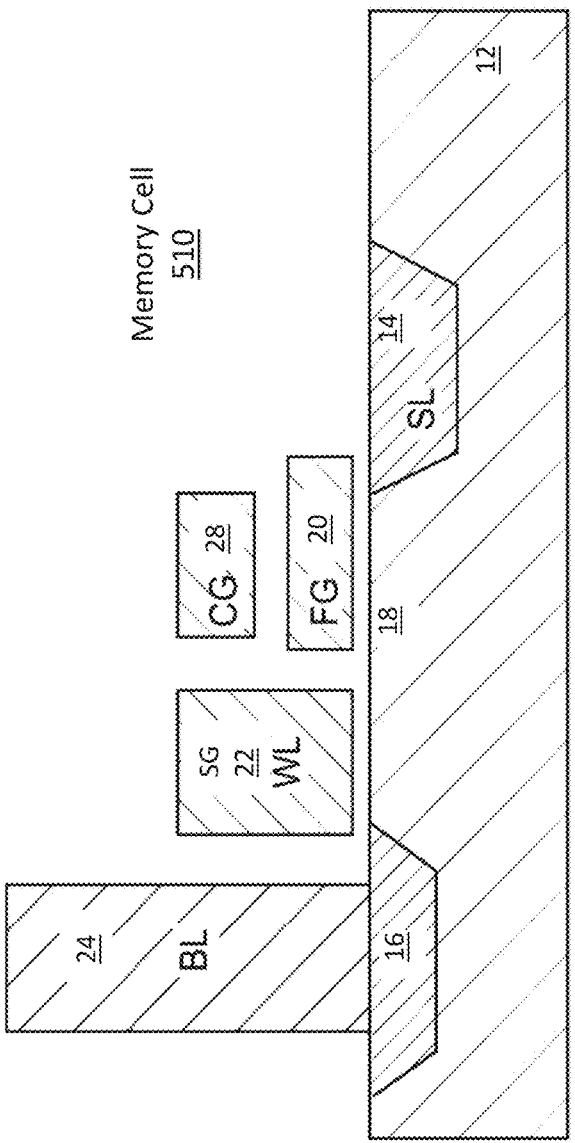
FIG. 5 depicts another prior art split gate flash memory cell

FIG. 5 shows memory cell 510, which is similar to memory cell 410 of FIG. 4 except that memory cell 510 does not contain an erase gate EG. An erase is performed by biasing the substrate 18 to a high voltage and biasing the control gate CG 28 to a low or negative voltage. Alternatively, an erase is performed by biasing word line 22 to a positive voltage and biasing control gate 28 to a negative voltage. Programming and reading is similar to that of FIG. 4.

Figures 6, 7:
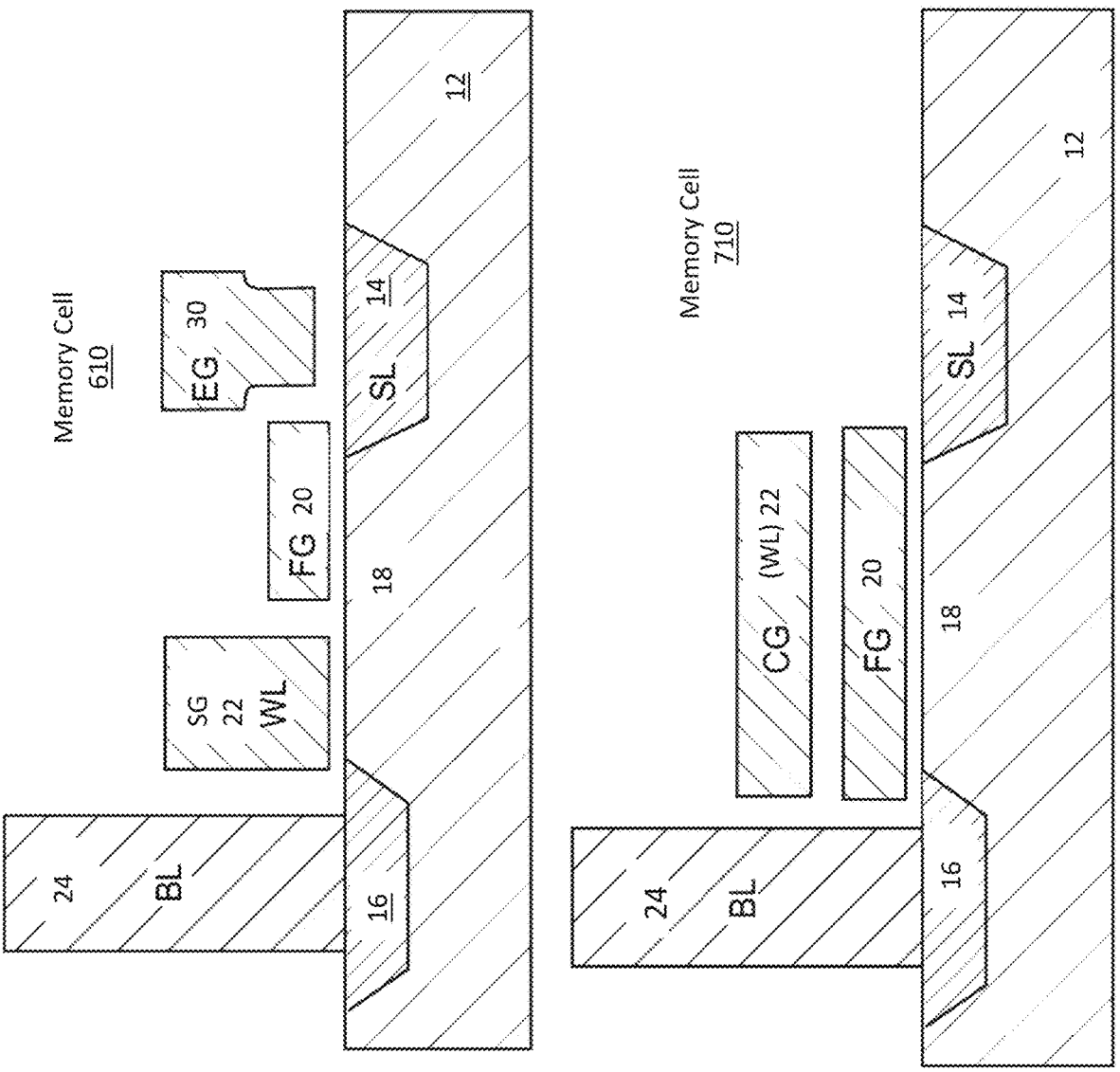
FIG. 6 depicts another prior art split gate flash memory cell.
FIG. 7 depicts a prior art stacked gate flash memory cell.

FIG. 6 depicts a three-gate memory cell 610, which is another type of flash memory cell. Memory cell 610 is identical to the memory cell 410 of FIG. 4 except that memory cell 610 does not have a separate control gate. The erase operation (whereby erasing occurs through use of the erase gate) and read operation are similar to that of the FIG. 4 except there is no control gate bias applied. The programming operation also is done without the control gate bias, and as a result, a higher voltage must be applied on the source line during a program operation to compensate for a lack of control gate bias.

Table No. 3 depicts typical voltage ranges that can be applied to the terminals of memory cell 610 for performing read, erase, and program operations:

TABLE NO. 3

Operation of Flash Memory Cell 610 of FIG. 6

|  | WL/SG | BL | EG | SL |
|---|---|---|---|---|
| Read 1 | 0.5-2.2 V | 0.1-2 V | 0-2.6 V | 0 V |
| Read 2 | 0.5-2.2 V | 0-2 V | 0-2.6 V | 2-0.1 V |
| Erase | −0.5 V/0 V | 0 V | 11.5 V | 0 V |
| Program | 1 V | 2-3 µA | 4.5 V | 7-9 V |

"Read 1" is a read mode in which the cell current is output on the bit line. "Read 2" is a read mode in which the cell current is output on the source line.

FIG. 7 depicts stacked gate memory cell 710, which is another type of flash memory cell. Memory cell 710 is similar to memory cell 210 of FIG. 2, except that floating gate 20 extends over the entire channel region 18, and control gate 22 (which here will be coupled to a word line) extends over floating gate 20, separated by an insulating layer (not shown). The erase, programming, and read operations operate in a similar manner to that described previously for memory cell 210.

Table No. 4 depicts typical voltage ranges that can be applied to the terminals of memory cell 710 and substrate 12 for performing read, erase, and program operations:

TABLE NO. 4

Operation of Flash Memory Cell 710 of FIG. 7

|  | CG | BL | SL | Substrate |
|---|---|---|---|---|
| Read 1 | 0-5 V | 0.1-2 V | 0-2 V | 0 V |
| Read 2 | 0.5-2 V | 0-2 V | 2-0.1 V | 0 V |
| Erase | −8 to −10 V/0 V | FLT | FLT | 8-10 V/15-20 V |
| Program | 8-12 V | 3-5 V/0 V | 0 V/3-5 V | 0 V |

"Read 1" is a read mode in which the cell current is output on the bit line. "Read 2" is a read mode in which the cell current is output on the source line. Optionally, in arrays comprising rows and columns of memory cells 210, 310, 410, 510, 610, or 710, source lines can be coupled to one row of memory cells or to two adjacent rows of memory cells. That is, source lines can be shared by adjacent rows of memory cells.

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

The methods and means described herein may apply to other non-volatile memory technologies such as SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), OTP (bi-level or multi-level one time programmable), and CeRAM (correlated electron ram), without limitation. The methods and means described herein may apply to volatile memory technologies used for neural network such as SRAM, DRAM, and volatile synapse cell, without limitation.

Neural Networks Employing Non-Volatile Memory Cell Arrays

Figure 8:
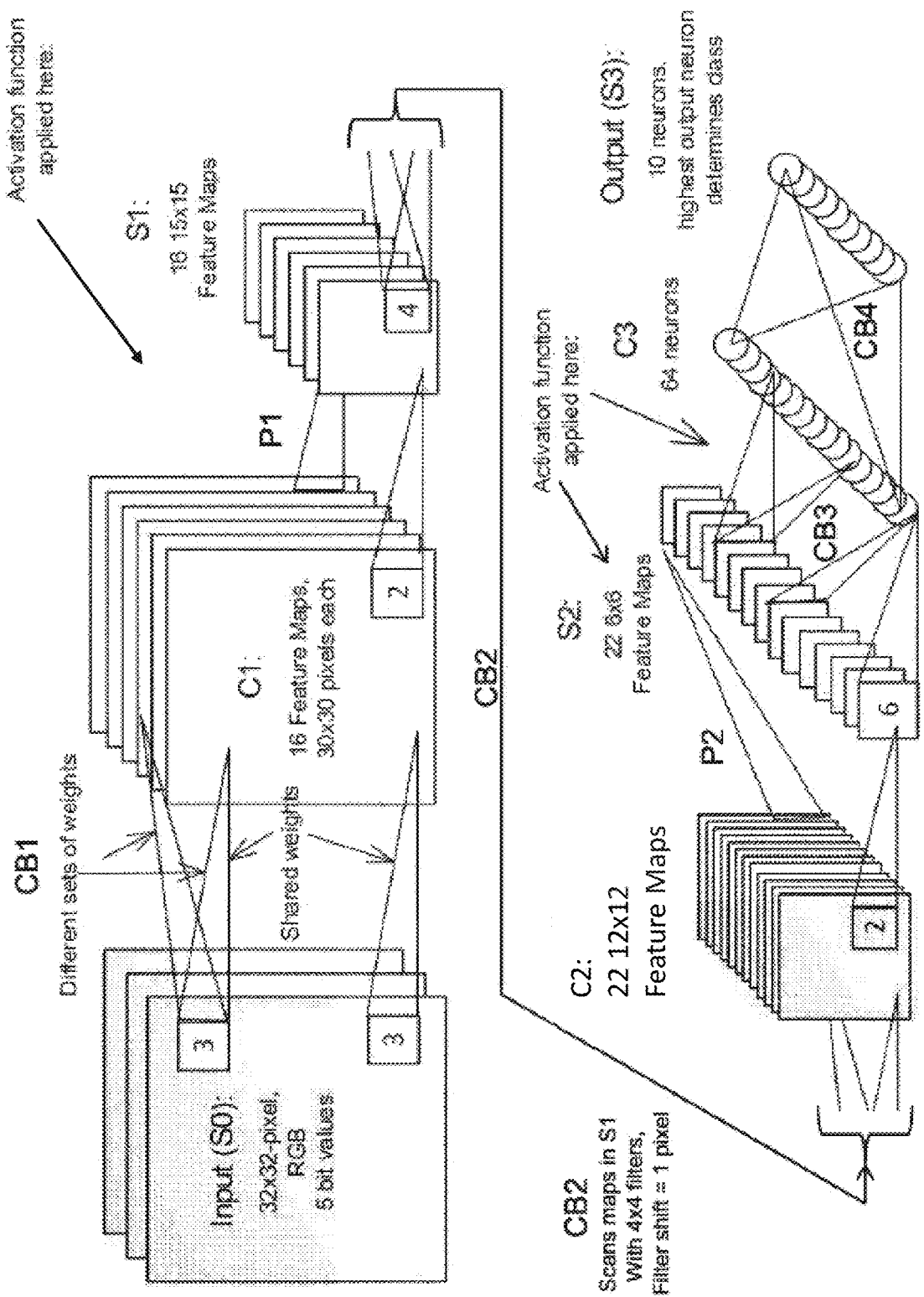
FIG. 8 is a diagram illustrating the different levels of an exemplary artificial neural network utilizing one or more non-volatile memory arrays.

FIG. 8 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

Figure 9:
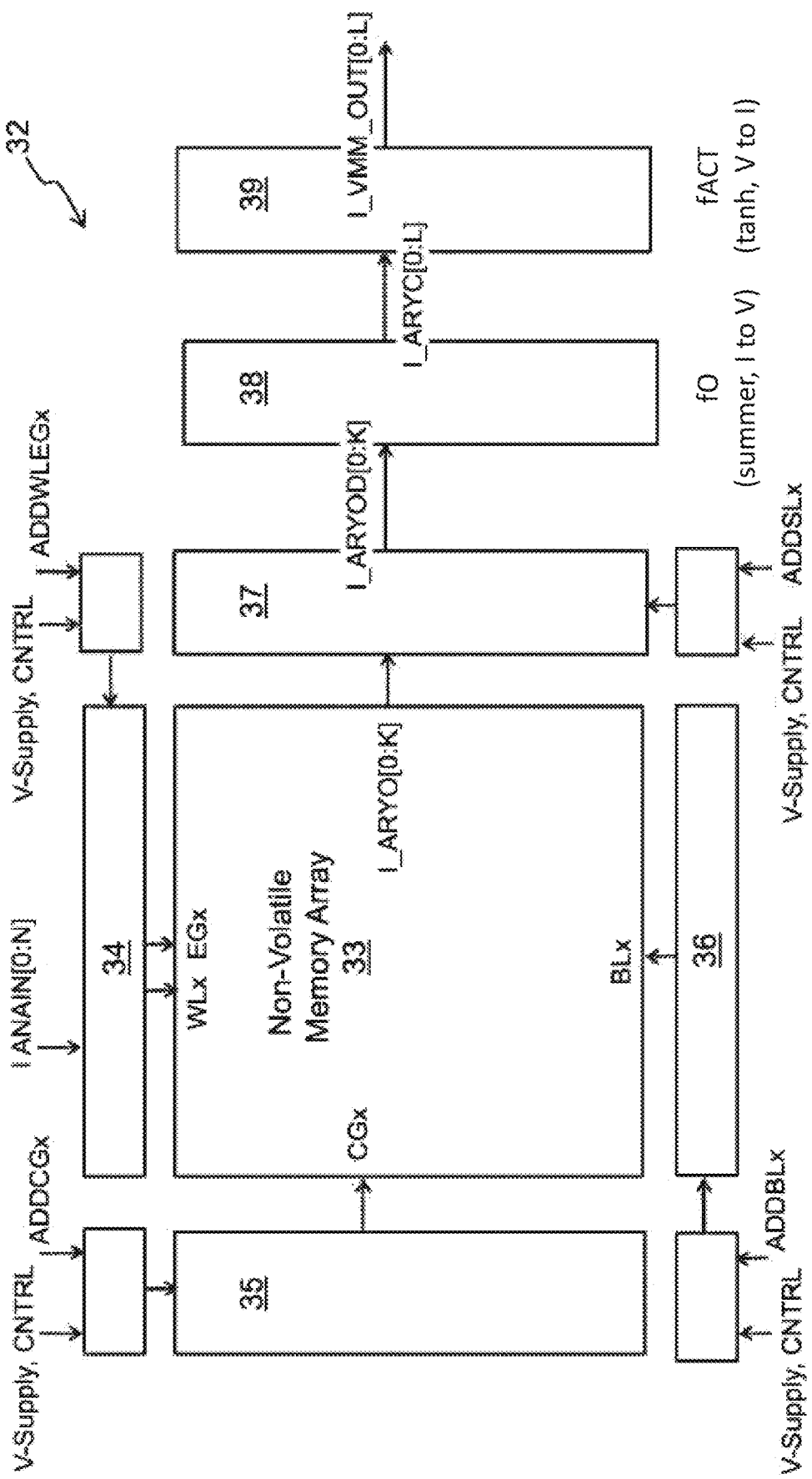
FIG. 9 is a block diagram illustrating a vector-by-matrix multiplication system.

FIG. 9 is a block diagram of an array that can be used for that purpose. Vector-by-matrix multiplication (VMM) system 32 includes non-volatile memory cells and is utilized as the synapses (such as CB1, CB2, CB3, and CB4 in FIG. 6) between one layer and the next layer. Specifically, VMM system 32 includes VMM array 33 comprising non-volatile memory cells arranged in rows and columns, erase gate and word line gate decoder 34, control gate decoder 35, bit line decoder 36 and source line decoder 37, which decode the respective inputs for the non-volatile memory cell array 33. Input to VMM array 33 can be from the erase gate and wordline gate decoder 34 or from the control gate decoder 35. Source line decoder 37 in this example also decodes the output of VMM array 33. Alternatively, bit line decoder 36 can decode the output of VMM array 33.

VMM array 33 serves two purposes. First, it stores the weights that will be used by the VMM system 32. Second, VMM array 33 effectively multiplies the inputs by the weights stored in VMM array 33 and adds them up per output line (source line or bit line) to produce the output, which will be the input to the next layer or input to the final layer. By performing the multiplication and addition function, VMM array 33 negates the need for separate multiplication and addition logic circuits and is also power efficient due to its in-situ memory computation.

The output of VMM array 33 is supplied to a differential summer (such as a summing op-amp or a summing current mirror) 38, which sums up the outputs of VMM array 33 to create a single value for that convolution. The differential summer 38 is arranged to perform summation of positive weight and negative weight.

The summed up output values of differential summer 38 are then supplied to an activation function circuit 39, which rectifies the output. The activation function circuit 39 may provide sigmoid, tan h, ReLU functions, or any other non-linear function. The rectified output values of activation function circuit 39 become an element of a feature map of the next layer (e.g. C1 in FIG. 8), and are then applied to the next synapse to produce the next feature map layer or final layer. Therefore, in this example, VMM array 33 constitutes a plurality of synapses (which receive their inputs from the prior layer of neurons or from an input layer such as an image database), and summer 38 and activation function circuit 39 constitute a plurality of neurons.

The input to VMM system 32 in FIG. 9 (WLx, EGx, CGx, and optionally BLx and SLx) can be analog level, binary level, digital pulses (in which case a pulses-to-analog converter PAC may be needed to convert pulses to the appropriate input analog level) or digital bits (in which case a DAC is provided to convert digital bits to appropriate input analog level) and the output can be analog level, binary level, digital pulses, or digital bits (in which case an output ADC is provided to convert output analog level into digital bits).

Figure 10:
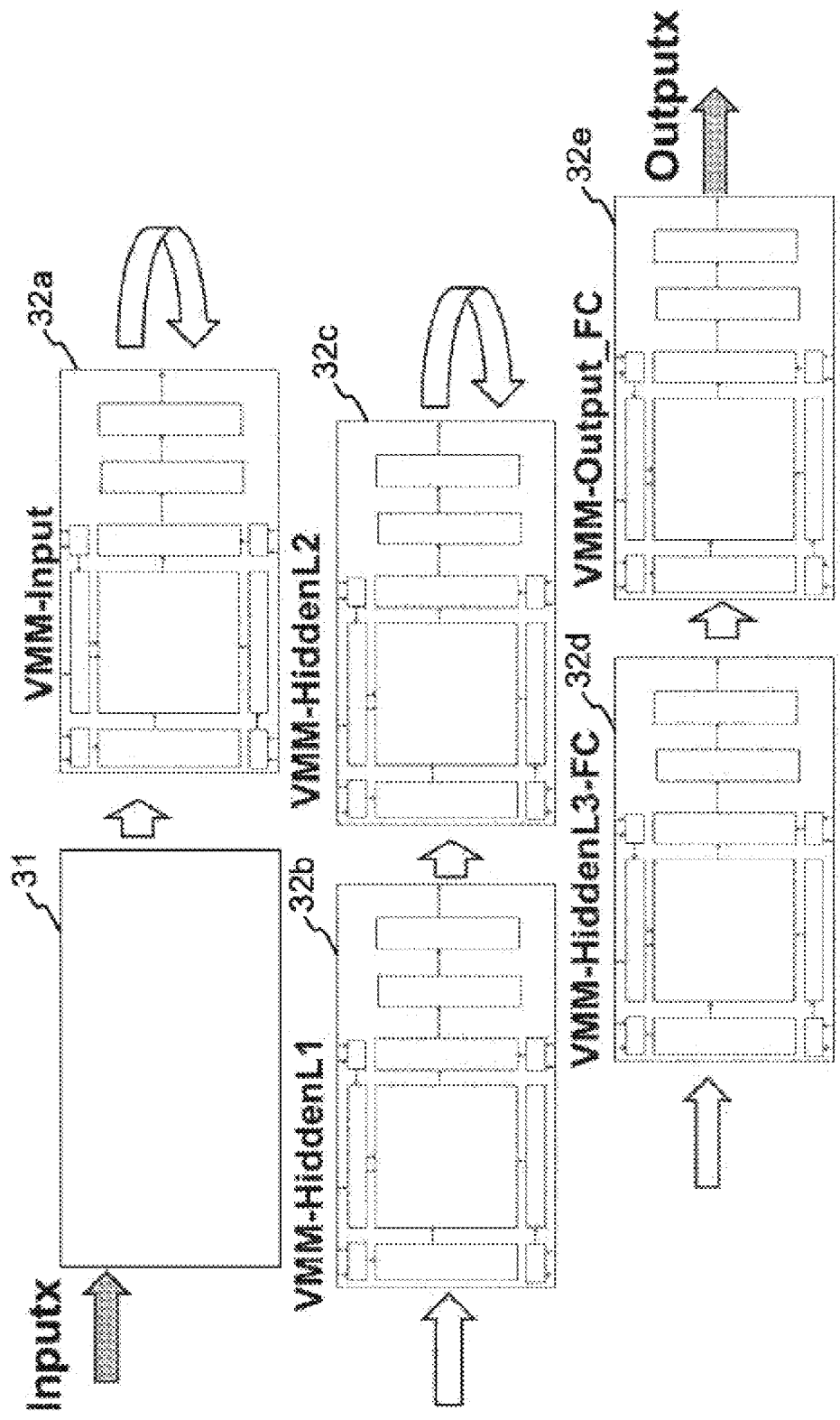
FIG. 10 is a block diagram illustrates an exemplary artificial neural network utilizing one or more a vector-by-matrix multiplication systems.

FIG. 10 is a block diagram depicting the usage of numerous layers of VMM systems 32, here labeled as VMM systems 32a, 32b, 32c, 32d, and 32e. As shown in FIG. 10, the input, denoted Inputx, is converted from digital to analog by a digital-to-analog converter 31, and provided to input VMM system 32a. The converted analog inputs could be voltage or current. The input D/A conversion for the first layer could be done by using a function or a LUT (look up table) that maps the inputs Inputx to appropriate analog levels for the matrix multiplier of input VMM system 32a. The input conversion could also be done by an analog to analog (A/A) converter to convert an external analog input to a mapped analog input to the input VMM system 32a. The input conversion could also be done by a digital-to-digital pules (D/P) converter to convert an external digital input to a mapped digital pulse or pulses to the input VMM system 32a.

The output generated by input VMM system 32a is provided as an input to the next VMM system (hidden level 1) 32b, which in turn generates an output that is provided as an input to the next VMM system (hidden level 2) 32c, and so on. The various layers of VMM system 32 function as different layers of synapses and neurons of a convolutional neural network (CNN). Each VMM system 32a, 32b, 32c, 32d, and 32e can be a stand-alone, physical non-volatile memory array, or multiple VMM systems could utilize different portions of the same physical non-volatile memory array, or multiple VMM systems could utilize overlapping portions of the same physical non-volatile memory system. Each VMM system 32a, 32b, 32c, 32d, and 32e can also be time multiplexed for various portion of its array or neurons. The example shown in FIG. 10 contains five layers (32a, 32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers. Furthermore, the different layers can use different combinations of n-bit memory cells (different cells supporting multiple different levels) including 2-level memory cells (meaning only 2 levels, '0' and '1').

VMM Arrays

Figure 11:
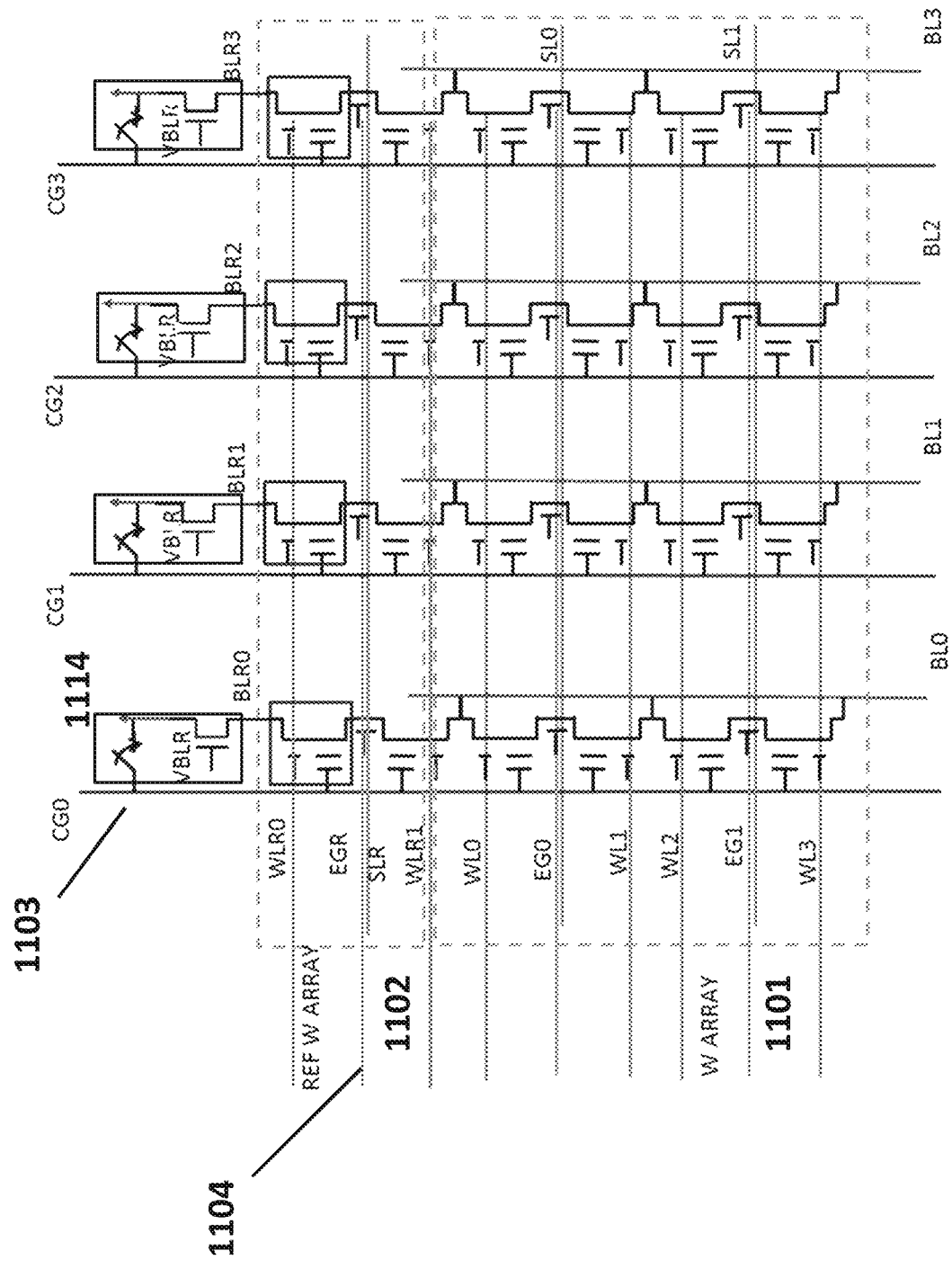
FIG. 11 depicts another embodiment of a vector-by-matrix multiplication system.

FIG. 11 depicts neuron VMM array 1100, which is particularly suited for memory cells 310 as shown in FIG. 3, and is utilized as the synapses and parts of neurons between an input layer and the next layer. VMM array 1100 comprises memory array 1101 of non-volatile memory cells and reference array 1102 (at the top of the array) of non-volatile reference memory cells. Alternatively, another reference array can be placed at the bottom.

In VMM array 1100, control gate lines, such as control gate line 1103, run in a vertical direction (hence reference array 1102 in the row direction is orthogonal to control gate line 1103), and erase gate lines, such as erase gate line 1104, run in a horizontal direction. Here, the inputs to VMM array 1100 are provided on the control gate lines (CG0, CG1, CG2, CG3), and the output of VMM array 1100 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 1100, i.e. the flash memory of VMM array 1100, are preferably configured to operate in a sub-threshold region.

The non-volatile reference memory cells and the non-volatile memory cells described herein are biased in weak inversion:

$$Ids = Io * e^{(Vg-Vth)/nVt} = w * Io * e^{(Vg)/nVt},$$

where $w = e^{(-Vth)/nVt}$ where Vg is gate voltage on the memory cell; Vth is threshold voltage of the memory cell; Vt is thermal voltage=k*T/q with k being the Boltzmann constant, T temperature in Kelvin, and q electronic charge; n is a slope factor=1+(Cdep/Cox) where Cdep=capacitance of depletion layer, and Cox is capacitance of the gate oxide layer; and Io is the memory cell current at gate voltage equal to threshold voltage. Io is proportional to $(Wt/L)*u*Cox*(n-1)*Vt^2$ where u is carrier mobility and Wt and L are the width and length of memory cell, respectively.

For an I-to-V log converter using a memory cell (such as a reference memory cell or a peripheral memory cell) or a transistor to convert input current into an input voltage:

$$Vg = n*Vt*\log [Ids/wp*Io]$$

Here, wp is w of a reference or peripheral memory cell.

For a memory array used as a vector matrix multiplier VMM array, the output current is:

$$Iout = wa * Io * e^{(Vg)/nVt}, \text{ namely}$$

$$Iout = (wa/wp) * Iin = W * Iin$$

$$W = e^{(Vthp-Vtha)/nVt}$$

Here, wa=w of each memory cell in the memory array.

A wordline or control gate can be used as the input for the memory cell for the input voltage.

Alternatively, the flash memory cells of VMM arrays described herein can be configured to operate in the linear region:

$$Ids = beta*(Vgs-Vth)*Vds; beta = u*Cox*Wt/L,$$

where Wt and L are the width and length respectively of the transistor $$W = \alpha(Vgs-Vth),$$

meaning weight W is proportional to (Vgs−Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region or a resistor can be used to linearly convert an input/output current into an input/output voltage.

Alternatively, the flash memory cells of VMM arrays described herein can be configured to operate in the saturation region:

$$Ids = \frac{1}{2}*beta*(Vgs-Vth)^2; beta=u*Cox*Wt/L$$

$$W=\alpha(Vgs-Vth)^2, \text{ meaning weight } W \text{ is proportional to } (Vgs-Vth)^2$$

A wordline, control gate, or erase gate can be used as the input for the memory cell operated in the saturation region. The bitline or sourceline can be used as the output for the output neuron.

Alternatively, the flash memory cells of VMM arrays described herein can be used in all regions or a combination thereof (sub threshold, linear, or saturation).

Other embodiments for VMM array 32 of FIG. 9 are described in U.S. patent application Ser. No. 15/826,345, which is incorporated by reference herein. As described in that application, a sourceline or a bitline can be used as the neuron output (current summation output).

Figure 12:
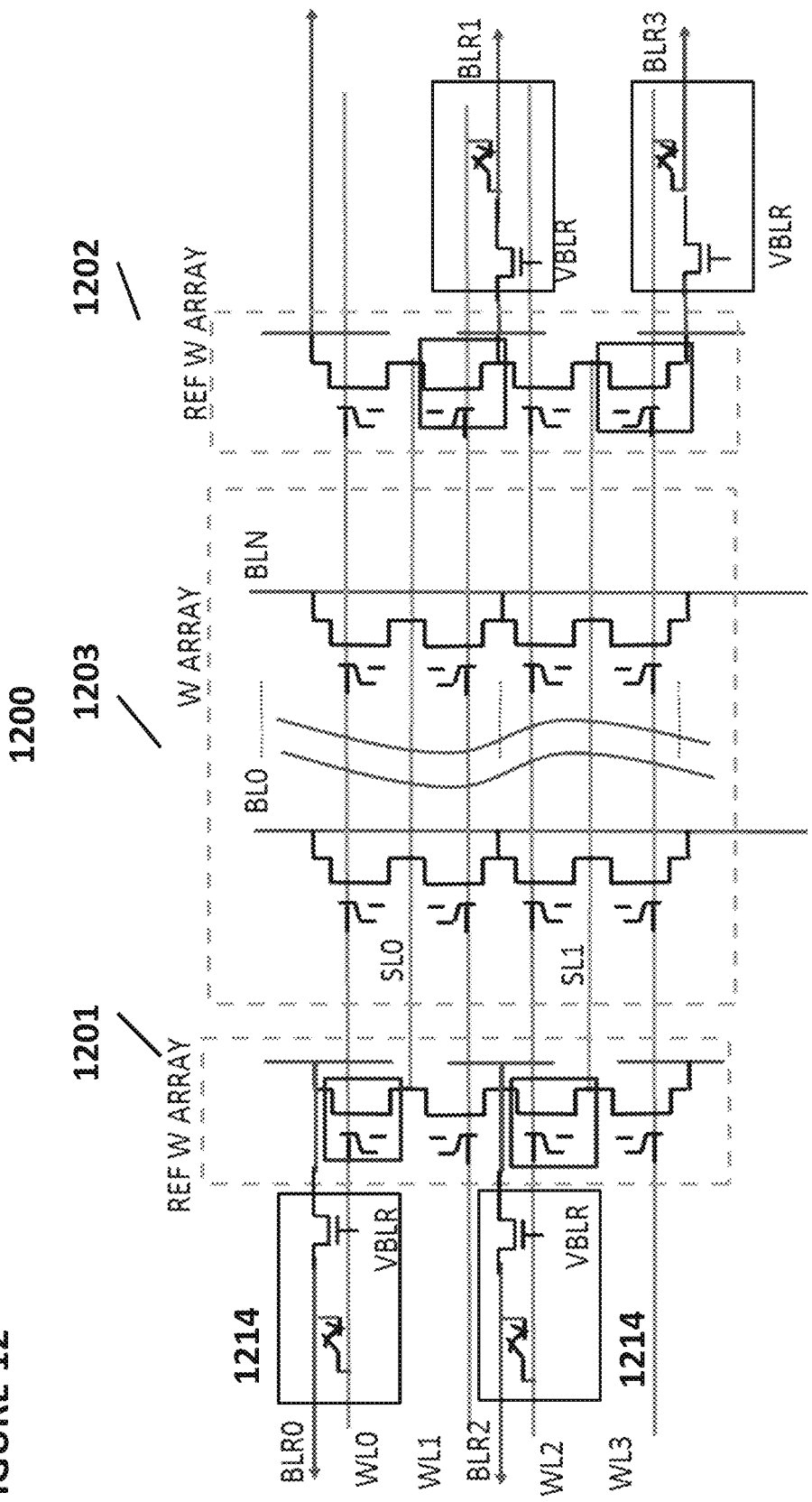
FIG. 12 depicts another embodiment of a vector-by-matrix multiplication system.

FIG. 12 depicts neuron VMM array 1200, which is particularly suited for memory cells 210 as shown in FIG. 2, and is utilized as the synapses between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1214 (only partially depicted) with current inputs flowing into them. The reference cells are tuned (e.g., programmed) to target reference levels. The target reference levels are provided by a reference mini-array matrix (not shown).

Memory array 1203 serves two purposes. First, it stores the weights that will be used by the VMM array 1200 on respective memory cells thereof. Second, memory array 1203 effectively multiplies the inputs (i.e. current inputs provided in terminals BLR0, BLR1, BLR2, and BLR3, which reference arrays 1201 and 1202 convert into the input voltages to supply to wordlines WL0, WL1, WL2, and WL3) by the weights stored in the memory array 1203 and then adds all the results (memory cell currents) to produce the output on the respective bit lines (BL0-BLN), which will be the input to the next layer or input to the final layer. By performing the multiplication and addition function, memory array 1203 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages for VMM array 1200. The columns in the table indicate the voltages placed on word lines for selected cells, word lines for unselected cells, bit lines for selected cells, bit lines for unselected cells, source lines for selected cells, and source lines for unselected cells, where FLT indicates floating, i.e. no voltage is imposed. The rows indicate the operations of read, erase, and program.

TABLE NO. 5

Operation of VMM Array 1200 of FIG. 12:

| | WL | WL -unsel | BL | BL -unsel | SL | SL -unsel |
|---|---|---|---|---|---|---|
| Read | 0.5-3.5 V | −0.5 V/0 V | 0.1-2 V (Ineuron) | 0.6 V-2 V/FLT | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

Figure 13:
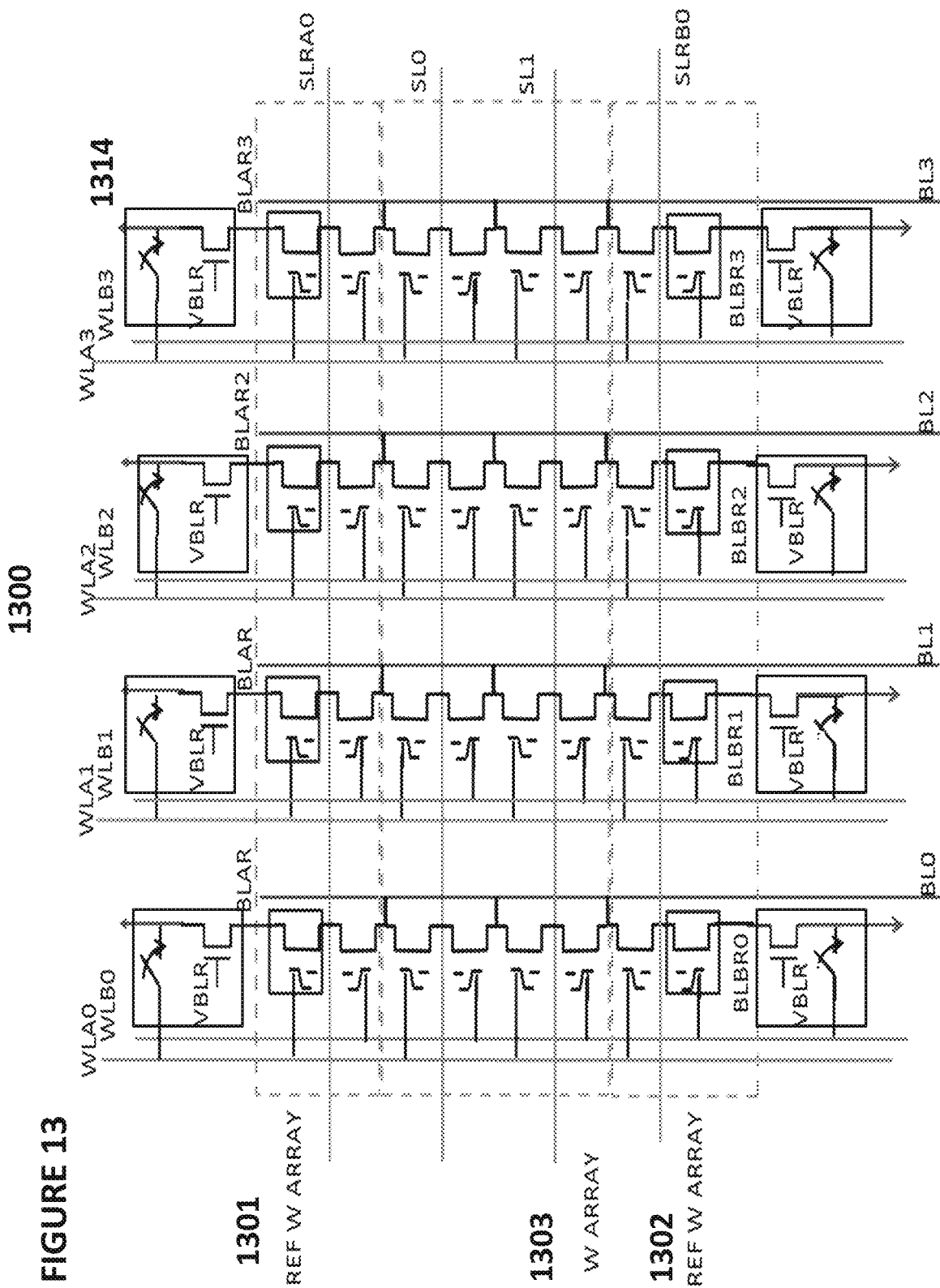
FIG. 13 depicts another embodiment of a vector-by-matrix multiplication system.

FIG. 13 depicts neuron VMM array 1300, which is particularly suited for memory cells 210 as shown in FIG. 2, and is utilized as the synapses and parts of neurons between an input layer and the next layer. VMM array 1300 comprises a memory array 1303 of non-volatile memory cells, reference array 1301 of first non-volatile reference memory cells, and reference array 1302 of second non-volatile reference memory cells. Reference arrays 1301 and 1302 run in row direction of the VMM array 1300. VMM array is similar to VMM 1100 except that in VMM array 1300, the word lines run in the vertical direction. Here, the inputs are provided on the word lines (WLA0, WLB0, WLA1, WLB1, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages for VMM array 1300. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 6

Operation of VMM Array 1300 of FIG. 13

| | WL | WL -unsel | BL | BL -unsel | SL | SL -unsel |
|---|---|---|---|---|---|---|
| Read | 0.5-3.5 V | −0.5 V/0 V | 0.1-2 V | 0.1 V-2 V/FLT | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

Figures 14, 15:
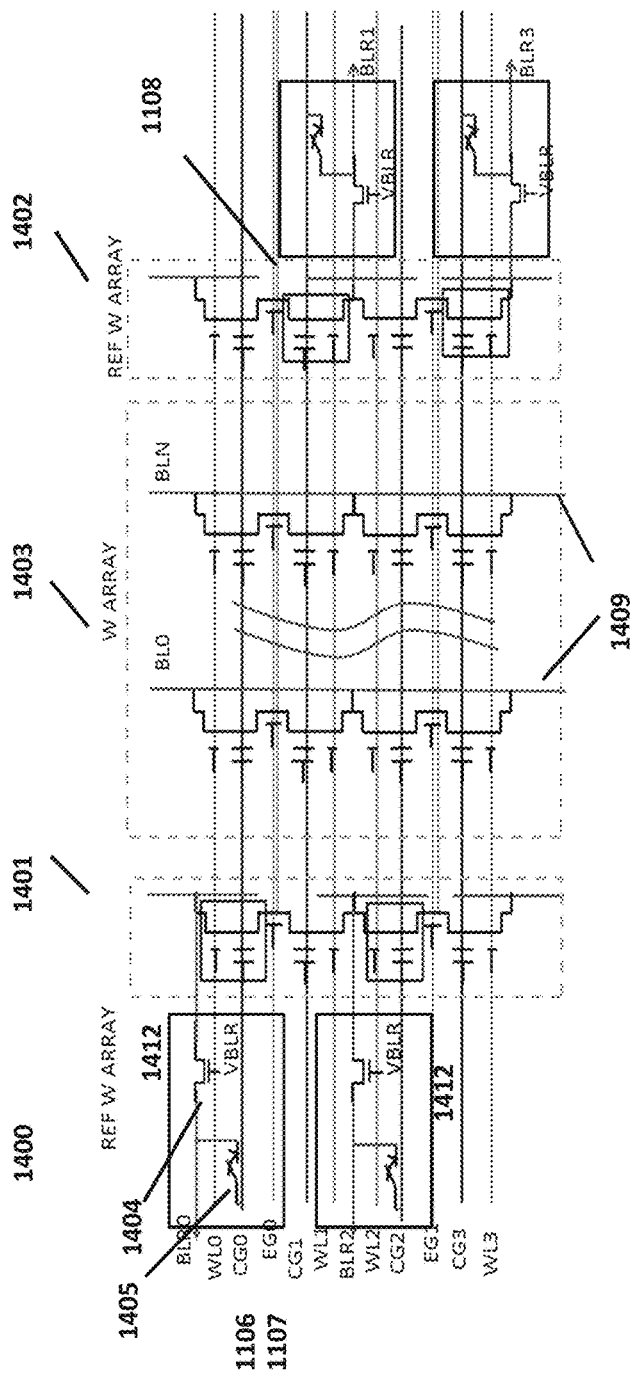
FIG. 14 depicts another embodiment of a vector-by-matrix multiplication system.
FIG. 15 depicts another embodiment of a vector-by-matrix multiplication system.

FIG. 14 depicts neuron VMM array 1400, which is particularly suited for memory cells 310 as shown in FIG. 3, and is utilized as the synapses and parts of neurons between an input layer and the next layer. VMM array 1400 comprises a memory array 1403 of non-volatile memory cells, reference array 1401 of first non-volatile reference memory cells, and reference array 1402 of second non-volatile reference memory cells. Reference arrays 1401 and 1402 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1412 (only partially shown) with current inputs flowing into them through BLR0, BLR1, BLR2, and BLR3. Multiplexors 1412 each include a respective multiplexor 1405 and a cascoding transistor 1404 to ensure a constant voltage on the bitline (such as BLR0) of each of the first and second non-volatile reference memory cells during a read operation. The reference cells are tuned to target reference levels.

Memory array 1403 serves two purposes. First, it stores the weights that will be used by the VMM array 1400. Second, memory array 1403 effectively multiplies the inputs (current inputs provided to terminals BLR0, BLR1, BLR2, and BLR3, for which reference arrays 1401 and 1402 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1400 implements uni-directional tuning for non-volatile memory cells in memory array 1403. That is, each non-volatile memory cell is erased and then partially programmed until the desired charge on the floating gate is reached. This can be performed, for example, using the precision programming techniques described below. If too much charge is placed on the floating gate (such that the wrong value is stored in the cell), the cell must be erased and the sequence of partial programming operations must start over. As shown, two rows sharing the same erase gate (such as EG0 or EG1) need to be erased together (which is known as a page erase), and thereafter, each cell is partially programmed until the desired charge on the floating gate is reached.

Table No. 7 depicts operating voltages for VMM array 1400. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 24:
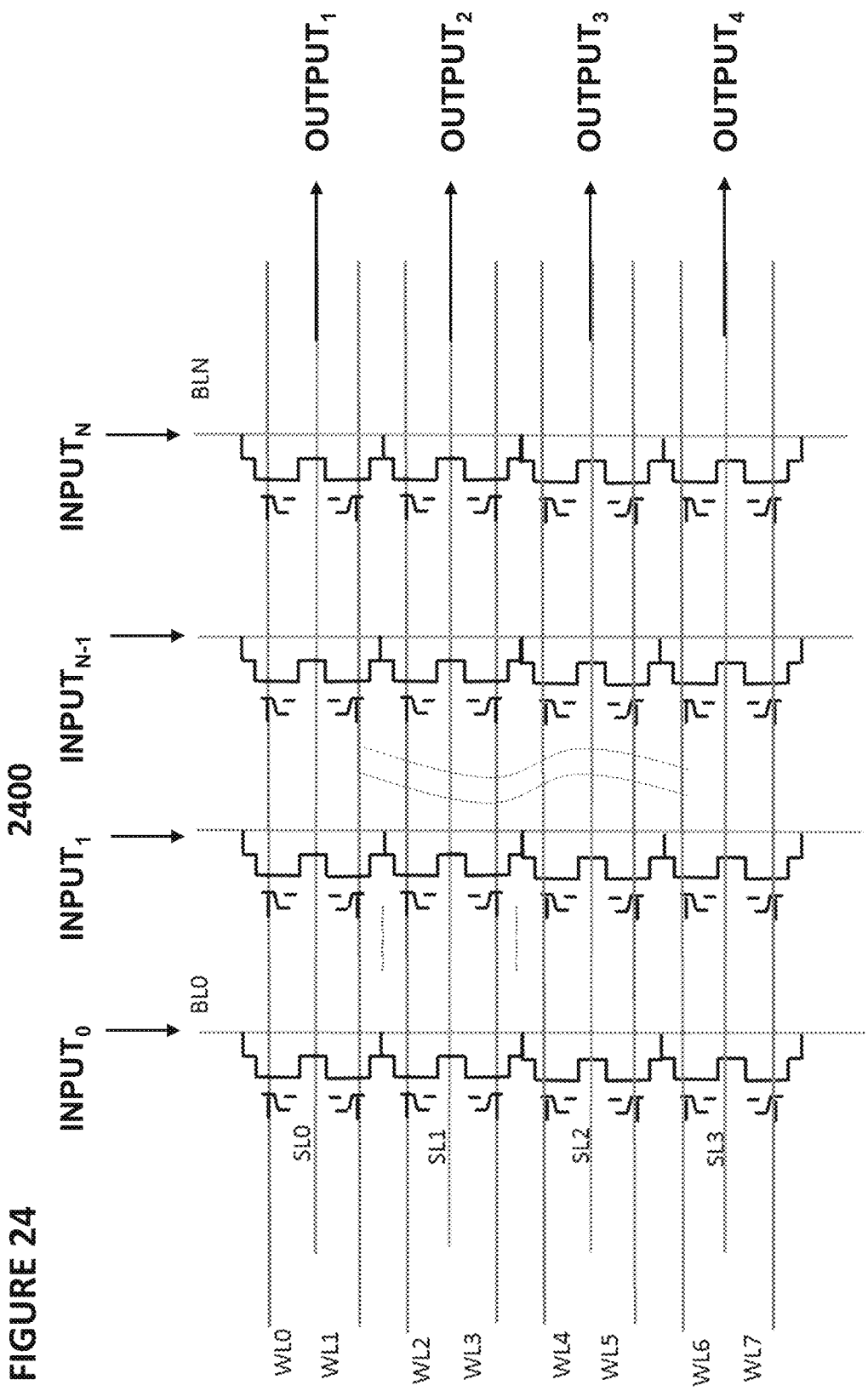
FIG. 24 depicts another embodiment of a vector-by-matrix multiplication system.

FIG. 24 depicts neuron VMM array 2400, which is particularly suited for memory cells 210 as shown in FIG. 2, and is utilized as the synapses and parts of neurons between an input layer and the next layer. In VMM array 2400, the inputs $INPUT_0, \ldots, INPUT_N$ are received on bit lines $BL_0, \ldots BL_N$, respectively, and the outputs $OUTPUT_1$, $OUTPUT_2$, $OUTPUT_3$, and $OUTPUT_4$ are generated on source lines $SL_0$, $SL_1$, $SL_2$, and $SL_3$, respectively.

Figure 25:
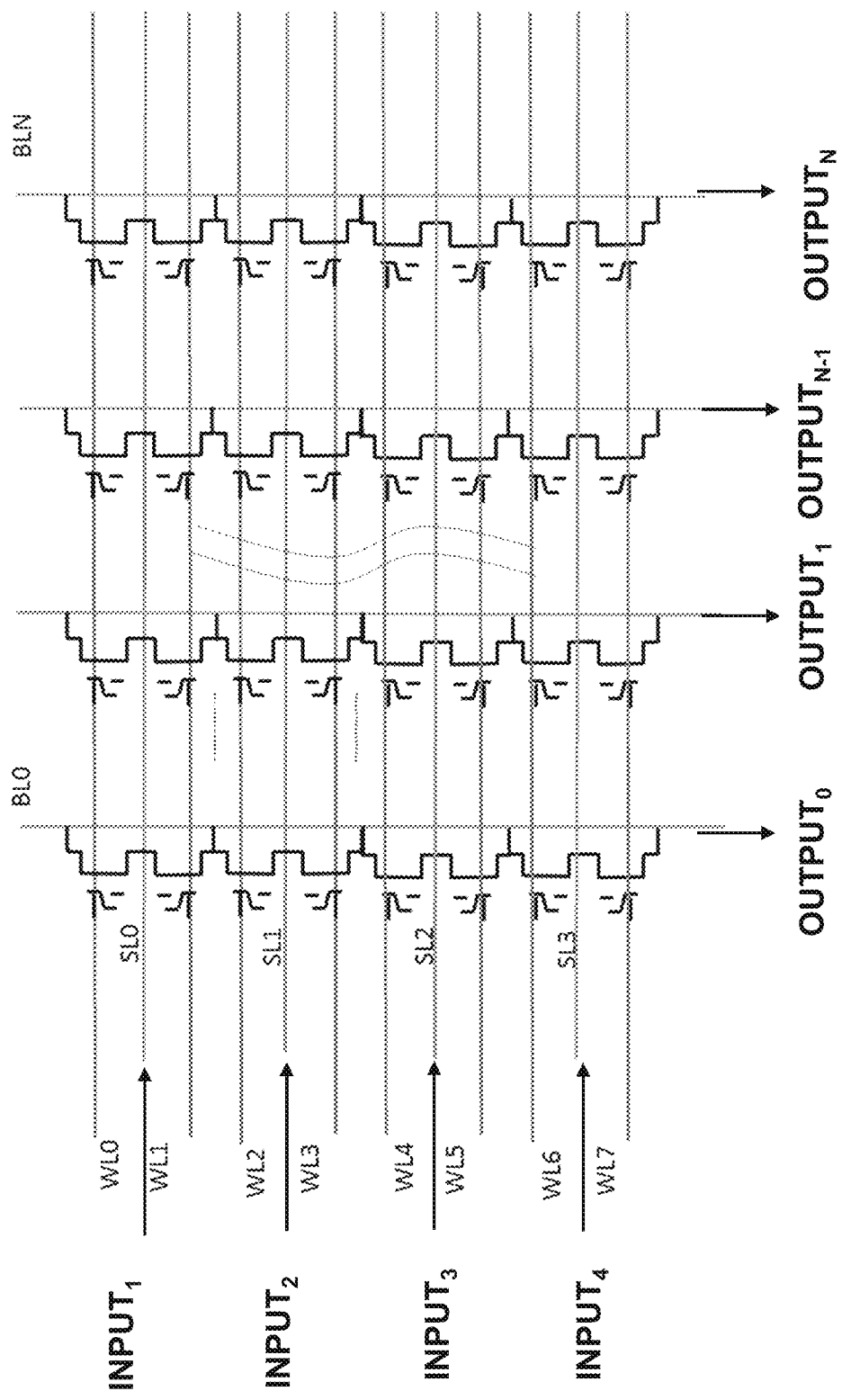
FIG. 25 depicts another embodiment of a vector-by-matrix multiplication system.

FIG. 25 depicts neuron VMM array 2500, which is particularly suited for memory cells 210 as shown in FIG. 2, and is utilized as the synapses and parts of neurons between an input layer and the next layer. In this example, the inputs $INPUT_0$, $INPUT_1$, $INPUT_2$, and INPUTS are received on source lines $SL_0$, $SL_1$, $SL_2$, and $SL_3$, respectively, and the outputs $OUTPUT_0, \ldots OUTPUT_N$ are generated on bit lines $BL_0, \ldots, BL_N$.

Figure 26:
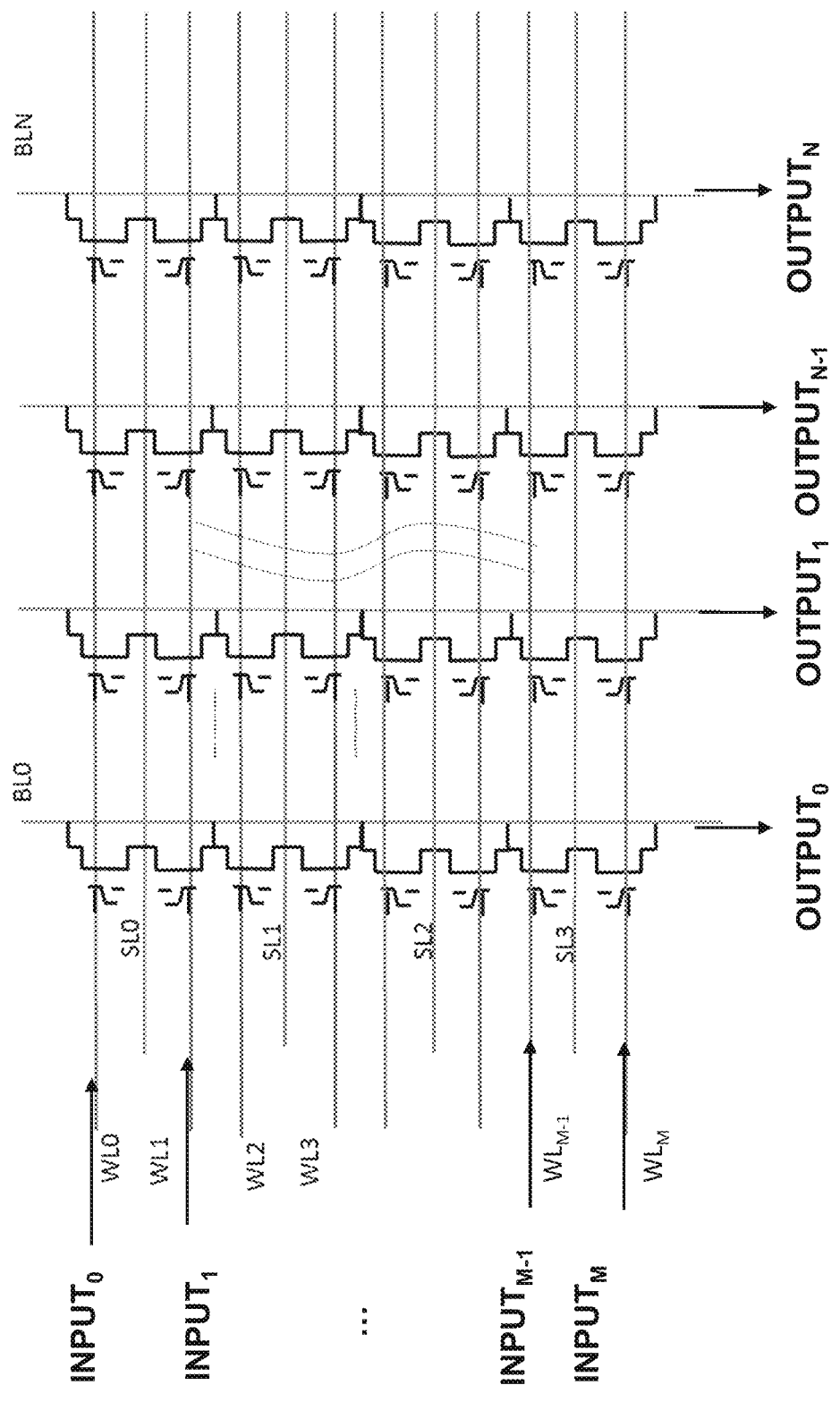
FIG. 26 depicts another embodiment of a vector-by-matrix multiplication system.

FIG. 26 depicts neuron VMM array 2600, which is particularly suited for memory cells 210 as shown in FIG. 2, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0, \ldots, BL_N$.

Figure 27:
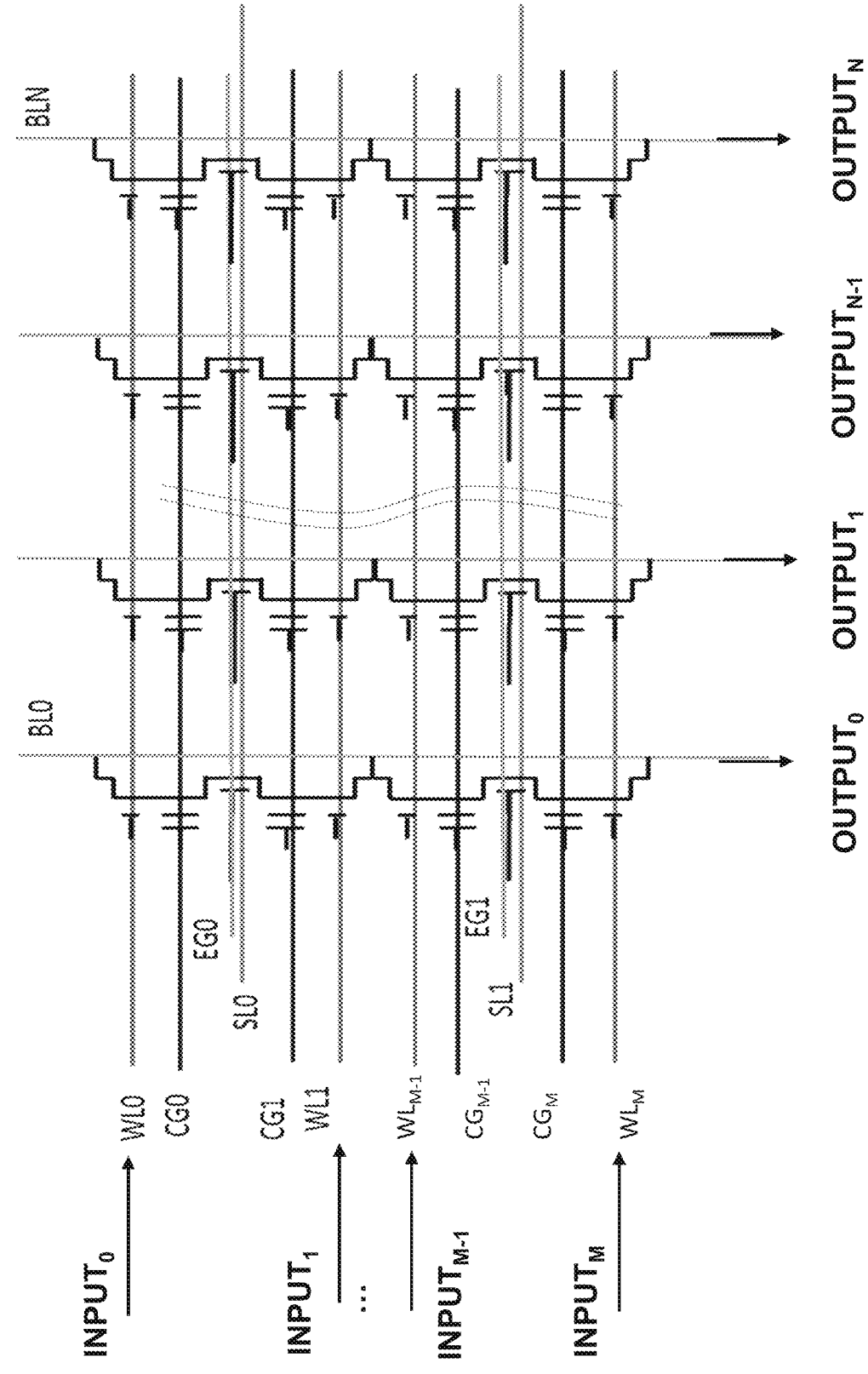
FIG. 27 depicts another embodiment of a vector-by-matrix multiplication system.

FIG. 27 depicts neuron VMM array 2700, which is particularly suited for memory cells 310 as shown in FIG. 3, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0, \ldots, BL_N$.

Figure 28:
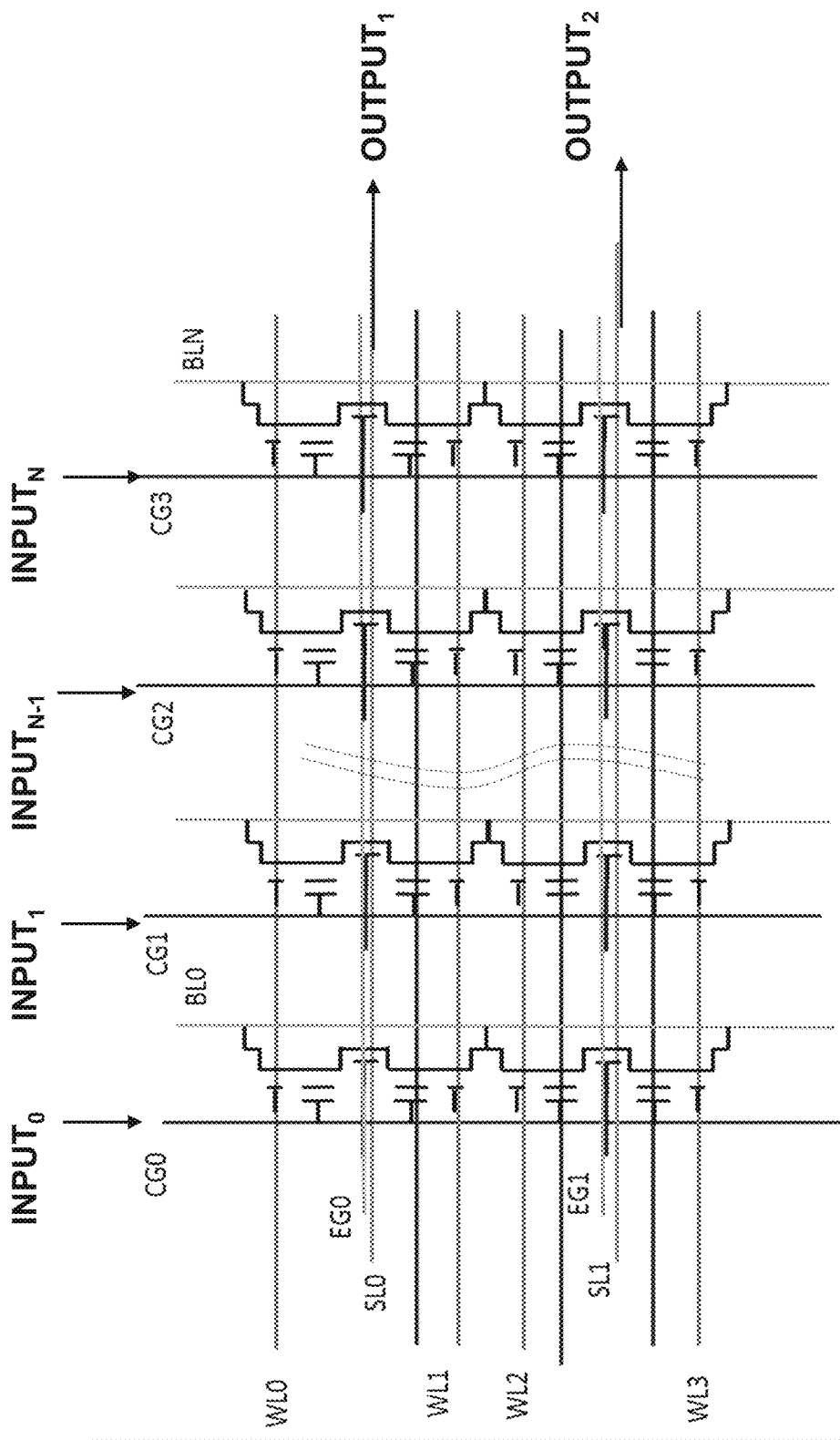
FIG. 28 depicts another embodiment of a vector-by-matrix multiplication system.

FIG. 28 depicts neuron VMM array 2800, which is particularly suited for memory cells 410 as shown in FIG. 4, and is utilized as the synapses and parts of neurons between an input layer and the next layer. In this example, the inputs

TABLE NO. 7

Operation of VMM Array 1400 of FIG. 14

| | WL | WL - unsel | BL | BL - unsel | CG | CG - unsel same sector | CG - unsel | EG | EG - unsel | SL | SL - unsel |
|---|---|---|---|---|---|---|---|---|---|---|---|
| Read | 0.5-2 V | −0.5 V/0 V | 0.1-2 V (Ineuron) | 0 V/FLT | 0-2.6 V | 0-2.6 V | 0-2.6 V | 0-2.6 V | 0-2.6 V | 0 V | 0 V |
| Erase | 0 V | 0 V | 0 V | 0 V Vinh | 0 V | 0-2.6 V | 0-2.6 V | 5-12 V | 0-2.6 V | 0 V | 0 V |
| Program | 0.7-1 V | −0.5 V/0 V | 0.1-1 uA | (1-2 V) | 4-11 V | 0-2.6 V | 0-2.6 V | 4.5-5 V | 0-2.6 V | 4.5-5 V | 0-1 V |

FIG. 15 depicts neuron VMM array 1500, which is particularly suited for memory cells 310 as shown in FIG. 3, and is utilized as the synapses and parts of neurons between an input layer and the next layer. VMM array 1500 comprises a memory array 1503 of non-volatile memory cells, reference array 1501 or first non-volatile reference memory cells, and reference array 1502 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1500 is similar to VMM array 1400, except that VMM array 1500 implements bi-directional tuning, where each individual cell can be completely erased, partially programmed, and partially erased as needed to reach the desired amount of charge on the floating gate due to the use of separate EG lines. As shown, reference arrays 1501 and 1502 convert input current in the terminal BLR0, BLR1, BLR2, and BLR3 into control gate voltages CG0, CG1, CG2, and CG3 (through the action of diode-connected reference cells through multiplexors 1514) to be applied to the memory cells in the row direction. The current output (neuron) is in the bitlines BL0-BLN, where each bit line sums all currents from the non-volatile memory cells connected to that particular bitline.

Table No. 8 depicts operating voltages for VMM array 1500. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 8

Operation of VMM Array 1500 of FIG. 15

| | WL | WL - unsel | BL | BL - unsel | CG | CG - unsel same sector | CG - unsel | EG | EG - unsel | SL | SL - unsel |
|---|---|---|---|---|---|---|---|---|---|---|---|
| Read | 1.0-2 V | −0.5 V/0 V | 0.6-2 V (Ineuron) | 0 V/FLT | 0-2.6 V | 0-2.6 V | 0-2.6 V | 0-2.6 V | 0-2.6 V | 0 V | 0 V/FLT |
| Erase | 0 V | 0 V | 0 V | 0 V Vinh | 0 V | 4-9 V | 0-2.6 V | 5-12 V | 0-2.6 V | 0 V | 0 V |
| Program | 0.7-1 V | −0.5 V/0 V | 0.1-1 uA | (1-2 V) | 4-11 V | 0-2.6 V | 0-2.6 V | 4.5-5 V | 0-2.6 V | 4.5-5 V | 0-1 V |

INPUT$_0$, ..., INPUT$_n$ are received on vertical control gate lines CG$_0$, ..., CG$_N$, respectively, and the outputs OUTPUT) and OUTPUT$_2$ are generated on source lines SL$_0$ and SL$_1$.

Figure 29:
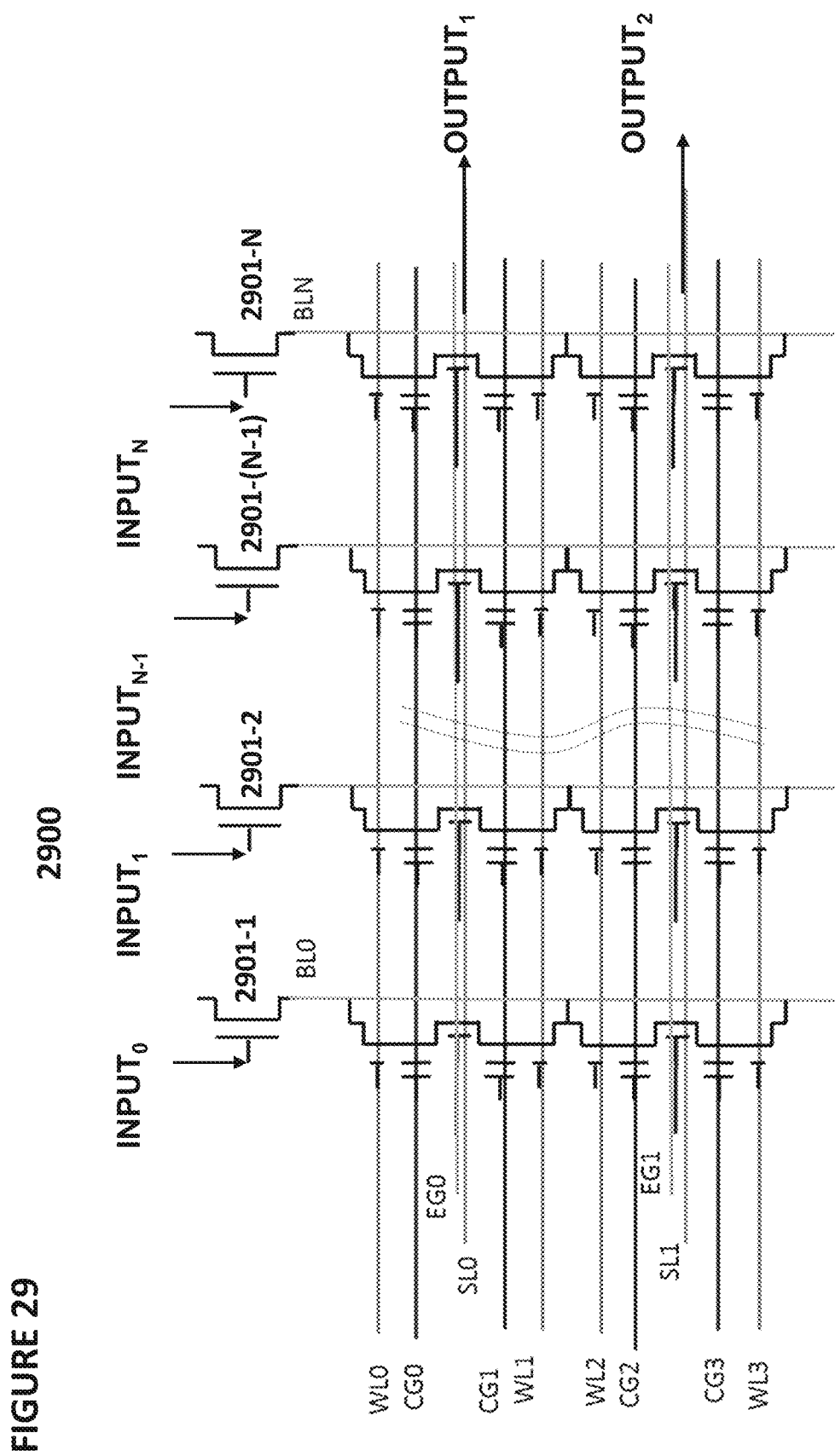
FIG. 29 depicts another embodiment of a vector-by-matrix multiplication system.

FIG. 29 depicts neuron VMM array 2900, which is particularly suited for memory cells 410 as shown in FIG. 4, and is utilized as the synapses and parts of neurons between an input layer and the next layer. In this example, the inputs INPUT$_0$, ..., INPUT$_N$ are received on the gates of bit line control gates 2901-1, 2901-2, ..., 2901-(N−1), and 2901-N, respectively, which are coupled to bit lines BL$_0$, ..., BL$_N$, respectively. Exemplary outputs OUTPUT) and OUTPUT$_2$ are generated on source lines SL$_0$ and SL$_1$.

Figure 30:
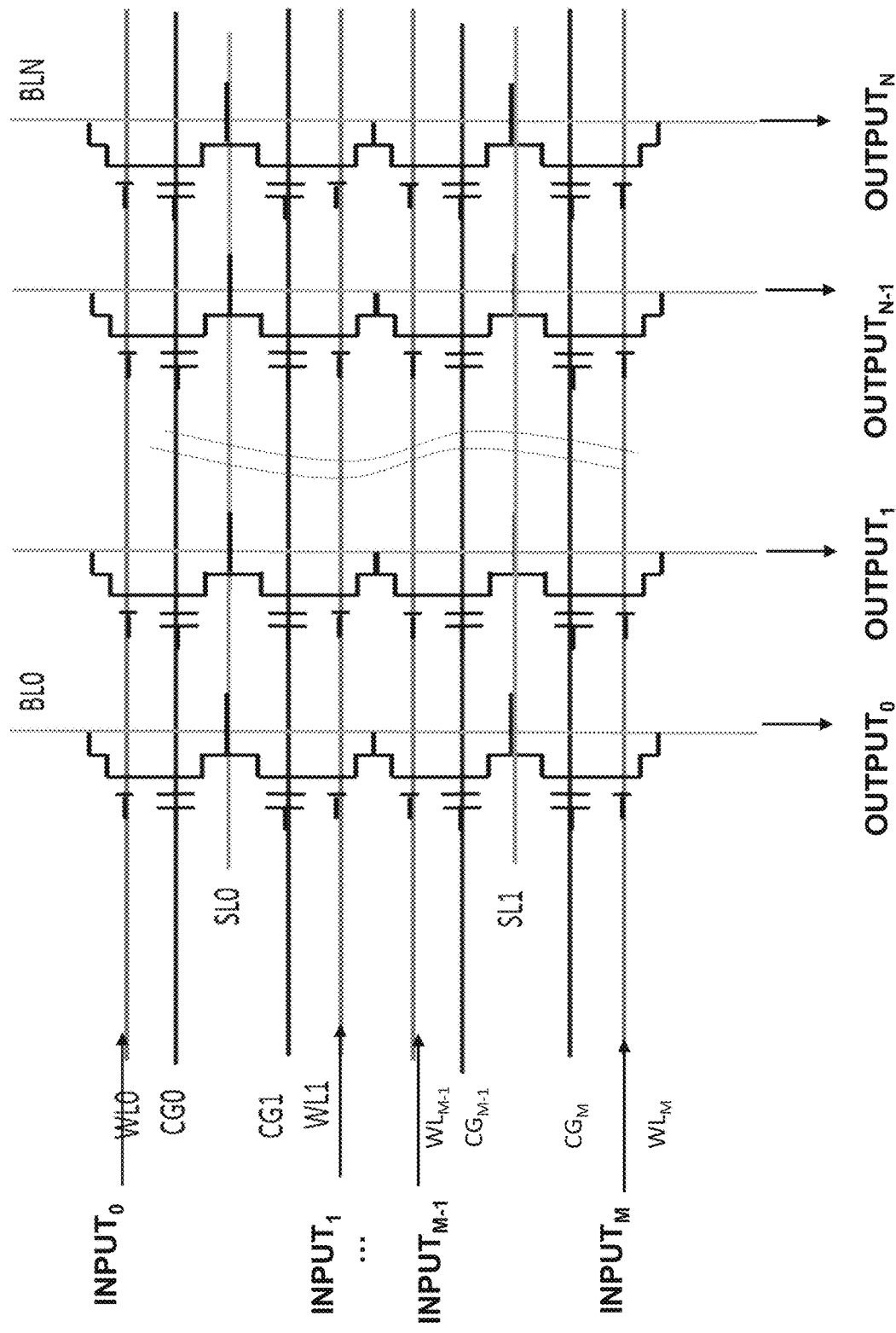
FIG. 30 depicts another embodiment of a vector-by-matrix multiplication system.

FIG. 30 depicts neuron VMM array 3000, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs INPUT$_0$, ..., INPUT$_M$ are received on word lines WL$_0$, ..., WL$_M$, and the outputs OUTPUT$_0$, ..., OUTPUT$_N$ are generated on bit lines BL$_0$, ..., BL$_N$, respectively.

Figure 31:
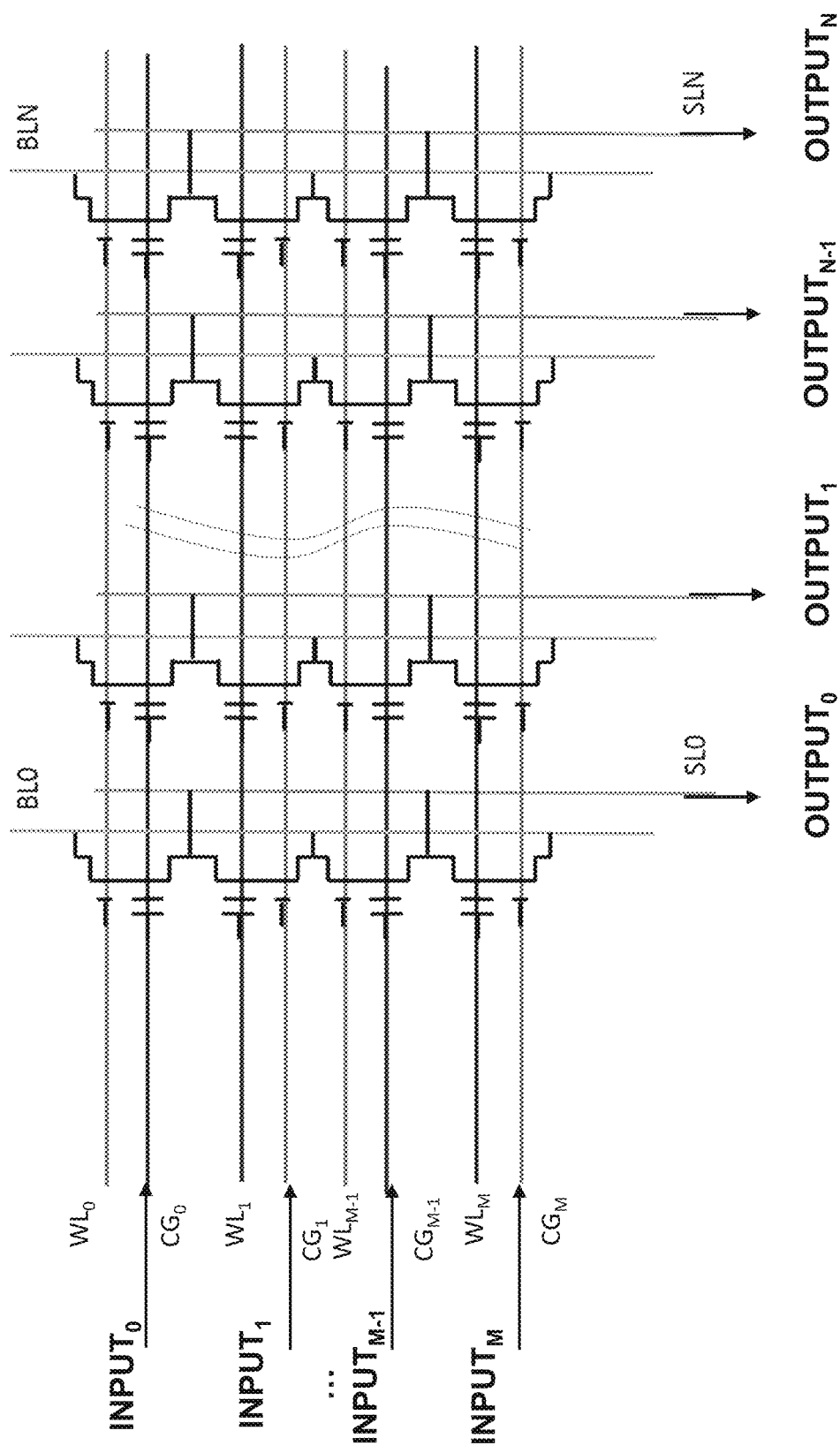
FIG. 31 depicts another embodiment of a vector-by-matrix multiplication system.

FIG. 31 depicts neuron VMM array 3100, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs INPUT$_0$, ..., INPUT$_M$ are received on control gate lines CG$_0$, ..., CG$_M$. Outputs OUTPUT$_0$, ..., OUTPUT$_N$ are generated on vertical source lines SL$_0$, ..., SL$_N$, respectively, where each source line SL$_i$ is coupled to the source line terminals of all memory cells in column i.

Figure 32:
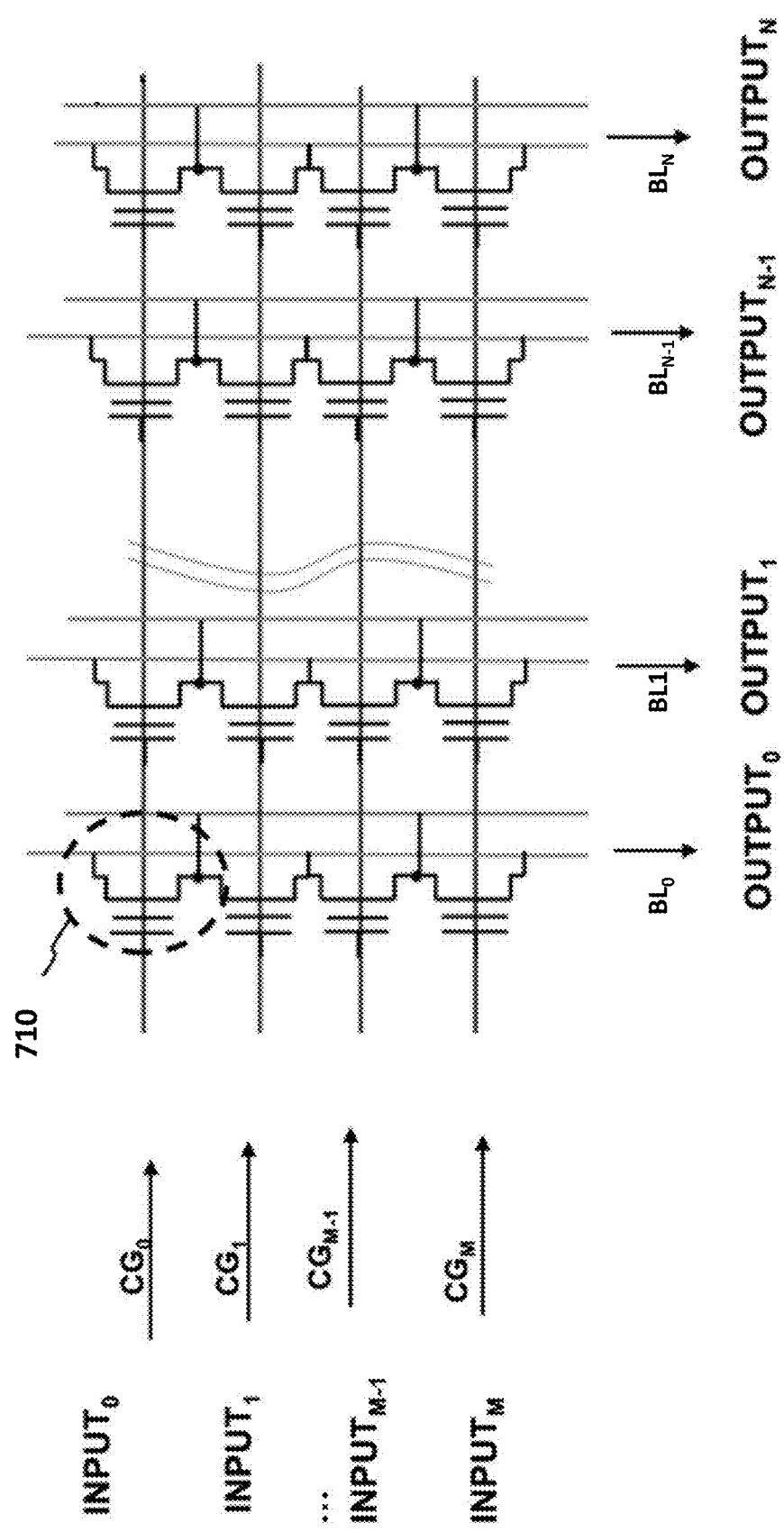
FIG. 32 depicts another embodiment of a vector-by-matrix multiplication system.

FIG. 32 depicts neuron VMM array 3200, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs INPUT$_0$, ..., INPUT$_M$ are received on control gate lines CG$_0$, ..., CG$_M$. Outputs OUTPUT$_0$, ..., OUTPUT$_N$ are generated on vertical bit lines BL$_0$, ..., BL$_N$, respectively, where each bit line BL$_i$ is coupled to the bit line terminals of all memory cells in column i.

Long Short-Term Memory

The prior art includes a concept known as long short-term memory (LSTM). LSTM units often are used in neural networks. LSTM allows a neural network to remember information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM units.

Figure 16:
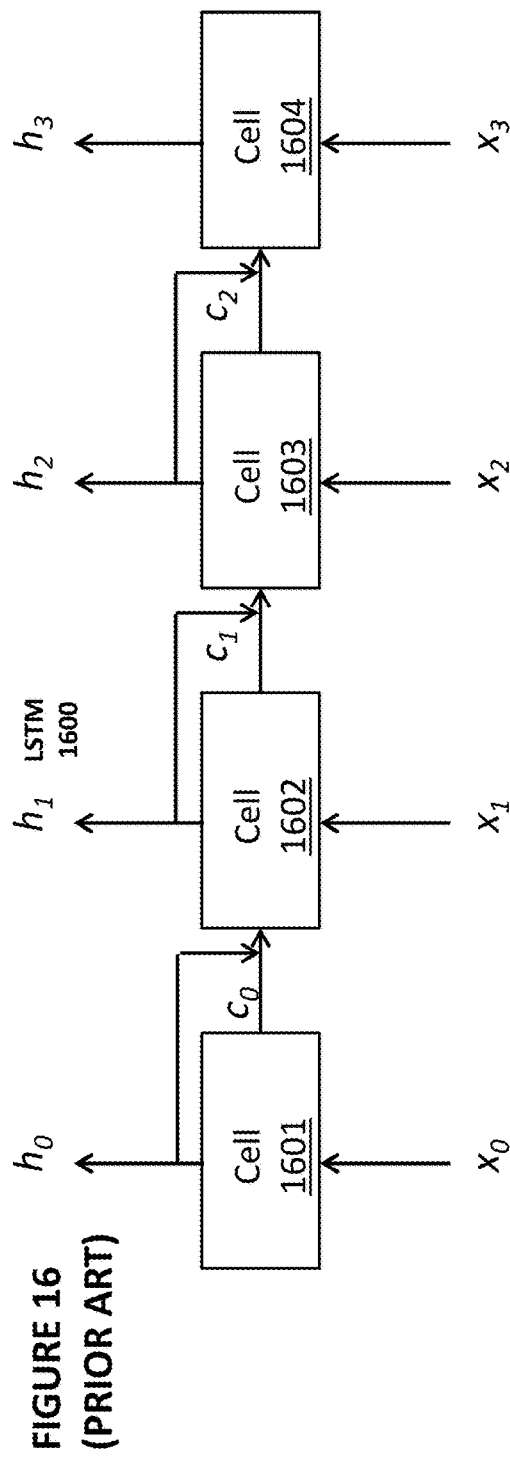
FIG. 16 depicts a prior art long short term memory system.

FIG. 16 depicts an exemplary LSTM 1600. LSTM 1600 in this example comprises cells 1601, 1602, 1603, and 1604. Cell 1601 receives input vector x$_0$ and generates output vector h$_0$ and cell state vector c$_0$. Cell 1602 receives input vector x$_1$, the output vector (hidden state) h$_0$ from cell 1601 and cell state c$_0$ from cell 1601 and generates output vector h$_1$ and cell state vector c$_1$. Cell 1603 receives input vector the output vector (hidden state) h$_1$ from cell 1602, and cell state c$_1$ from cell 1602 and generates output vector h$_2$ and cell state vector c$_2$. Cell 1604 receives input vector x$_3$, the output vector (hidden state) h$_2$ from cell 1603, and cell state c$_2$ from cell 1603 and generates output vector h$_3$. Additional cells can be used, and an LSTM with four cells is merely an example.

Figure 17:
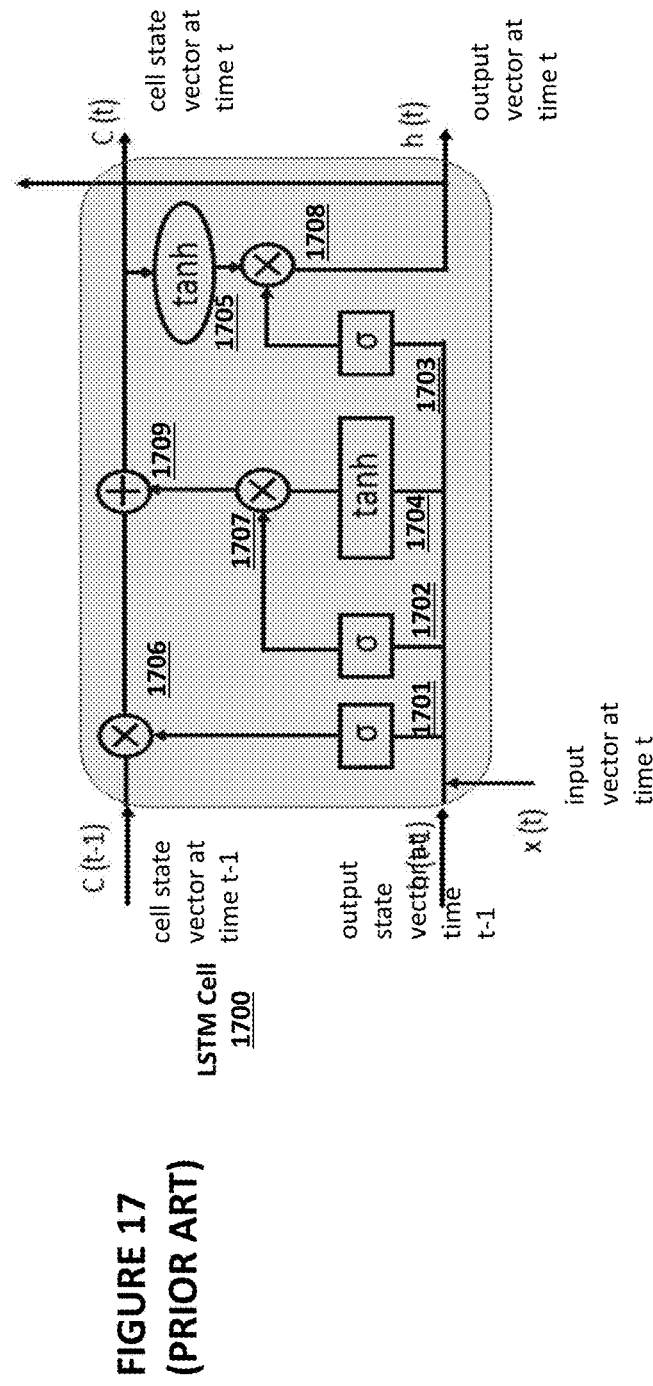
FIG. 17 depicts an exemplary cell for use in a long short term memory system.

FIG. 17 depicts an exemplary implementation of an LSTM cell 1700, which can be used for cells 1601, 1602, 1603, and 1604 in FIG. 16. LSTM cell 1700 receives input vector x(t), cell state vector c(t−1) from a preceding cell, and output vector h(t−1) from a preceding cell, and generates cell state vector c(t) and output vector h(t).

LSTM cell 1700 comprises sigmoid function devices 1701, 1702, and 1703, each of which applies a number between 0 and 1 to control how much of each component in the input vector is allowed through to the output vector. LSTM cell 1700 also comprises tan h devices 1704 and 1705 to apply a hyperbolic tangent function to an input vector, multiplier devices 1706, 1707, and 1708 to multiply two vectors together, and addition device 1709 to add two vectors together. Output vector h(t) can be provided to the next LSTM cell in the system, or it can be accessed for other purposes.

Figure 18:
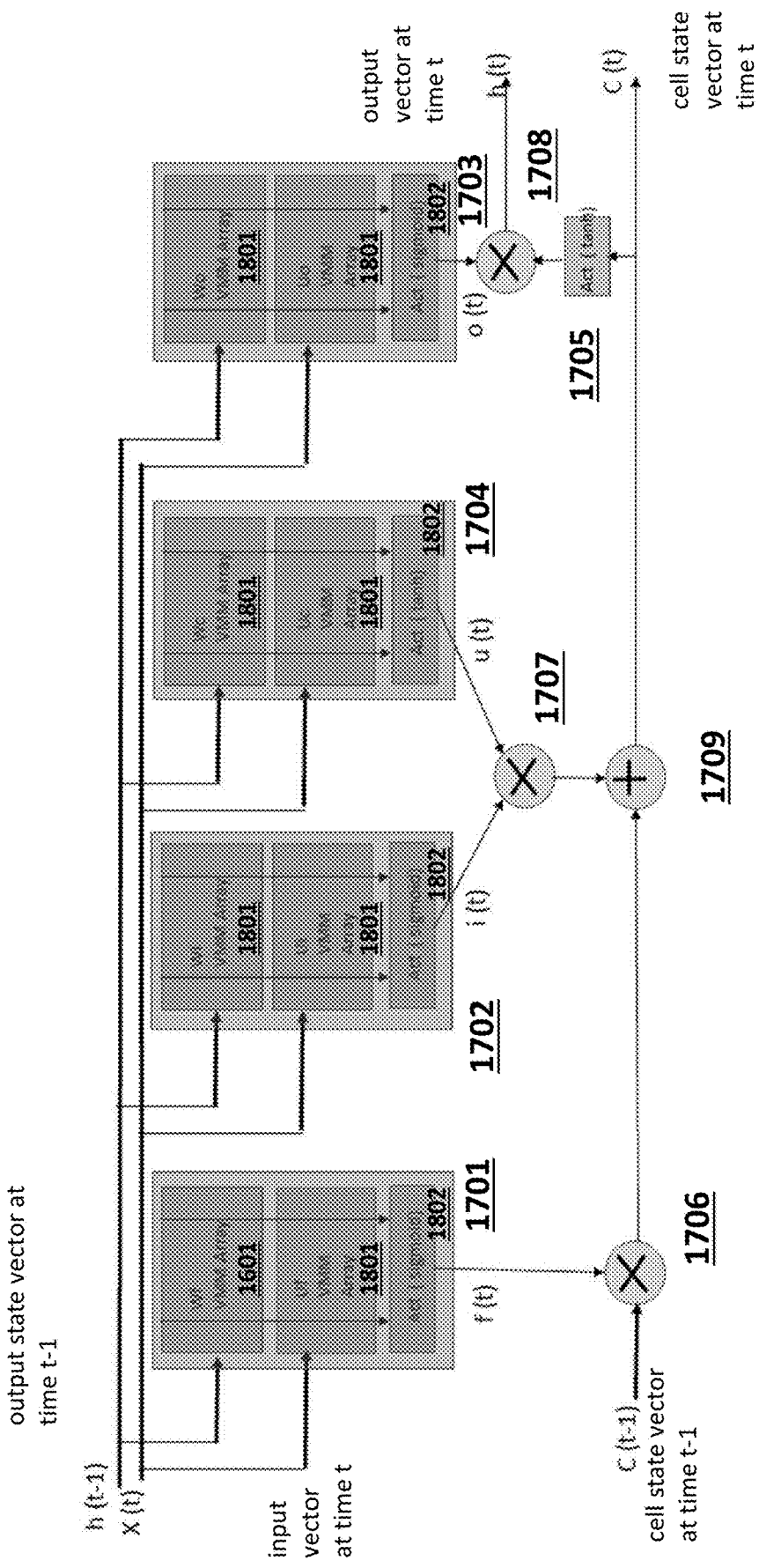
FIG. 18 depicts an embodiment of the exemplary cell of FIG. 17.

FIG. 18 depicts an LSTM cell 1800, which is an example of an implementation of LSTM cell 1700, For the reader's convenience, the same numbering from LSTM cell 1700 is used in LSTM cell 1800. Sigmoid function devices 1701, 1702, and 1703 and tan h device 1704 each comprise multiple VMM arrays 1801 and activation circuit blocks 1802. Thus, it can be seen that VMM arrays are particular useful in LSTM cells used in certain neural network systems. The multiplier devices 1706, 1707, and 1708 and the addition device 1709 are implemented in a digital manner or in an analog manner. The activation function blocks 1802 can be implemented in a digital manner or in an analog manner.

Figure 19:
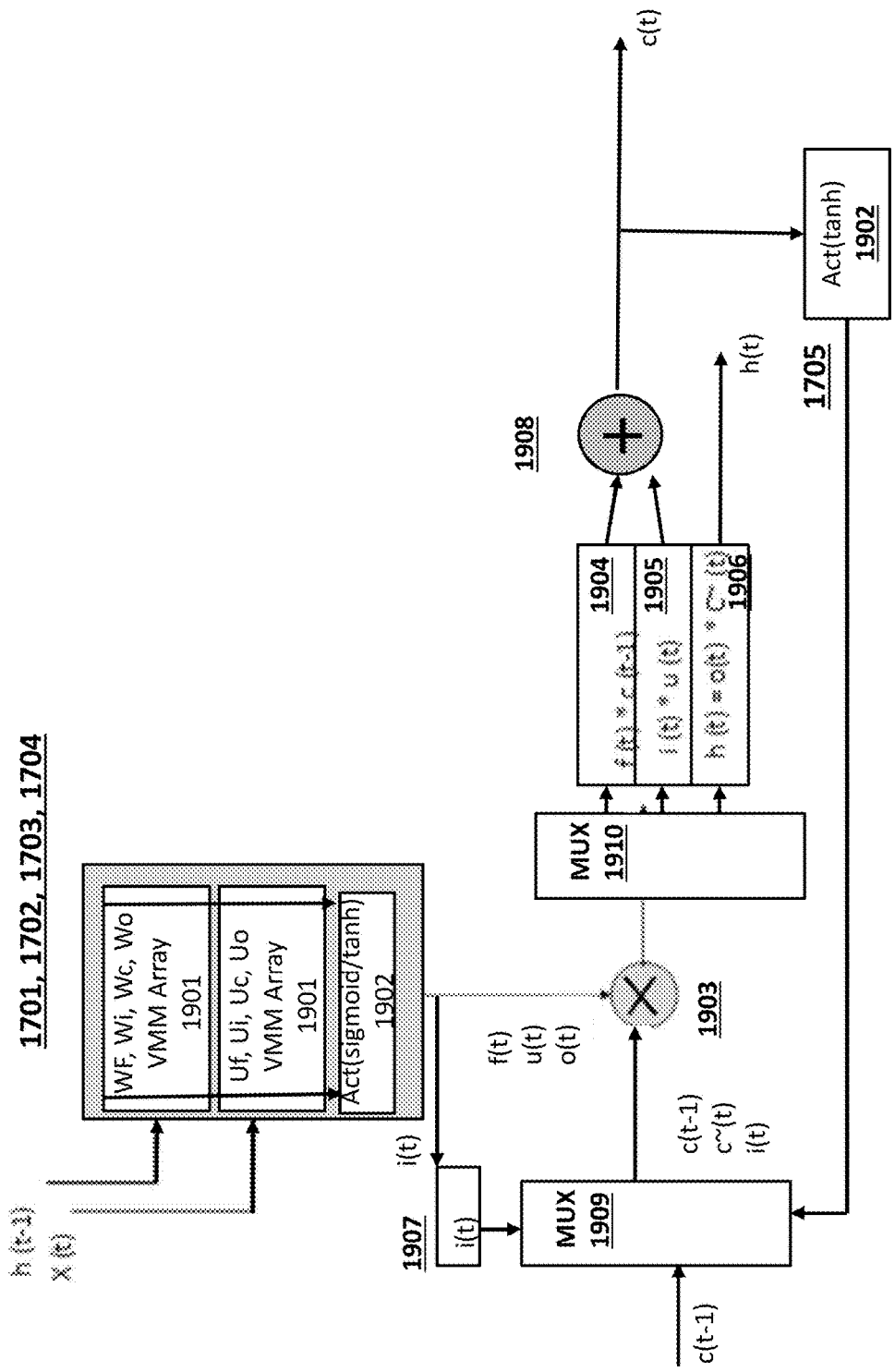
FIG. 19 depicts another embodiment of the exemplary cell of FIG. 17.

An alternative to LSTM cell 1800 (and another example of an implementation of LSTM cell 1700) is shown in FIG. 19. In FIG. 19, sigmoid function devices 1701, 1702, and 1703 and tan h device 1704 share the same physical hardware (VMM arrays 1901 and activation function block 1902) in a time-multiplexed fashion. LSTM cell 1900 also comprises multiplier device 1903 to multiply two vectors together, addition device 1908 to add two vectors together, tan h device 1705 (which comprises activation circuit block 1902), register 1907 to store the value i(t) when i(t) is output from sigmoid function block 1902, register 1904 to store the value f(t)*c(t−1) when that value is output from multiplier device 1903 through multiplexor 1910, register 1905 to store the value i(t)*u(t) when that value is output from multiplier device 1903 through multiplexor 1910, and register 1906 to store the value O(t)*c~(t) when that value is output from multiplier device 1903 through multiplexor 1910, and multiplexor 1909.

Whereas LSTM cell 1800 contains multiple sets of VMM arrays 1801 and respective activation function blocks 1802, LSTM cell 1900 contains only one set of VMM arrays 1901 and activation function block 1902, which are used to represent multiple layers in the embodiment of LSTM cell 1900, LSTM cell 1900 will require less space than LSTM 1800, as LSTM cell 1900 will require ¼ as much space for VMMs and activation function blocks compared to LSTM cell 1800, It can be further appreciated that LSTM units will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

Figure 20:
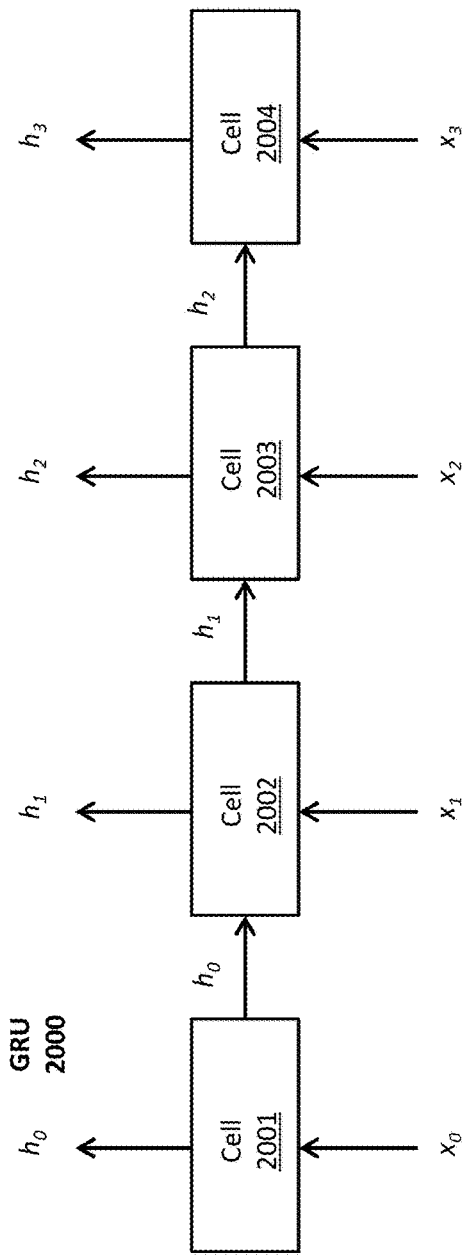
FIG. 20 depicts a prior art gated recurrent unit system.

FIG. 20 depicts an exemplary GRU 2000. GRU 2000 in this example comprises cells 2001, 2002, 2003, and 2004. Cell 2001 receives input vector $x_0$ and generates output vector $h_0$. Cell 2002 receives input vector $x_1$, the output vector $h_0$ from cell 2001 and generates output vector $h_1$. Cell 2003 receives input vector $x_2$ and the output vector (hidden state) $h_1$ from cell 2002 and generates output vector $h_2$. Cell 2004 receives input vector $x_3$ and the output vector (hidden state) $h_2$ from cell 2003 and generates output vector $h_3$. Additional cells can be used, and an GRU with four cells is merely an example.

Figure 21:
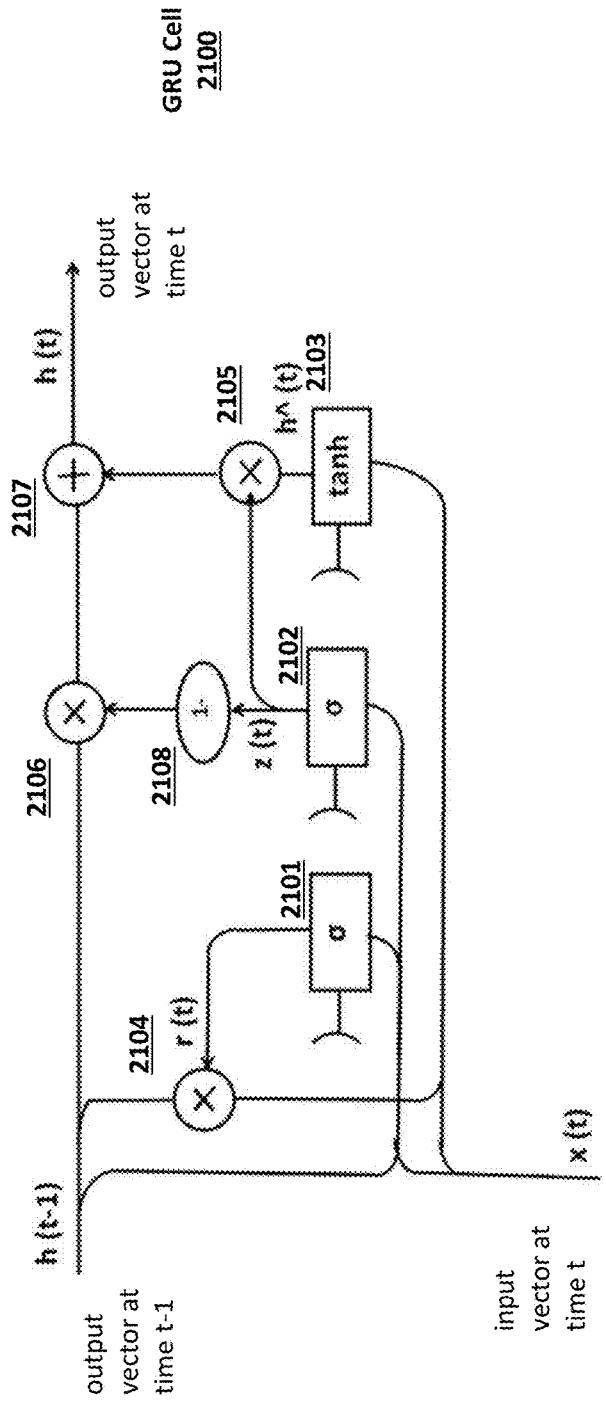
FIG. 21 depicts an exemplary cell for use in a gated recurrent unit system.

FIG. 21 depicts an exemplary implementation of a GRU cell 2100, which can be used for cells 2001, 2002, 2003, and 2004 of FIG. 20. GRU cell 2100 receives input vector x(t) and output vector h(t−1) from a preceding GRU cell and generates output vector h(t). GRU cell 2100 comprises sigmoid function devices 2101 and 2102, each of which applies a number between 0 and 1 to components from output vector h(t−1) and input vector x(t). GRU cell 2100 also comprises a tank device 2103 to apply a hyperbolic tangent function to an input vector, a plurality of multiplier devices 2104, 2105, and 2106 to multiply two vectors together, an addition device 2107 to add two vectors together, and a complementary device 2108 to subtract an input from 1 to generate an output.

Figure 22:
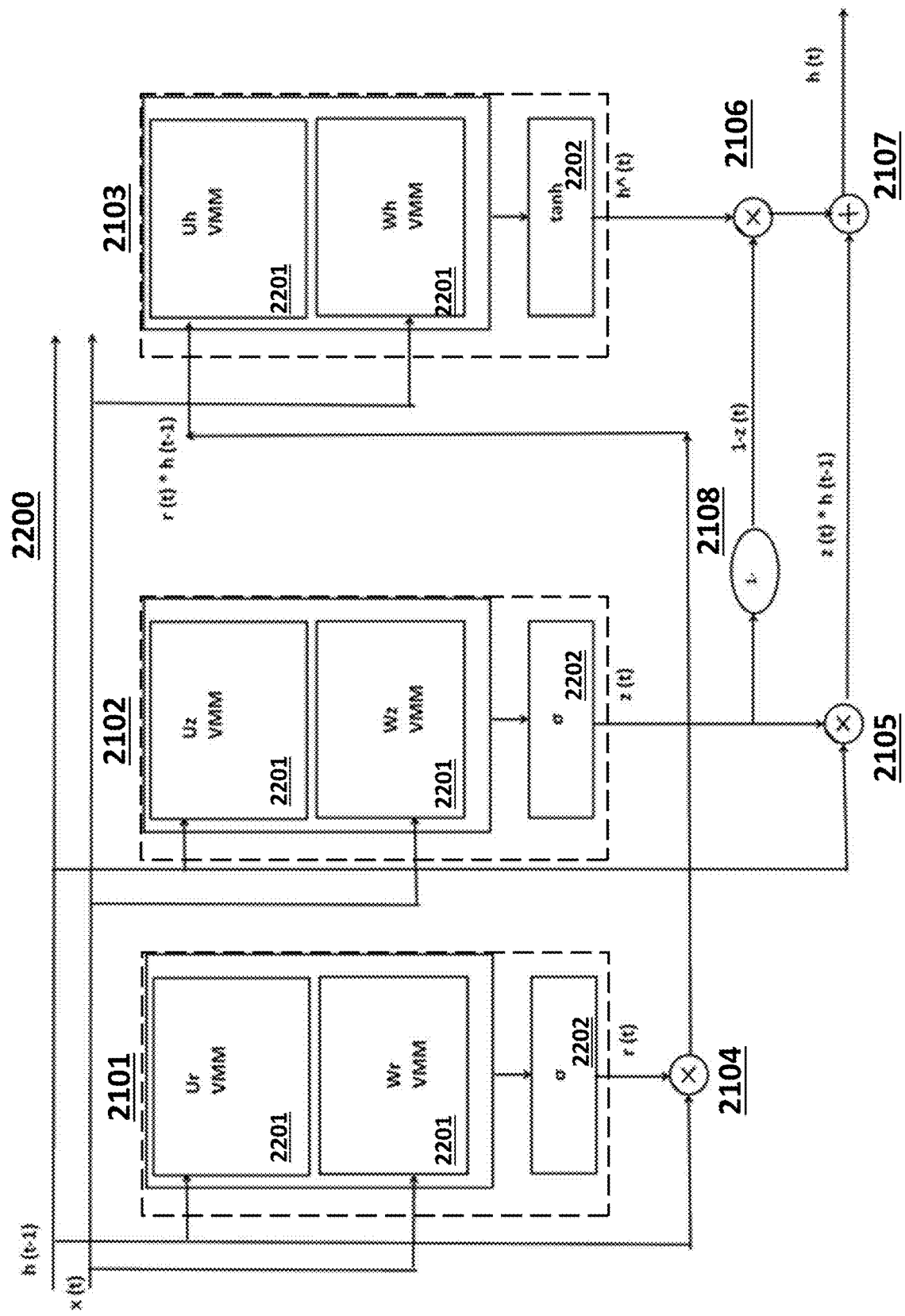
FIG. 22 depicts an embodiment of the exemplary cell of FIG. 21.

FIG. 22 depicts a GRU cell 2200, which is an example of an implementation of GRU cell 2100. For the reader's convenience, the same numbering from GRU cell 2100 is used in GRIT cell 2200. As can be seen in FIG. 22, sigmoid function devices 2101 and 2102, and tan h device 2103 each comprise multiple VMM arrays 2201 and activation function blocks 2202, Thus, it can be seen that VMM arrays are of particular use in GRU cells used in certain neural network systems. The multiplier devices 2104, 2105, 2106, the addition device 2107, and the complementary device 2108 are implemented in a digital manner or in an analog manner. The activation function blocks 2202 can be implemented in a digital manner or in an analog manner.

Figure 23:
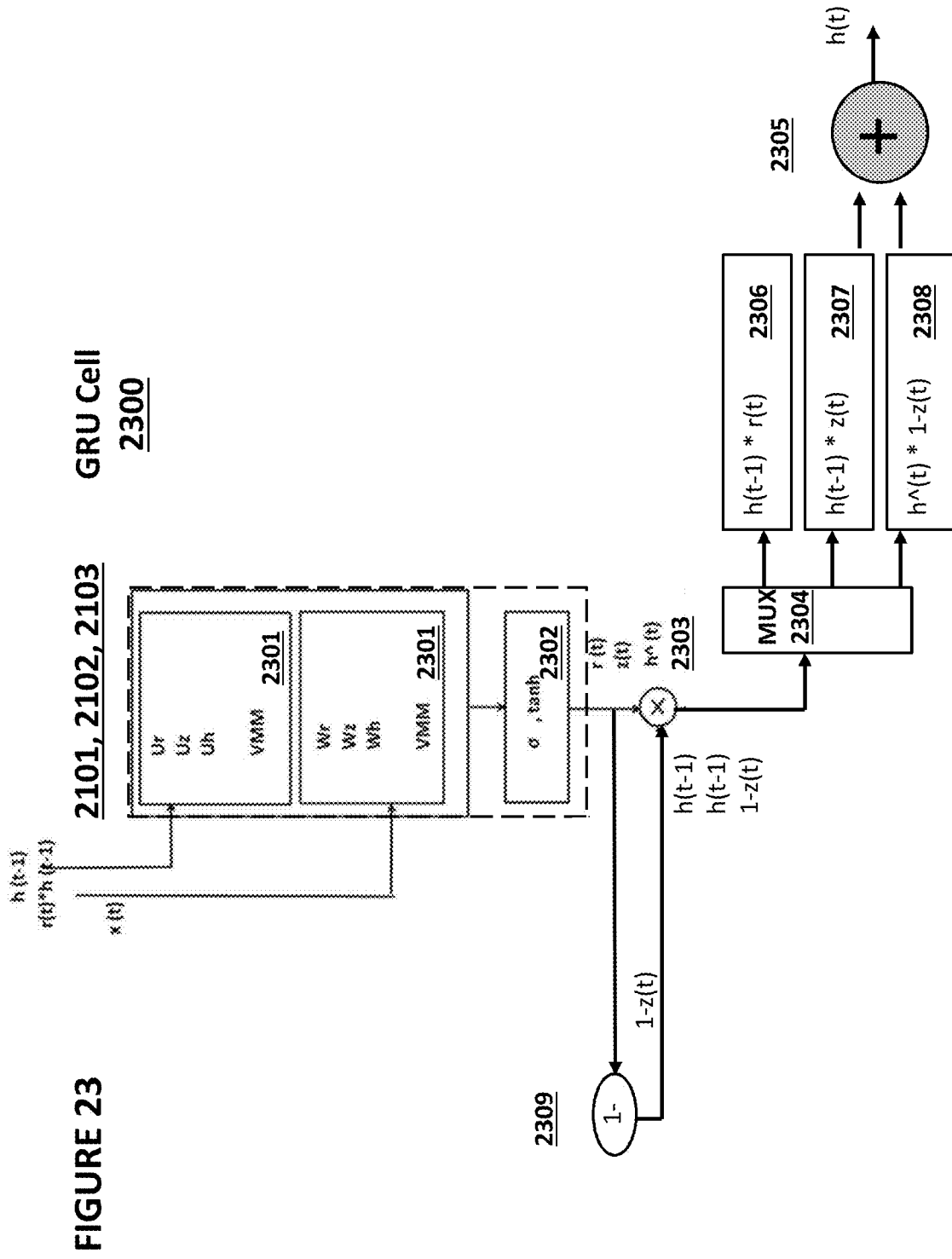
FIG. 23 depicts another embodiment of the exemplary cell of FIG. 21.

An alternative to GRU cell 2200 (and another example of an implementation of GRU cell 2300) is shown in FIG. 23. In FIG. 23, GRU cell 2300 utilizes VMM arrays 2301 and activation function block 2302, which when configured as a sigmoid function applies a number between 0 and 1 to control how much of each component in the input vector is allowed through to the output vector. In FIG. 23, sigmoid function devices 2101 and 2102 and tan h device 2103 share the same physical hardware (VMM arrays 2301 and activation function block 2302) in a time-multiplexed fashion. GRU cell 2300 also comprises multiplier device 2303 to multiply two vectors together, addition device 2305 to add two vectors together, complementary device 2309 to subtract an input from 1 to generate an output, multiplexor 2304, register 2306 to hold the value h(t−1)*r(t) when that value is output from multiplier device 2303 through multiplexor 2304, register 2307 to hold the value h(t−1)*z(t) When that value is output from multiplier device 2303 through multiplexor 2304, and register 2308 to hold the value h^(t)*(1−z(t)) when that value is output from multiplier device 2303 through multiplexor 2304.

Whereas GRU cell 2200 contains multiple sets of VMM arrays 2201 and activation function blocks 2202, GRU cell 2300 contains only one set of VMM arrays 2301 and activation function block 2302, which are used to represent multiple layers in the embodiment of GRU cell 2300. GRU cell 2300 will require less space than GRU cell 2200, as GRU cell 2300 will require ⅓ as much space for VMMs and activation function blocks compared to GRU cell 2200.

It can be further appreciated that GRU systems will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient.

The input to the VMM arrays can be an analog level, a binary level, or digital bits (in this case a DAC is needed to convert digital bits to appropriate input analog level) and the output can be an analog level, a binary level, or digital bits (in this case an output ADC is needed to convert output analog level into digital bits).

For each memory cell in a VMM array, each weight W can be implemented by a single memory cell or by a differential cell or by two blend memory cells (average of 2 cells). In the differential cell case, two memory cells are needed to implement a weight W as a differential weight (W=W+− W−). In the two blend memory cells, two memory cells are needed to implement a weight W as an average of two cells.

Configurable Input-Output Systems for VMM Arrays

Figure 33:
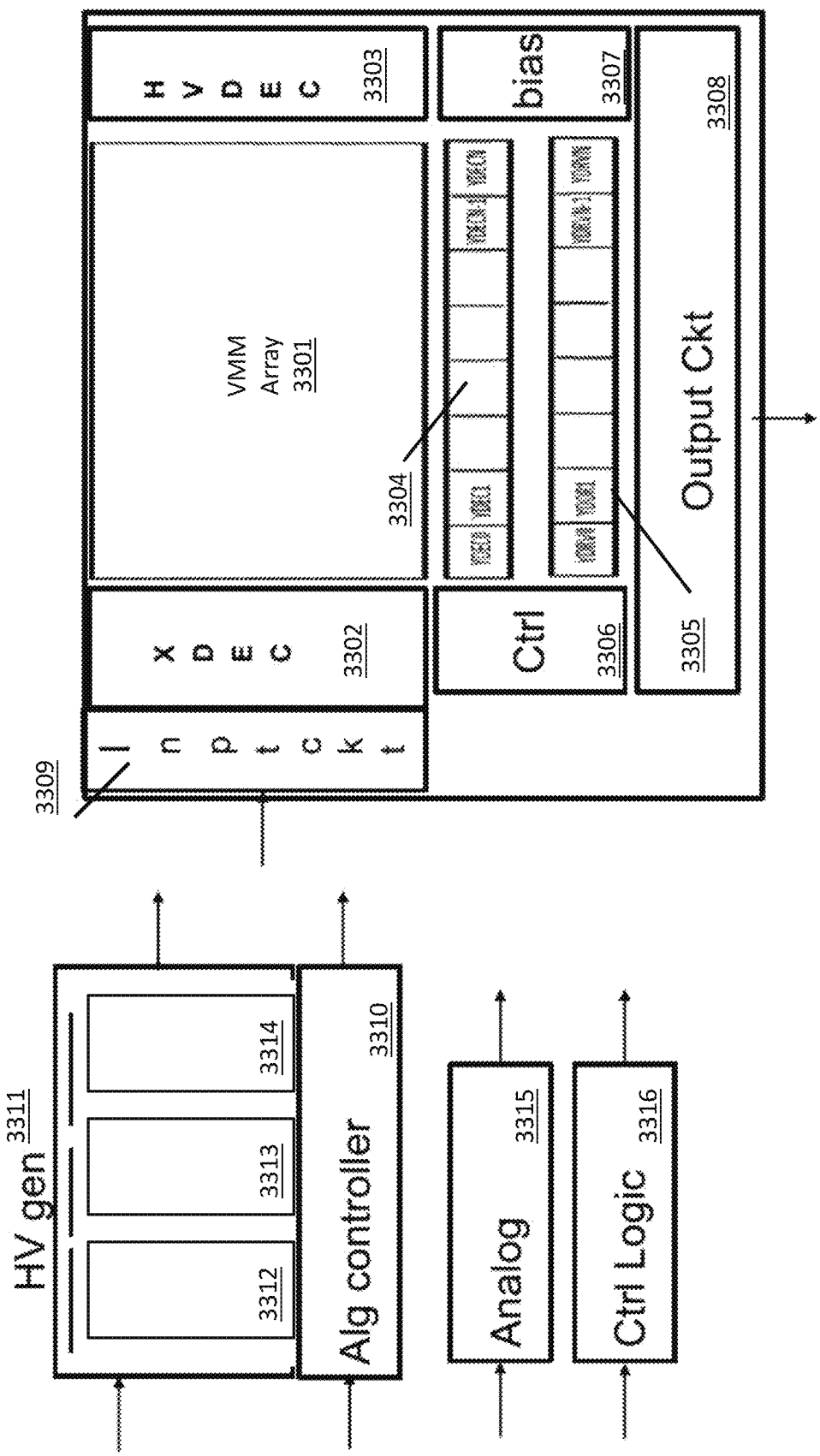
FIG. 33 depicts an exemplary block diagram of a vector-by-matrix multiplication system.

FIG. 33 depicts VMM system 3300. VMM system 3300 comprises VMM array 3301 (which can be based on any of the VMM array designs discussed previously, such as VMM array 1100, 1200, 1300, 1400, 1500, 2400, 2500, 2600, 2700, 2800, 2900, 3000 3100, and 3200 or other VMM array designs), low voltage row decoder 3302, high voltage row decoder 3303, column decoder 3304, column driver 3305, control logic 3306, bias circuit 3307, neuron output circuit block 3308, input VMM circuit block 3309, algorithm controller 3310, high voltage generator block 3311, analog circuit block 3315, and control logic 3316.

Input circuit block 3309 serves as interface from an external input to the input terminals of the memory array 3301. Input circuit block 3309 can comprise a DAC (Digital-to-Analog Converter), DPC (Digital-to-Pulse Converter), APC (Analog-to-Pulse Converter), IVC (Current-to-Voltage Converter), AAC (Analog-to-Analog Converter, such as a voltage-to-voltage scaler), or FAC (Frequency-to-Analog Converter), without limitation. Neuron output block 3308 serves as an interface from the memory array output to an external interface (not shown). Neuron output block 3308 can comprise an ADC (Analog-to-Digital Converter), APC (Analog-to-Pulse Converter), DPC (Digital-to-Pulse Converter), IVC (Current-to-Voltage Converter), or IFC (Current-to-Frequency Converter), without limitation. Neuron output block 3308 may include activation functions, normalization circuitry, and/or re-scaling circuitry, without limitation.

Figure 34:
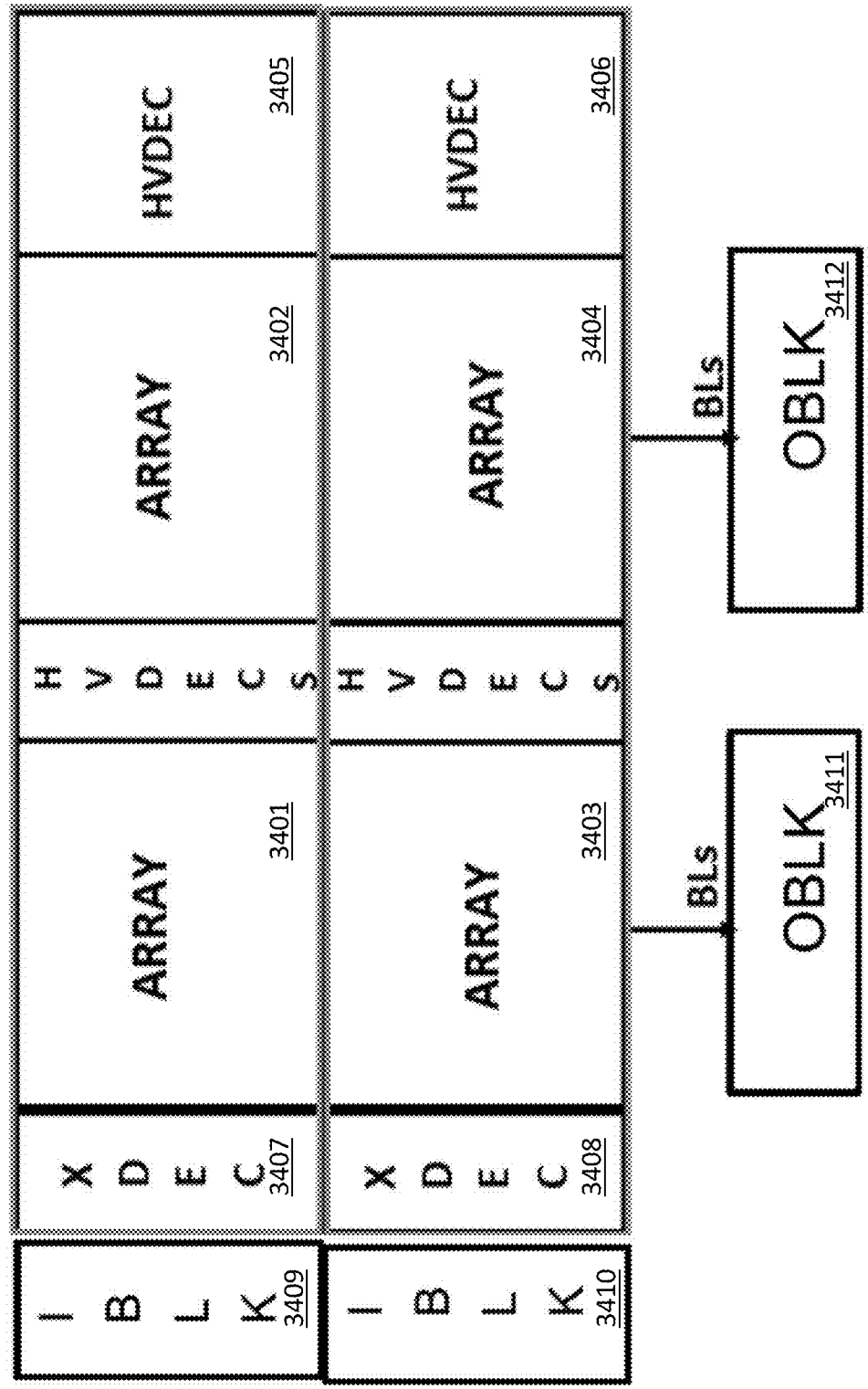
FIG. 34 depicts an exemplary block diagram of a vector-by-matrix multiplication system, where vertically-adjacent arrays share an output block.

FIG. 34 depicts VMM system 3400, which comprises VMM arrays 3401, 3402, 3403, and 3404; high voltage row decoders 3405 and 3406; low voltage row decoders 3407 and 3408; input blocks 3409 and 3410 (each similar to input block 3309 in FIG. 33); and output blocks 3411 and 3412. In this configuration, VMM arrays 3401 and 3403 share a set of bit lines as well as output block 3411, and VMM arrays 3402 and 3404 share a set of bit lines as well as output block 3412. VMM arrays 3401 and 3403 can be read at the same time, which effectively would combine them into a single, larger array, or they can be read at different times. Output blocks 3411 and 3412 (similar to output block 3308 in FIG. 33) are configurable to be able to handle read operations from one array at a time (such as reading from array 3401 or 3403 only) or from multiple arrays (such as reading from both arrays 3401 and 3403) at a time.

FIG. 35A depicts VMM system 3500, which comprises VMM arrays 3503, 3504, and 3505; shared global high voltage row decoder 3506; local high voltage row decoders 3507 and 3508; shared low voltage row decoder 3509; and input block 3510. In this configuration, VMM arrays 3503, 3504, and 3505 share input block 3510. VMM arrays 3503, 3504, and 3505 can receive inputs (e.g., voltages or pulses on word lines, control gate lines, erase gate lines, or source lines) through input block 3510 at the same time, which effectively combines them into a single, larger VMM array, or they can receive inputs through input block 3510 at different times, which effectively operates them as three distinct VMM arrays with same input block. Input block 3510 is configurable to be able to provide inputs to one array at a time or to multiple arrays at a time.

FIG. 35B depicts VMM system 3550, which comprises VMM arrays 3511, 3512, 3513, and 3514; global high voltage row decoder 3515; local high voltage row decoders 3516, 3517, and 3518; shared low voltage row decoder 3519; and input block 3520. In this configuration, VMM arrays 3511, 3512, 3513, and 3514 share input block 3520. VMM arrays 3511, 3512, 3513, and 3514 can receive inputs (e.g., voltages or pulses on word lines, control gate lines, erase gate lines, or source lines) through input block 3520 at the same time, which effectively combines them into a single, larger array, or they can receive inputs through input block 3520 at different times, which effectively operates them as three distinct VMM arrays with same input block 3520. Input block 3520 is configurable to be able to provide inputs to one array at a time or to multiple arrays at a time. For example, input block 3510 of FIG. 35A is configured to provide inputs to 3 arrays and input block 3520 is configured to provide inputs for 4 arrays.

Figure 36:
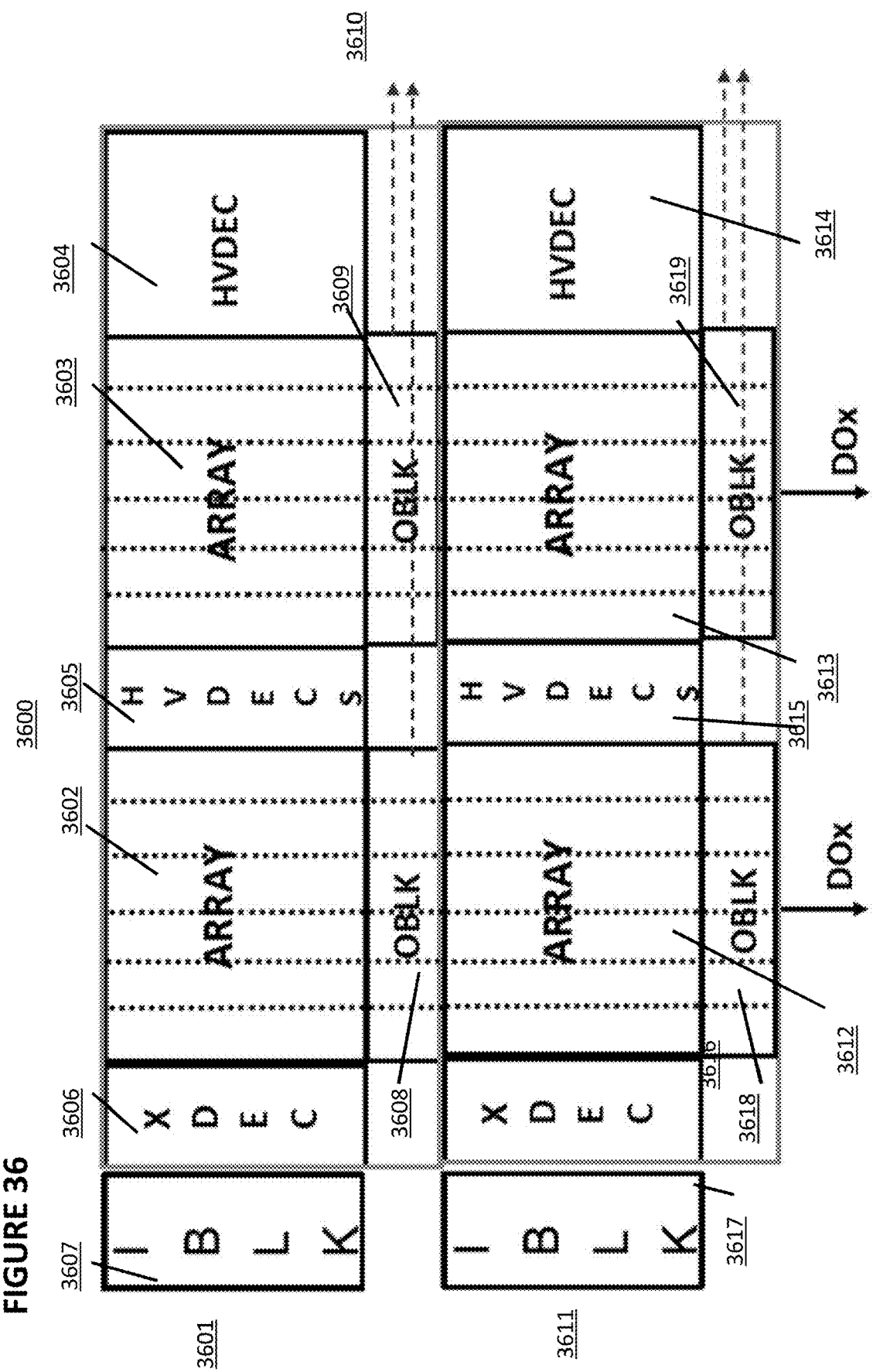
FIG. 36 depicts an exemplary block diagram of a vector-by-matrix multiplication system.

FIG. 36 depicts VMM system 3600, which comprises horizontal set 3601 and horizontal set 3611. Horizontal set 3601 comprises VMM arrays 3602 and 3603; shared global high voltage row decoder 3604; local high voltage row decoder 3605; shared low voltage row decoder 3606; and input block 3607. VMM arrays 3602 and 3603 share input block 3607. Input block 3607 is configurable to be able to provide inputs to one array at a time or multiple arrays at a time.

Horizontal set 3611 comprises VMM arrays 3612 and 3613; shared global high voltage decoder 3614; local high voltage row decoders 3615; shared low voltage row decoder 3616; and input block 3617. VMM arrays 3612 and 3613 share input block 3617. Input block 3617 is configurable to be able to provide inputs to one array at a time or to multiple arrays at a time.

In a first configuration, horizontal set 3601 utilizes output blocks 3608 and 3609, and horizontal set 3611 utilizes output blocks 3618 and 3619. Output blocks 3608, 3609, 3618, and 3619 can output currents, digital pulses, or digitals bits as the output. In one embodiment where digital bits are output, output blocks 3608, 3609, 3618, and 3619 each output 8 digital output bits.

In a second configuration, output blocks 3608 and 3609 are disabled, and VMM arrays 3602 and 3612 share output block 3618 and VMM arrays 3603 and 3613 share output block 3619. VMM arrays 3602 and 3612 can be read at the same time, which effectively combines them into a single, larger vertical array (meaning more rows per bitline), or they can be read at different times. If VMM arrays 3602 and 3612 are read at the same time, then in one embodiment where each output block would output an 8 bit range of values when coupled to only one array, then output blocks 3608 and 3609 each will output a 9 bit range of values. This is due to the dynamic range of the output neuron which has been doubled by the use of 2 arrays as a single large array. In this case the output may need to re-scaled or normalized (e.g., scaled down from 9 bits to 8 bits) if the next array only needs 8 bits of dynamic range. In another embodiment, the number of output bits can be kept the same when increasing the number of vertical arrays.

Similarly, VMM arrays 3603 and 3613 can be read at the same time, which effectively combines them into a single, larger array, or they can be read at different times. Output blocks 3618 and 3619 are configurable to be able to handle read operations from one array at a time or from multiple arrays at a time.

In VMM systems 3400, 3500, 3550, and 3600, when the system is configurable to utilize different numbers of arrays with each input block and/or output block, then the input block or output block itself must also be configurable. For example, in VMM system 3600, if output blocks 3608, 3609, 3612, and 3619 each output an 8-bit output when coupled to a single array, then output blocks 3618 and 3619 each will need to be configured to output a 9-bit output when it is coupled to two arrays (e.g., arrays 3602 and 3612, and arrays 3603 and 3609, respectively). If those outputs are then to be provided to the input block of another VMM system, the output will need to first be normalized if the input block is expecting an 8-bit input instead of a 9-bit input. Numerous analog and digital techniques are known for converting an N-bit value into an M-bit value. In the preceding example, N would be 9 and M would be 8, although one of ordinary skill in the art will appreciate that N and M can be any positive integers.

Additional arrays can be coupled to input blocks and output blocks in VMM systems 3400, 3500, 3550, and 3600. For example, in VMM system 3400, more than two arrays can be coupled to input block 3409 and more than two arrays can be coupled to input block 3410; in VMM system 3500, more than three arrays can be coupled to input block 3510; in VMM system 3550 more than four arrays can be coupled to input block 3520; and in VMM system 3600, more than two arrays can be coupled to input block 3607, more than two arrays can be coupled to input block 3617, more than two arrays can be coupled to output block 3618, and more than two arrays can be coupled to output block 3619. In those situations, the relevant input block and output block need to be further configured to accommodate the additional arrays.

Output blocks 3411 and 3412 in VMM system 3400 and output blocks 3618 and 3619 need to be configurable for the a verify operation following a programming operation, a verify operation will be affected by the number of arrays connected to the output block. Furthermore, for program/erase verification (used for tuning, meaning to produce a specific electrical charge on the floating gate of the memory to produce a desired cell current), accuracy of the output block circuit (e.g., 10 bits) needs to be greater than the accuracy required for inference reading (e.g. 8 bits). For example, verification accuracy>inference accuracy by >=1 bits, e.g. by 1-5 bits. This is required to ensure sufficient margin between one level to the next, such as for verification result distribution, data retention drift, temperature or variation, without limitation.

In addition, input blocks 3409, 3410, 3510, 3520, 3607, and 3617 and output blocks 3411, 3412, 3608, 3609, 3618, and 3619 in FIGS. 34, 35A, 35B, and 36 need to be configurable for calibration processes, as calibration will be impacted by the number of arrays connected to the output block. Examples of calibration processes include processes to compensate for offset, leakage, fabrication process, and changes due to temperature changes.

In the next section, various adjustable components are disclosed for use in input blocks and output blocks to enable the input blocks and output blocks to be configured based on the number of arrays coupled to the input block or output block.

Components of Input Blocks and Output Blocks

Figure 37A:
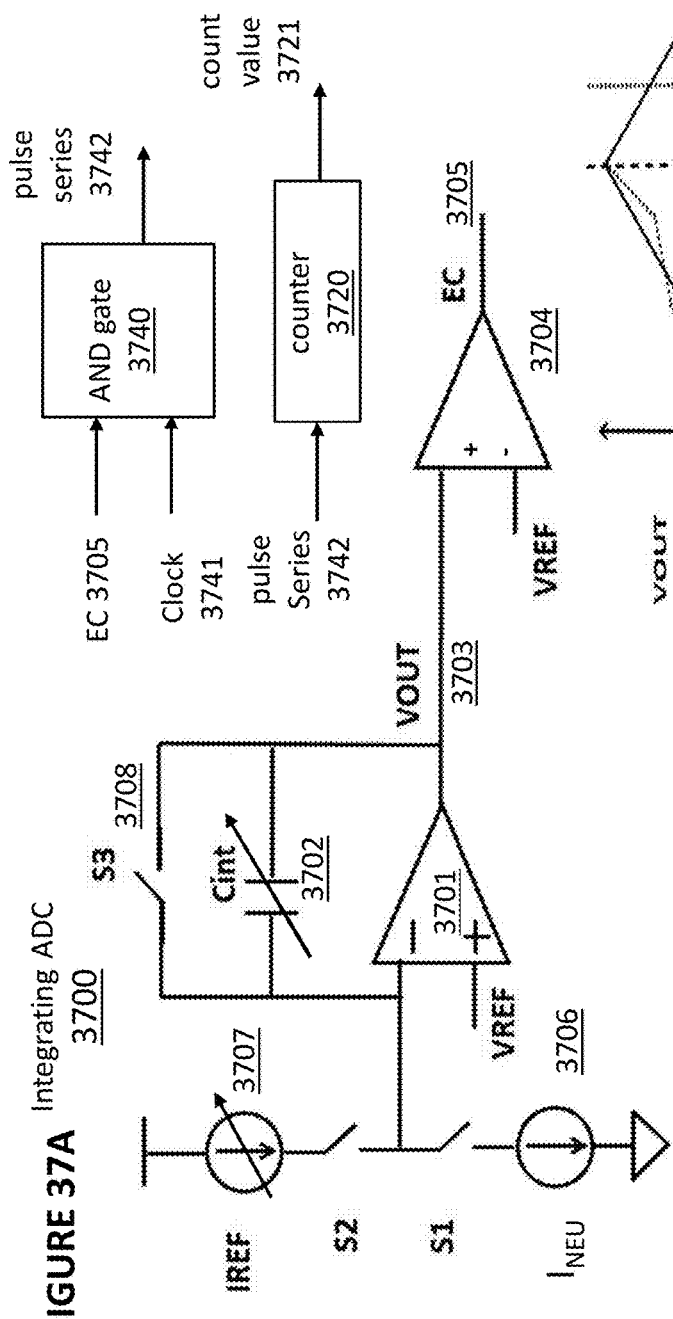
FIG. 37A depicts an embodiment of an integrating analog-to-digital converter.
Figure 37B:
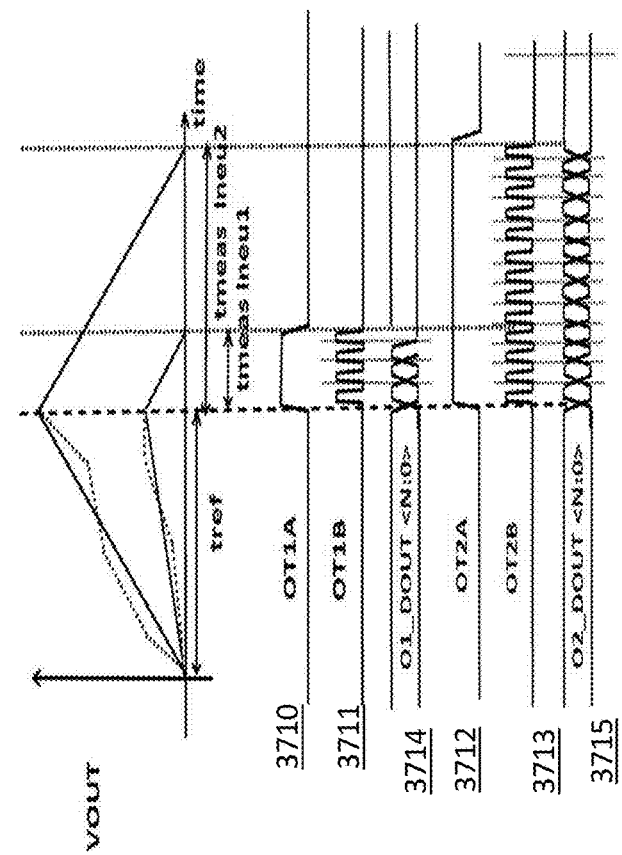
FIG. 37B depicts exemplary output waveforms for the system of FIG. 37A.

FIG. 37A depicts integrating dual-mixed slope analog-to-digital converter (ADC) 3700, which can be used in an output block such as output blocks 3411, 3412, 3608, 3609, 3618, and 3619 in FIGS. 34 and 36, where output neuron, $I_{NEU}$ 3706, is an output current from the VMM array received by the output block. Integrating dual-mixed slope analog-to-digital converter (ADC) 3700 converts $I_{NEU}$ 3706 into a series of digital/analog pulses or digital output bits. FIG. 37B depicts the operation waveform for the integrating ADC 3700 in FIG. 37A. Output waveforms 3710, 3711, and 3714 are for one current level. Output waveforms 3712, 3713, and 3715 are for another, higher current level. Waveforms 3710 and 3712 have pulse widths proportional to the value of the output current. Waveforms 3711 and 3713 have their number of pulses proportional to the value of the output current. Waveforms 3714 and 3715 have digital output bits proportional to the value of the output current.

Figure 38:
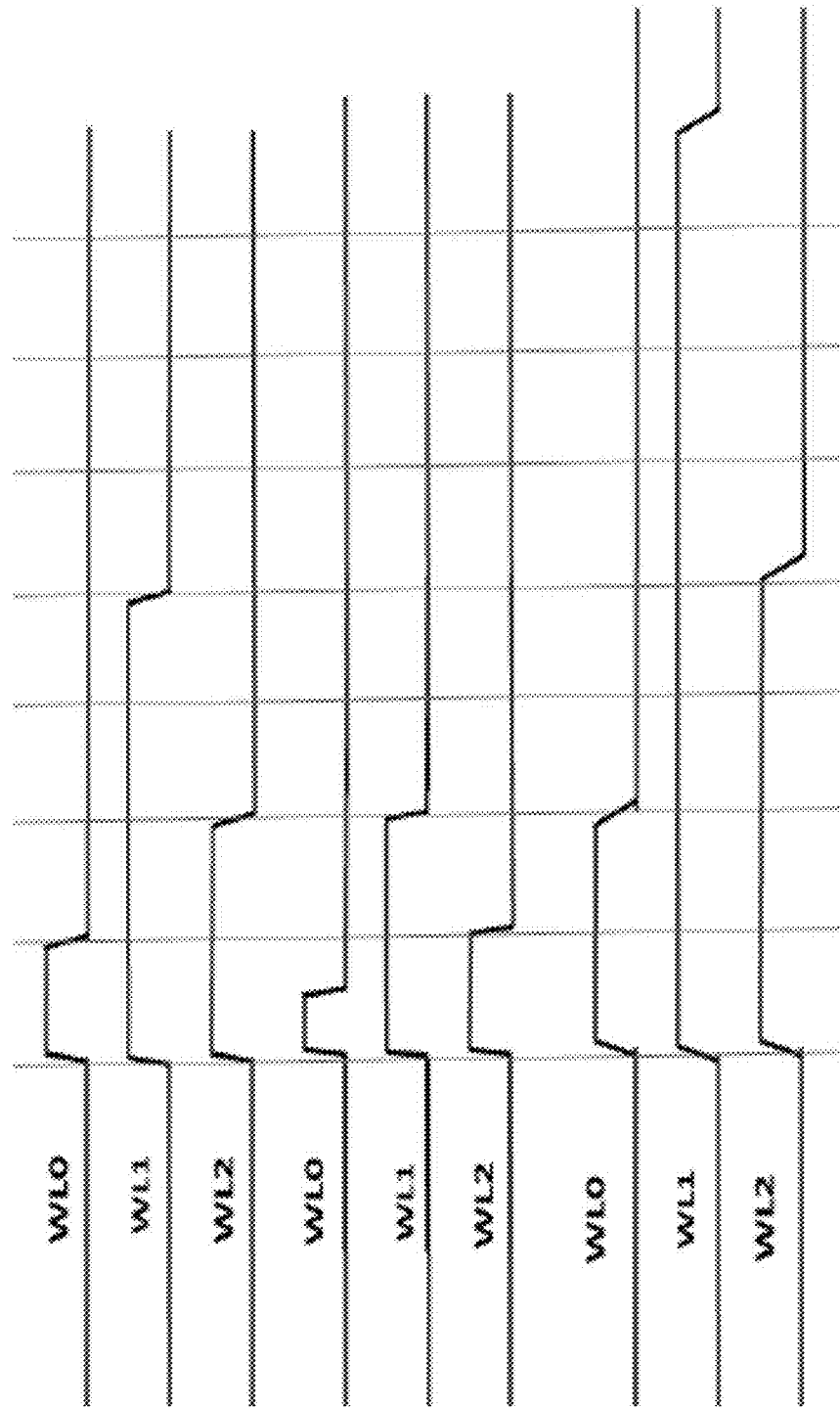
FIG. 38 depicts exemplary inputs that can be provided to the integrating analog-to-digital converter of FIG. 37A.

In one embodiment, ADC 3700 converts $I_{NEU}$ 3706, (which is an analog output current received by an output block from a VMM array) into a digital pulse whose width varies in proportion to the magnitude of the analog output current in the neuron output block, as shown in the examples depicted in FIG. 38. ADC 3700 comprises an integrator constituted of integrating op-amp 3701 and adjustable integrating capacitor 3702 integrates $I_{NEU}$ 3706 versus an adjustable reference current IREF 3707. Optionally, IREF 3707 can comprise a bandgap filter with a temperature coefficient of 0 or with a temperature coefficient that tracks the neuron current, $I_{NEU}$ 3706. The latter optionally can be obtained from a reference array containing values determined during a testing phase. During an initialization phase, switch 3708 is closed. Vout 3703 and the input to the negative terminal of operational amplifier 3701 then will become equal to VREF value. Thereafter, switch 3708 is opened and during a fixed time period tref, switch S1 is closed and the neuron current $I_{NEU}$ 3706 is up-integrated. During the fixed time period tref, Vout rises, and its slope changes as neuron current changes. Thereafter, during a period tmeas, a constant reference current IREF is down integrated for a time period tmeas (during which period Vout falls) by opening switch S1 and closing switch S2, where tmeas is the time required to down integrate Vout to VREF.

Output EC 3705 will be high when VOUT>VREFV and will be low otherwise. EC 3705 therefore generates a pulse whose width reflects the period tmeas, which in turn is proportional to the current $I_{NEU}$ 3706 (pulses 3710 and 3712 in FIG. 37B).

Optionally, the output pulse EC 3705 can be converted into a series of pulses of uniform period for transmission to the next stage of circuitry, such as the input block of another VMM array. At the beginning of period tmeas, output EC 3705 is input into AND gate 3740 with reference clock 3741. The output will be pulse series 3742 (where the frequency of the pulses in pulse series 3742 is the same as the frequency of clock 3741) during the period when VOUT>VREF. The number of pulses is proportional to the period tmeas, which is proportional to the current $I_{NEU}$ 3706 (waveforms 3711 and 3713 in FIG. 37B).

Optionally, pulse series 3743 can be input to counter 3720, which will count the number of pulses in pulse series 3742 and will generate count value 3721, which is a digital count of the number of pulses in pulse series 3742, which is directly proportional to neuron current $I_{NEU}$ 3706. Count value 3721 comprises a set of digital bits (waveforms 3714 and 3715 in FIG. 37B).

In another embodiment, integrating dual-slope ADC 3700 can convert neuron current $I_{NEU}$ 3706 into a pulse where the width of the pulse is inversely proportionally to the magnitude of neuron current $I_{NEU}$ 3706. This inversion can be done in a digital or analog manner, and converted into a series of pulses, or digital bits for output to follow on circuitry.

Adjustable integrating capacitor 3702 and adjustable reference current IREF 3707 are adjusted in response to the number of arrays, N, connected to integrating dual-mixed slope analog-to-digital converter (ADC) 3700. For example, when N arrays are connected to integrating dual-mixed slope analog-to-digital converter (ADC) 3700, adjustable integrating capacitor 3702 is adjusted by 1/N, or adjustable reference current IREF 3707 is adjusted by N.

Optionally, a calibration step can be performed while the VMM array and ADC 3700 are at, or above, operating temperature to offset any leakage current that is present within the VMM array or a control circuit, and that offset value thereafter can be subtracted from Ineu in FIG. 37A. The calibration step can also be performed to compensate for the process or voltage supply variation in addition to temperature variation.

A method of operation of the output circuit blocks comprises first performing calibration for offset and voltage supply variation compensation. Next, output conversion is performed (such as converting the neuron current into pulse or digital bits), and then data normalization is performed to align the output range to the input range of the next VMM array. The data normalization may include data compression or output data quantization (such as to reduce the number of bits says from 10 bits to 8 bits). The activation may be performed after the output conversion or after the data normalization, compression or quantization. Examples of calibration algorithms are discussed below with reference to FIGS. 49, 50A, 50B, and 51, discussed below.

Figures 39, 40:
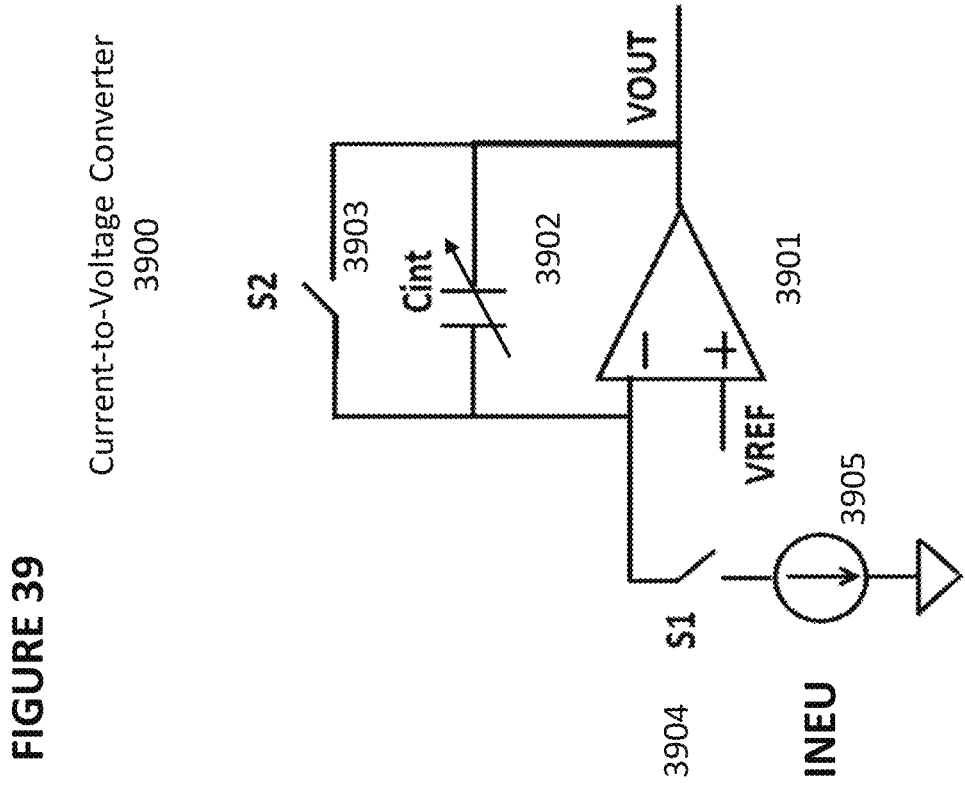
FIG. 39 depicts an embodiment of a current-to-voltage converter.
FIG. 40 depicts a digital data-to-voltage converter.

FIG. 39 depicts current-to-voltage converter 3900, which optionally can be used to convert a neuron output current into a voltage, that for example, can be applied as an input (for example, on a WL or a CG line) of the VMM memory array. Thus, current-to-voltage converter 3900 can be used in input blocks 3409, 3410, 3510, 3520, 3607, and 3617 in FIGS. 34, 35A, 35B, and 36 when those blocks are receiving analog currents (as opposed to pulses or digital data) as inputs.

Current-to-voltage converter 3900 comprises op amp 3901, adjustable capacitor 3902, switch 3903, switch 3904, and current source 3905 that here represents the neuron current INEU received by the input block. During current to voltage operation, switch 3903 will be open, and switch 3904 will be closed. The output, Vout, will increase in amplitude in proportion to the magnitude of the neuron current INEU 3905.

FIG. 40 depicts digital data-to-voltage converter 4000, which optionally can be used to convert digital data, received as signal DIN, into a voltage that, for example, can be applied as an input (for example, on a WL or a CG line) of the VMM memory array. When switch 4002 is closed, the data input of signal DIN will enable the IREF_u reference current 4001 into the capacitor 4003, creating a voltage on its terminal. Thus, digital data-to-voltage converter 4000 can be used in input blocks 3409, 3410, 3510, 3520, 3607, and 3617 in FIGS. 34, 35A, 35B, and 36 when those blocks are receiving digital data (as opposed to pulses or analog currents) as inputs. In addition, the digital data-to-voltage converter 4000 can be configured so that the digital data received at the input as signal DIN feeds directly through to the output OUT by opening switches 4002 and 4004 and closing switch 4005. Switches 4002, 4004 and 4005 are thus configured to enable the output OUT to either to receive the voltage on the capacitor 4003 or to receive the digital data received as signal DIN directly. In the embodiment shown, signal DIN is received as data pulses.

Digital data-to-voltage pulse converter 4000 comprises adjustable reference current 4001, switch 4002, variable capacitor 4003, switch 4004, and switch 4005. Adjustable reference current 4001 and variable capacitor 4003 can be configured with different values to adjust for the difference in size of the array to which digital data-to-voltage pulse converter 400 is attached. During operation, the digital data controls switch 4002, such that switch 4002 closes whenever the digital data is high. When switch closes, adjustable reference current 4001 will charge variable capacitor 4003. Switch 4004 is closed whenever it is desired to provide the output at node OUT, such as when an array is ready to be read. In the alternative, switch 4004 can be opened and switch 4005 can be closed and the data input can be passed through as the output.

Figures 41, 42:
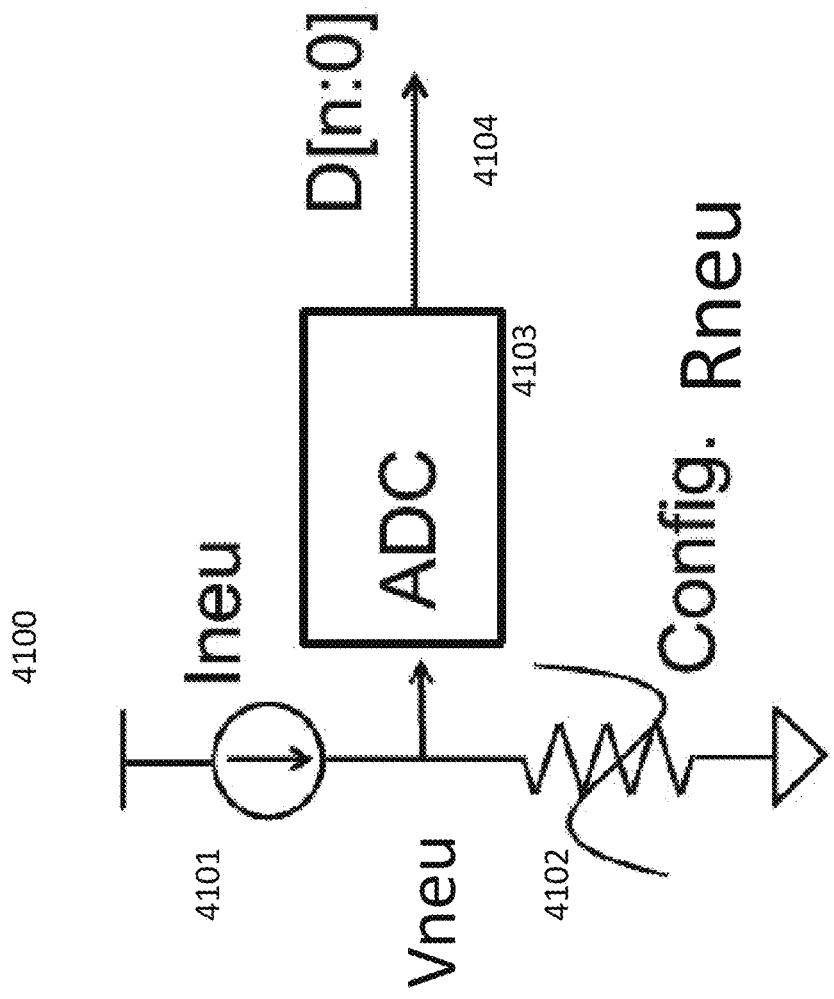
FIG. 41 depicts a configurable analog to digital converter.
FIG. 42 depicts a configurable current-to-voltage input circuit.

FIG. 41 depicts configurable analog to digital converter 4100, which optionally can be used to convert analog neuron current into digital data. Configurable analog to digital converter 4100 can be used in an output block such as output blocks 3411, 3412, 3608, 3609, 3618, and 3619 in FIGS. 34 and 36, where output neuron, INEU 4101, is an output current received by the output block.

Configurable analog to digital converter 4100 comprises current source 4101, variable resistor 4102, and analog-to-digital converter 4103. The current INEU 4101 drops across the variable resistor 4102 Rneu to produce a voltage Vneu=Ineu*Rneu. The ADC 4103 (such as integrating ADC, SAR ADC, flash ADC, or SigmaDelta ADC, without limitation) converts this voltage into digital bits.

FIG. 42 depicts configurable current-to-voltage converter 4200, which optionally can be used to convert analog neuron current into a voltage that can be applied as an input (for example, on a WL or a CG line) of the VMM memory array. Thus, configurable current-to-voltage converter 4200 can be used in input blocks 3409, 3410, 3510, 3520, 3607, and 3617 in FIGS. 34, 35A, 35B, and 36 when those blocks are receiving analog current (as opposed to pulses or digital data) as inputs. Configurable current-to-voltage converter 4200 comprises adjustable resistor Rin 4202 and receives input current Iin 4201 (which is the received input current) and generates Vin 4203, =Iin*Rin.

Figure 43A:
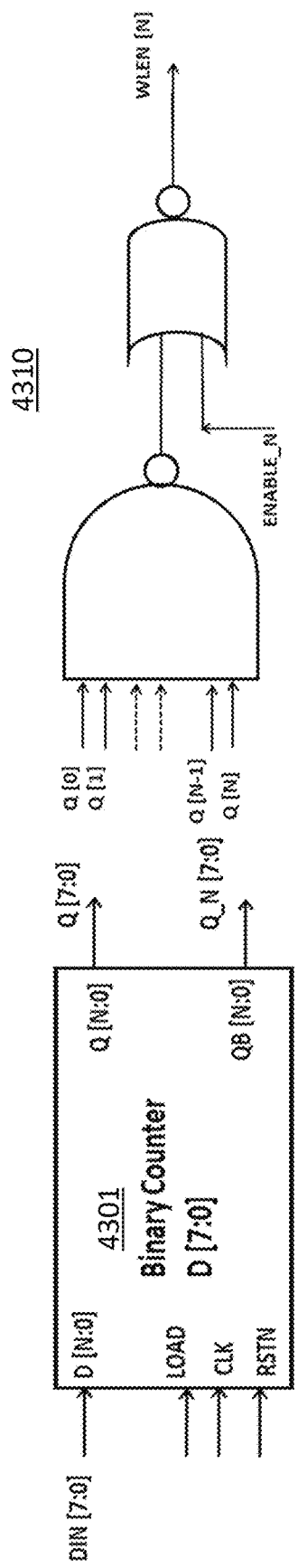
FIG. 43A depicts a digital-to-pulse row converter.
Figure 43B:
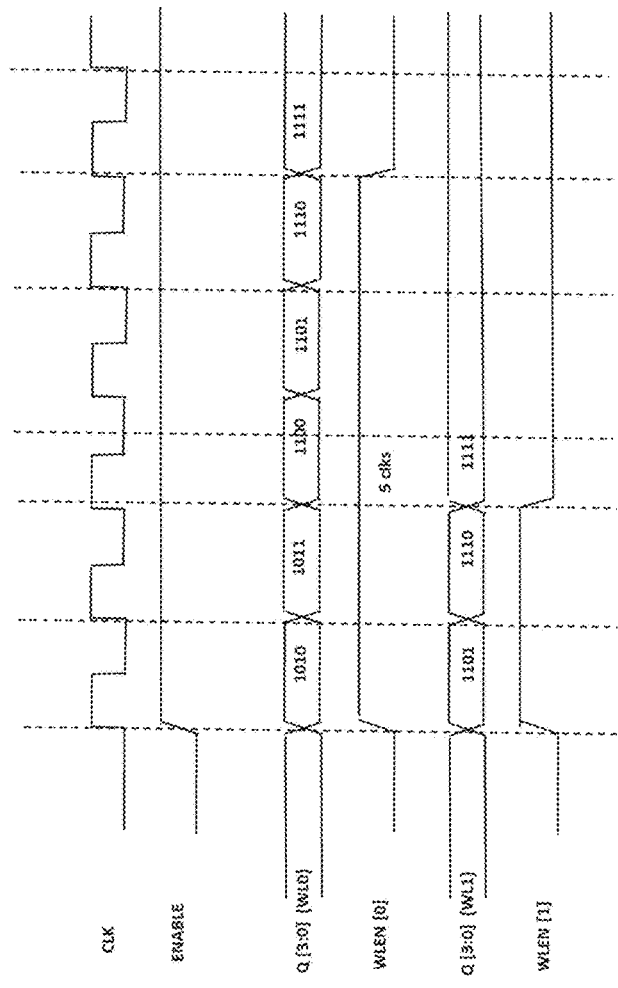
FIG. 43B depicts exemplary waveforms for the digital-to-pulse row converter of FIG. 43A.

FIGS. 43A and 43B depict digital bits-to-pulse width converter 4300 to be used within an input block, row decoder, or output block. The pulse width output from digital bits-to-pulse width converter 4300 is proportional to the value of the digital bits.

Digital bits-to-pulse width converter comprises binary counter 4301. The state Q [N:0] of binary counter 4301 can be loaded by serial or parallel data in a loading sequence. Row control logic 4310 outputs a voltage pulse WLEN with a pulse-width that is proportional to the value of the digital data inputs provided from blocks such as integrating ADC in FIG. 37.

FIG. 43B shows the waveform for the output pulse width where the width is proportional to the digital bit values. First, the data in the received digital bits is inverted, and the inverted digital bits are loaded either serially or in parallel into counter 4301. Then, the row pulse-width is generated by row control logic 4310 as shown in waveform 4320 by counting in a binary manner until it reaches the maximum counter value.

An example using 4-bit values for DIN is shown in Table No. 9:

TABLE NO. 9

Digital Input Bits to Output Pulse Width

| DIN <3:0> | counts | inverted DIN<3:0> loaded into the counter | output pulse width = # clks |
|---|---|---|---|
| 0000 | 0 | 1111 | 0 |
| 0001 | 1 | 1110 | 1 |
| 0010 | 2 | 1101 | 2 |
| 0011 | 3 | 1100 | 3 |
| 0100 | 4 | 1011 | 4 |
| 0101 | 5 | 1010 | 5 |
| 0110 | 6 | 1001 | 6 |
| 0111 | 7 | 1000 | 7 |
| 1000 | 8 | 0111 | 8 |
| 1001 | 9 | 0110 | 9 |
| 1010 | 10 | 0101 | 10 |
| 1011 | 11 | 0100 | 11 |
| 1100 | 12 | 0011 | 12 |
| 1101 | 13 | 0010 | 13 |
| 1110 | 14 | 0001 | 14 |
| 1111 | 15 | 0000 | 15 |

Optionally, a pulse series-to-pulse converter can be used to convert the output comprising a pulse series into a single pulse whose width varies in proportion to the number of pulses in the pulse series to be used as an input to a VMM array that will be applied to wordline or control gates within the VMM array. An example of a pulse series-to-pulse converter is a binary counter with control logic.

Another embodiment utilizes an up binary counter and digital comparison logic.

Namely, the output pulse width is generated by counting using an up binary counter until the digital outputs of the binary counter is same as the digital input bits.

Another embodiment utilizes a down binary counter. First, the down binary counter is loaded serially or in parallel with the digital data input pattern. Next, the output pulse width is generated by counting down the down binary counter until the digital outputs of the binary counter reaches minimum value, namely a '0' logic state.

Figure 44A:
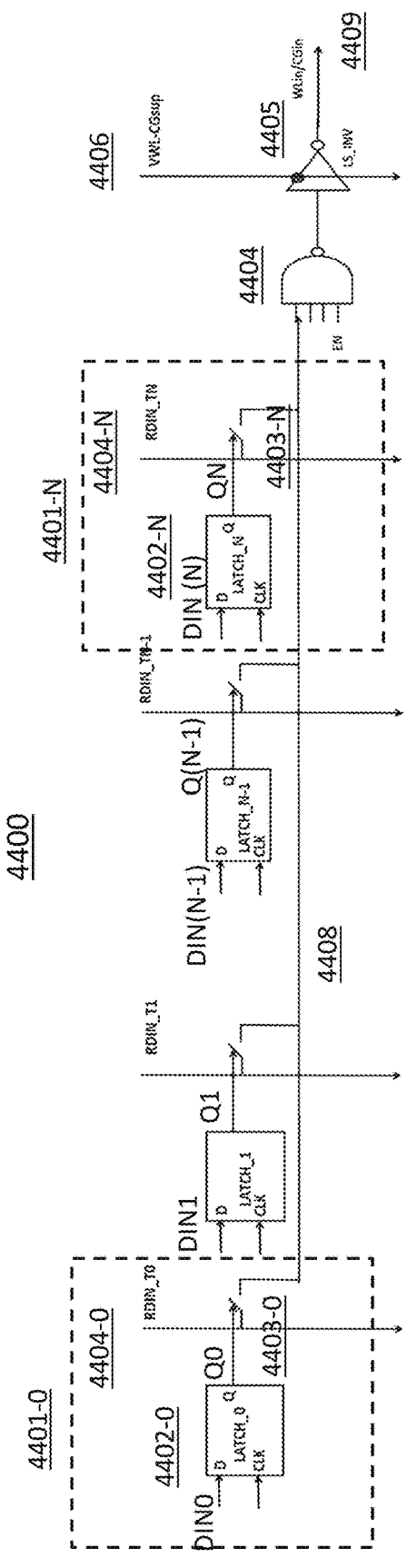
FIG. 44A depicts a digital-to-pulse row converter.

FIG. 44A depicts digital data-to-pulse row converter 4400, which comprises binary indexed pulse stages 4401-i, where i ranges from 0 to N (i.e. least significant bit LSB to most significant bit MSB). The row converter 4400 is used to provide row input to the arrays. Each stage 4401-i comprises latch 4402-i, switch 4403-i, and row digital binary indexed pulse input 4404-i (RDIN_Ti). For example, the binary indexed pulse input 4404-0 (RDIN_T0) has pulse width equal to one time unit, i.e. 1*tpls1unit. The binary indexed pulse input 4404-1 (RDIN_T1) has width equal to two time units, i.e. 2*tpls1unit. The binary indexed pulse input 4404-2 (RDIN_T2) has width equal to four time units, i.e. 4*tpls1unit. The binary indexed pulse input 4403-3 (RDIN_T3) has width equal to eight time units, i.e. 8*tpls1unit. The digital data in pattern DINi (from a neuron output) for each row is stored in the latches 4402-$i$. If the output Qi of the latch 4402-$i$ is a '1' it will transfer, through the switch 4403-$i$, the binary indexed pulse input 4404-$i$ (RDIN_Ti) to time summation converter node 4408. Each time summation converter node 4408 is connected to a respective input of NAND gate 4404, and the output of NAND gate 4404 generates the output of the row converter WLIN/CGIN 4409 through level shifting inverter 4405. The time summation converter node 4408 sums up the binary indexed pulse inputs 4404-$i$ sequentially in time responsive to the common clocking signal CLK, because the binary index pulse input 4404-$i$ (RDIN_Ti) is enabled in a sequential manner one digital bit at a time, for example from LSB to MSB, or from MSB to LSB, or any random bit pattern.

Figure 44B:
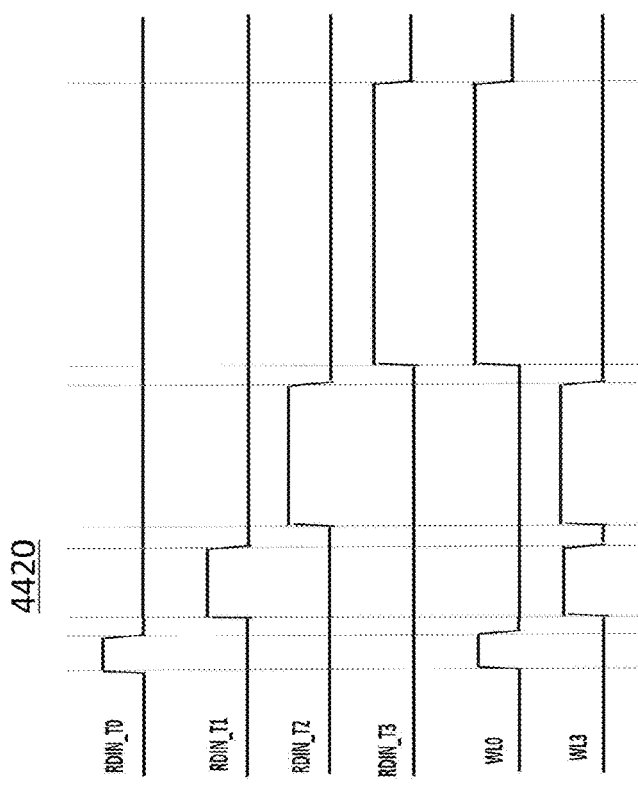
FIG. 44B depicts exemplary waveforms for the digital-to-pulse row converter of FIG. 44A.

FIG. 44B depicts exemplary waveforms 4420. Shown here are example signals for row digital binary indexed pulse input 4404-$i$, specifically, 4404-0, 4404-1, 4404-2, and 4404-3, and example outputs from level shifting inverter 4405, labeled as WL0 and WL3, where WL0 and WL3 are generated from row converter 4400 circuit. In this example, WL0 is generated by row digital input 4403-0 and 4403-3 of its row decoder being asserted (WL0: Q0='1', Q3='1'), and WL3 is generated by row digital input 4403-1 and 4403-2 of its row decoder being asserted (WL3: Q1='1', Q2='1'). If none of the row digital input 4403-$x$ is asserted, there is no pulse on WL0 or WL3 (control logic for this is not shown in FIG. 44A). Inputs from other rows of digital-to-pulse row converter 4400, i.e. other inputs to NAND gate 4404, are assumed to be high during this period.

Figure 44C:
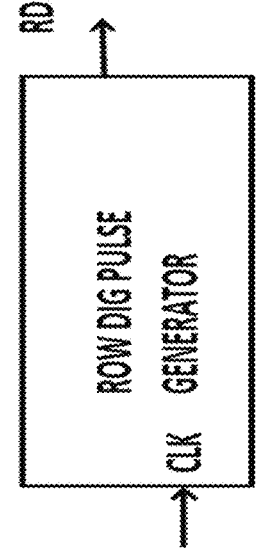
FIG. 44C depicts a row digital pulse generator for use with the digital-to-pulse row converter of FIG. 44A.

FIG. 44C depicts row digital pulse generator 4410, which generates row digital binary indexed pulse inputs 4403-$i$ (RDIN_Ti), where the width of the pulse is proportional to the binary value of the digital bit as described in above in relating to FIG. 44A.

Figures 45A, 45B, 45C:
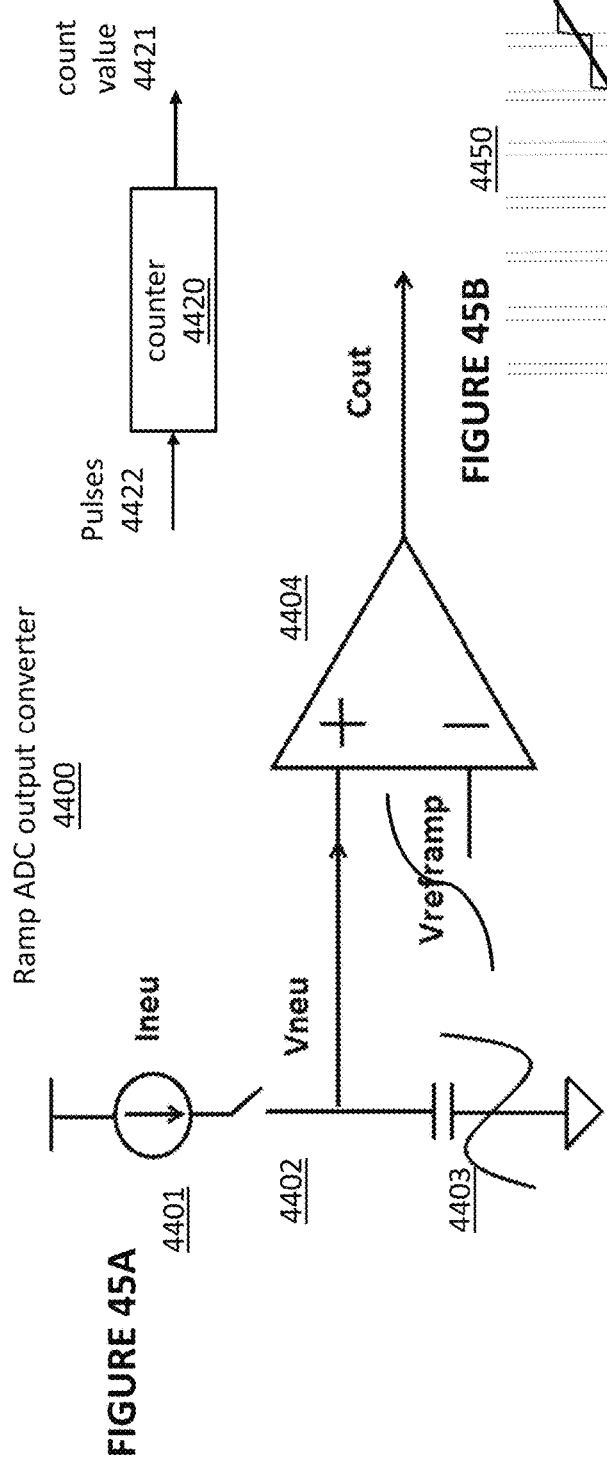
FIG. 45A depicts a ramp analog-to-digital converter output converter.
FIGS. 45B and 45C depict exemplary reference voltages for use by the ramp analog-to-digital converter output converter of FIG. 45A.

FIG. 45A depicts ramp analog-to-digital converter 4400, which comprises current source 4401 (which represents a received neuron current, Ineu), switch 4402, variable configurable capacitor 4403, and comparator 4404, which receives the voltage developed across variable configurable capacitor 4403, denoted Vneu, as the non-inverting input and configurable reference voltage Vreframp as the inverting input and generates output Cout. Vreframp is ramped up in discrete levels with each comparison clock cycle. Comparator 4404 compares Vneu against Vreframp, and as a result output Cout will be "1" when Vneu>Vreframp and will be "0" otherwise. Thus, output Cout will be a pulse, whose width varies in response to Ineu. A larger Ineu will cause Cout to be "1" for a longer period of time, resulting in a wider pulse for output Cout. A digital counter 4420 converts each pulse of output Cout into digital output bits as shown in FIG. 45B for two different Ineu currents, denoted OT1A and OT2A, respectively. Alternatively ramp voltage Vreframp is a continuous ramp voltage 4455 as shown in graph 4450 of FIG. 45B. A multi-ramp embodiment is shown in FIG. 45C for reducing the conversion time by utilizing a coarse-fine ramp conversion algorithm. First coarse reference ramp reference voltage 4471 is ramped in a fast manner to figure out the sub range for each Ineu. Next, fine reference ramp reference voltages 4472, i.e. Vreframp1 and Vreframp2, are used respectively for each sub-range for converting Ineu.currents within the respective sub-range. As shown there are two sub-ranges for fine reference ramp voltages. More than two coarse/fine steps or two sub-ranges are possible.

Figure 52:
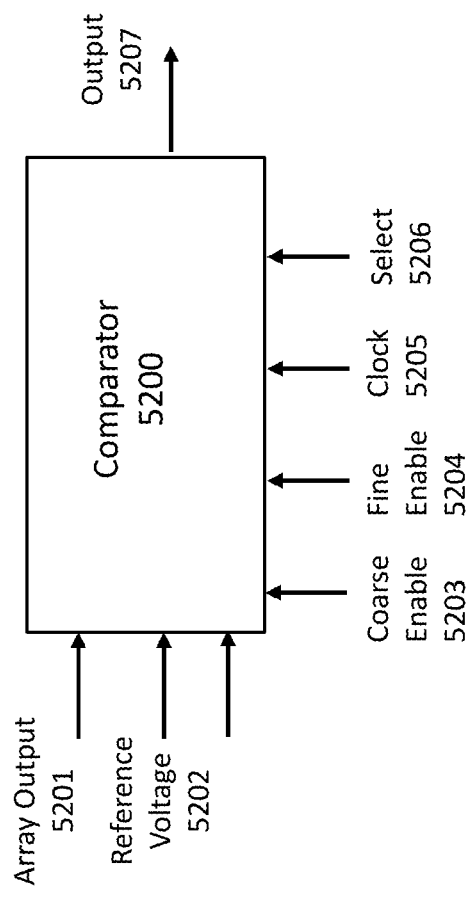
FIG. 52 depicts a comparator for optional use with the embodiments of FIGS. 37A-37B and 45A-45C.

FIG. 52 depicts comparator 5200 for optional use in place of comparators 3704 and 4404 in FIGS. 37A and 45A. Comparator 5200 can be a static comparator (which does not necessarily utilize a clock signal) or a dynamic comparator (which does utilize a comparison clock signal). If comparator 5200 is a dynamic comparator, it can comprise a clocked cross coupled inverter comparator, a StrongARM comparator, or other known dynamic comparator. Comparator 5200 operates as a coarse comparator when coarse enable 5203 is asserted, and comparator 5200 operates as a fine comparator when fine enable 5204 is asserted. Select signal 5206 optionally can be used to indicate coarse comparator mode or fine enable mode, or it optionally can be used to configure comparator 5200 to operate as a static comparator or a dynamic comparator. For instances where comparator 5200 acts as a dynamic comparator, comparator 5200 receives clock signal 5205. When operating as a dynamic comparator, comparison clock signal 5205 will be a first clock signal of a first frequency when comparator is a coarse comparator, and clock signal 5205 will be a second clock signal of a second frequency, greater than the first frequency, when comparator is a fine comparator. Comparator 5200, when operated as a coarse comparator, will have lower accuracy and a slower speed but will use less power compared to the situation where comparator 5200 operates as a fine comparator. Thus, a dynamic comparator used for coarse comparison can utilize a slow comparison clock while a dynamic comparator use for fine comparison can utilize a fast comparison clock during the conversion ramping period.

Comparator 5200 compares array output 5201 against reference voltage 5202, as was the case with comparators 3704 and 4404 in FIGS. 37A and 45A, and generates output 5205. When comparator 5200 is operating as coarse comparator, reference voltage 5202 can be an offset voltage.

During the conversion period that generates the digital output bits such as shown in FIG. 37B and FIG. 45B/45C, comparator 5200 can act as a coarse comparator and as a fine comparator during a coarse comparison period and a fine comparison period, respectively. At the beginning of this digital out bit conversion, a fine or hybrid coarse-fine (coarse in parallel with fine) comparison period is executed for a fixed time period. Next, a coarse comparison period is executed, then finally fine comparison is executed to complete the conversion.

Figure 46:
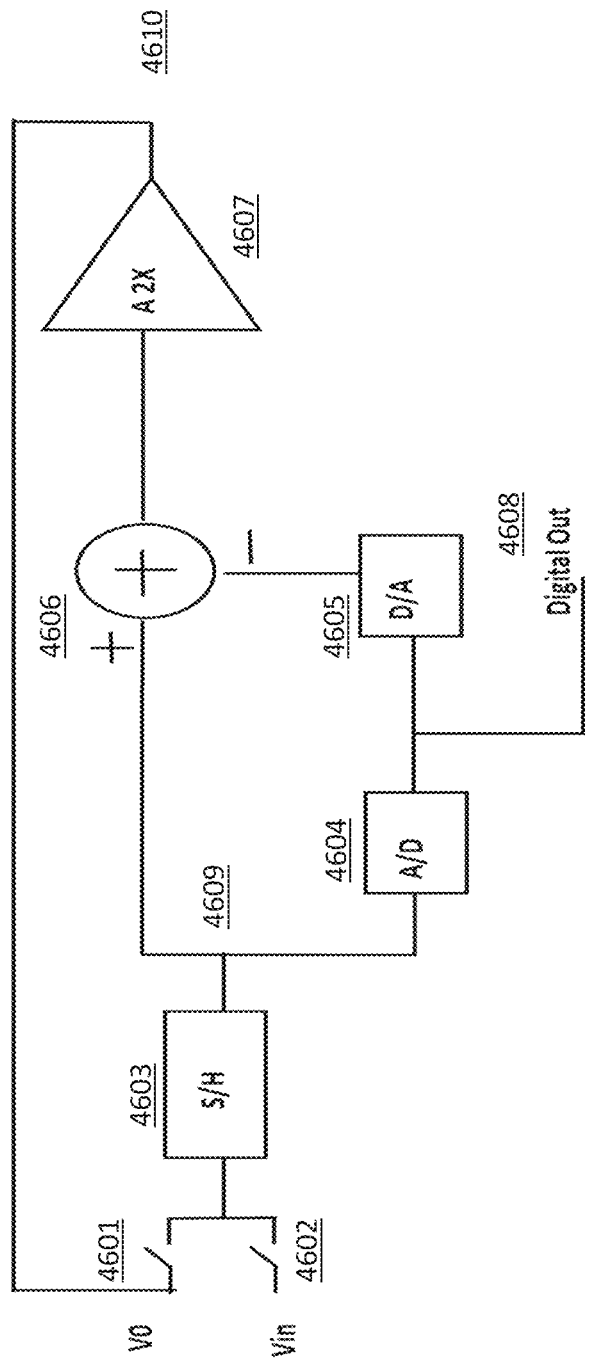
FIG. 46 depicts algorithmic analog-to-digital converter output converter 4600.

FIG. 46 depicts algorithmic analog-to-digital output converter 4600, which comprises switch 4601, switch 4602, sample-and-hold (S/H) circuit 4603, 1 bit analog-to-digital converter (ADC) 4604, 1 bit digital-to-analog converter (DAC) 4605, summer 4606, and gain of two residue operational amplifier (2× opamp) 4607. Algorithmic analog-to-digital output converter 4600 generates conversion digital output 4608 in response to analog input Vin and control signals applied to switches 4602 and 4602. An input received at analog input Vin (e.g. Vneu in FIG. 45A) is sampled first by the S/H circuit 4603 by the switch 4602, then conversion is performed in N clock cycles for N bits. For each conversion clock cycle, the 1-bit ADC 4604 compares the S/H voltage 4609 against a reference voltage (e.g., VREF/2, with VREF is full scale voltage for N bits) and outputs a digital bit (e.g., a "0" if input<=VREF/2 and a "1" if input>VREF/2). This digital bit, which is the Digital Output signal 4608, is in turn converted into an analog voltage by the 1-bit DAC 4605 (e.g. to either VREF/2 or 0V) and feed to the summer 4606 to be subtracted from the S/H voltage 4609. The 2× residue opamp 4607 then amplifies the summer difference voltage output into a conversion residue voltage 4610 which is fed to the S/H circuits 4603 through the switch 4601 for next clock cycle. Instead of this 1-bit (i.e., 2 levels) algorithmic ADC, a 1.5-bit (i.e., 3 levels) algorithmic ADC can be used to reduce the effect of offset such as from ADC 4604 and residue opamp 4607. A 1.5-bit or 2-bit (i.e., 4 levels) DAC is required for the 1.5-bit algorithmic ADC.

Figure 47A:
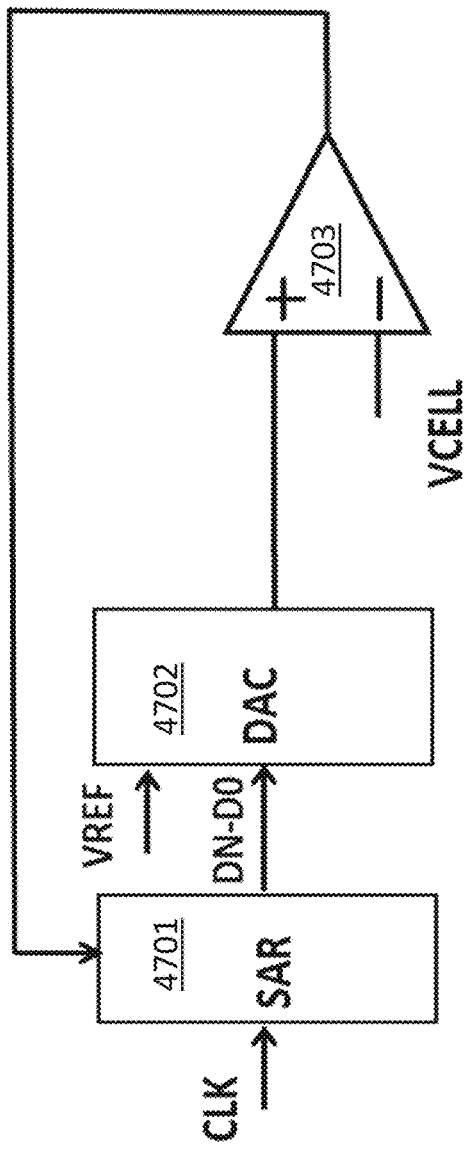
FIG. 47A depicts an SAR ADC.
Figure 47B:
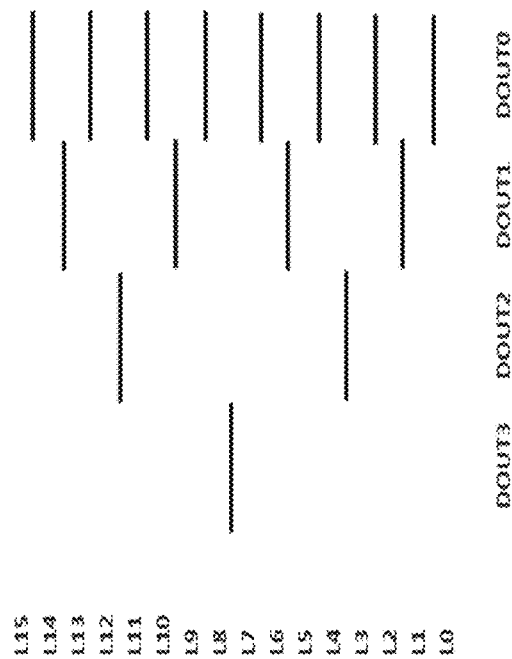
FIG. 47B depicts an algorithm for generating digital output bits for the SAR ADC of FIG. 47A.

FIG. 47A shows successive approximation register (SAR) analog-to-digital converter 4700 applied to an output neuron to convert a cell current representing an output neuron into digital output bits. SAR ADC 4700 comprises SAR 4701, digital-to-analog converter 4702, and comparator 4703. The cell current can be dropped across a resistor to generate a voltage VCELL, which is applied to the inverting input of comparator 4703. Alternatively, the cell current can charge a sample-and-hold capacitor to generate the voltage VCELL (such as Vneu as shown in FIG. 45A). A binary search is then used by SAR 4701 to compute each bit starting from MSB bit (most significant bit) to LSB bit (least significant bit). Based on the digital bits (DN to D0) from SAR 4701, DAC 4702 is used to set an appropriate analog reference voltage to comparator 4703. The output of the comparator 4703 in turns feeds back to SAR 4701 to choose the next analog level for the analog reference voltage to comparator 4703. As shown in FIG. 47B, for the example of 4-bit digital output bits, there are 4 evaluation periods: a first pulse to evaluate DOUT3 by setting an analog level for the analog reference voltage to comparator 4703 at a mid-point of the range, then a second pulse to evaluate DOUT2 by setting an analog level for the analog reference voltage to comparator 4703 half way from the mid-point of the range to the maximum point of the range or half way from the mid-point of the range to the minimum point of the range. This is followed by further steps, each step further refining the analog reference voltage level to comparator 4703. The successive outputs of SAR 4701 are the output digital bits. An alternative SAR ADC circuit is a switched cap (SC) circuit with only one reference level and local SC ratios to successively generate the ratioed reference level for successive comparisons.

Figure 48:
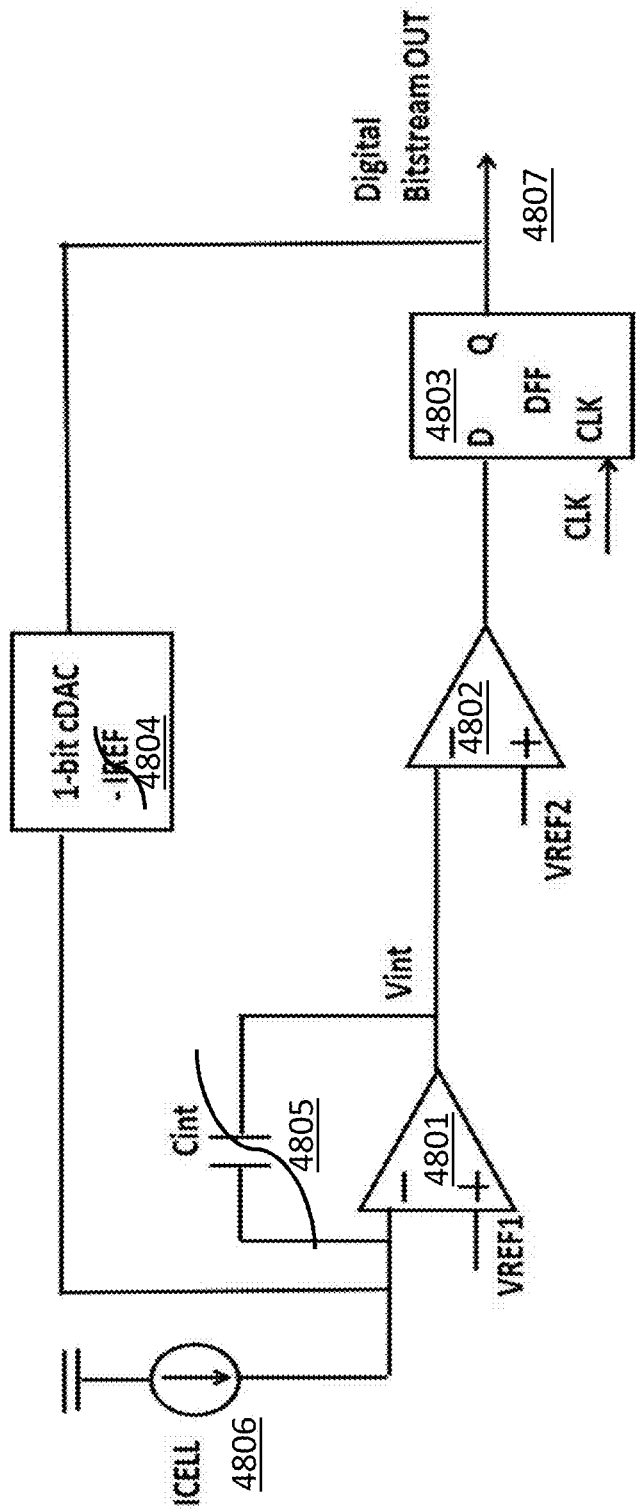
FIG. 48 depicts a sigma delta analog-to-digital converter.

FIG. 48 shows sigma delta analog-to-digital converter 4800 applied to an output neuron to convert a cell current 4806 (ICELL or Ineu) into digital output bits 4807. An integrator comprising op-amp 4801 and configurable capacitor 4805 (Cint) integrates the summation of current from cell current 4806 and a configurable reference current resulting from 1-bit current DAC 4804, which converts digital outputs 4807 into a current. Comparator 4802 compares the integrated output voltage Vint from comparator 4801 against a reference voltage VREF2, and the output of comparator 4802 is fed to the D input of clocked DFF 4803. The clocked DFF 4803 provides digital output streams 4807 responsive to the output of the comparator 4802. The digital output stream 4807 may be fed to a digital filter before being output as digital output bits 4807. The clock period for clocked DFF 4803 is configurable for different Ineu ranges.

Calibration methods 4900, 5010 5020, and 5100 will now be discussed with reference to FIGS. 49, 50A, 50B, and 51, respectively. Methods 4900, 5010, 5020, and 5100 compensate for leakage and/or offset. The leakage can comprise one or more of array leakage and circuit leakage. The array leakage can comprise one or more of memory cell leakage and leakage from one or more of decoding circuits and column write circuits. The offset can comprise one or more of array offset and circuit offset. The array offset can comprise offset from array variation due to one or more of memory cell capacitance and cell junction capacitance. The circuit offset can comprise offset from one or more of decoding circuits and column write circuits.

Figure 49:
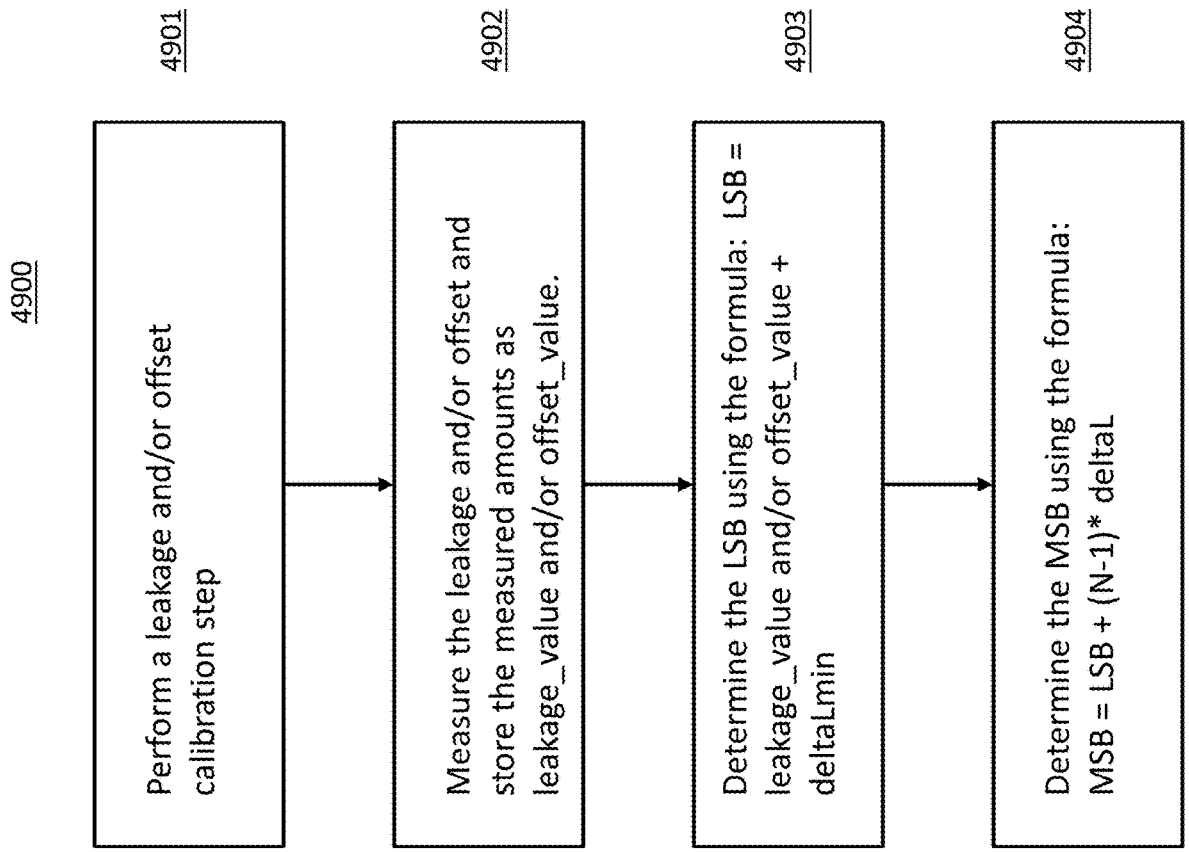
FIG. 49 depicts a calibration method.

FIG. 49 depicts calibration method 4900 to compensate for leakage and/or offset. A leakage and/or offset calibration step is performed (step 4901). The leakage and/or offset is measured and the measured amounts are stored as leakage_value and/or offset_value (step 4902). The LSB is determined using the formula: LSB=leakage_value and/or offset_value+deltaLmin. Optionally, deltaLMin is a current value that compensates for variation between levels due process, temperature, noise, or usage degradation and that ensures that the separation between levels is adequate. deltaLmin optionally can be determined from a sample data characterization. (step 4903). The MSB is determined using the formula: MSB=LSB+(N−1)*deltaL, where N is the number of levels and deltaL is a delta level amount that is equal to an average or ideal difference between two consecutive levels. (step 4904). In one embodiment, DeltaL is equal to the LSB. In another embodiment, DeltaL is determined from a sample data characterization. DeltaL may have uniform or non-uniform values for different pairings of consecutive levels.

For example for a 6-bit memory cell, there are 64 levels of currents, with each level relating to a weight in a neural network application, where N=64. A minimal offset current may be injected in this step during the calibration and during the measuring steps to create a baseline value.

Table 10 contains exemplary values for a 4-bit cell:

TABLE NO. 10

| Exemplary Levels for a 4-Bit Cell (16 Levels): | | |
| --- | --- | --- |
| Level number | Ideal Levels | Adjusted levels for offset/leakage |
| 0 | 0 | |
| 1 | 1 | |
| 2 | 2 | |
| 3 | 3 | 3 |
| 4 | 4 | 4 |
| 5 | 5 | 5 |
| 6 | 6 | 6 |
| 7 | 7 | 7 |
| 8 | 8 | 8 |
| 9 | 9 | 9 |
| 10 | 10 | 10 |
| 11 | 11 | 11 |
| 12 | 12 | 12 |
| 13 | 13 | 13 |
| 14 | 14 | 14 |
| 15 | 15 | 15 |
| 16 | | 16 |
| 17 | | 17 |
| 18 | | 18 |

FIGS. 50A and 50B depict calibration method 5000, which comprises one or more of real-time calibration method 5010 and background calibration method 5020.

In real-time calibration method 5010, a leakage and/or offset calibration is performed, comprising measuring the leakage and/or offset and storing the measured values as leakage_value and/or offset_value (step 5011). The LSB is determined using the following formula: LSB level=leakage_value and/or offset_value plus deltaLmin. (step 5012). The MSB is determined using the following formula: MSB=LSB+(N−1)*deltaL, where N is the number of levels (step 5013) The description of deltaLmin and deltaL as to FIG. 49 applies in FIG. 50A as well. A numerical example is as follows: leakage and offset=200 pA, deltaLmin=300 pA, LSB=500 pA, deltaL=400 pA, N=16, then MSB=500 pA+(16−1)*400 pA=6500 pA.

In background calibration method 5020, offset_value and/or leakage_value+temperature data are stored in fuses (e.g. a look-up-table for offset and/or leakage vs. temperature) (step 5021). This is done once or periodically in a background calibration step. The offset_value and/or leakage_value+temperature data is recalled (step 5022). A temperature adjustment for offset_value and/or leakage_value is performed as a per look-up-table or by device transistor equation (step 5023). The LSB is then determined using the following formula: LSB level=offset_value and/or leakage_value+deltaLmin (step 5024). The MSB is determined using the following formula: MSB=LSB+(N−1)*deltaL (step 5025). The description of deltaLmin and deltaL as to FIG. 49 applies in FIG. 50B as well. The temperature adjustment can be done by a look-up-table or extrapolated from device equation (e.g., sub-threshold, linear, or saturation equation)

Figures 51A, 51B:
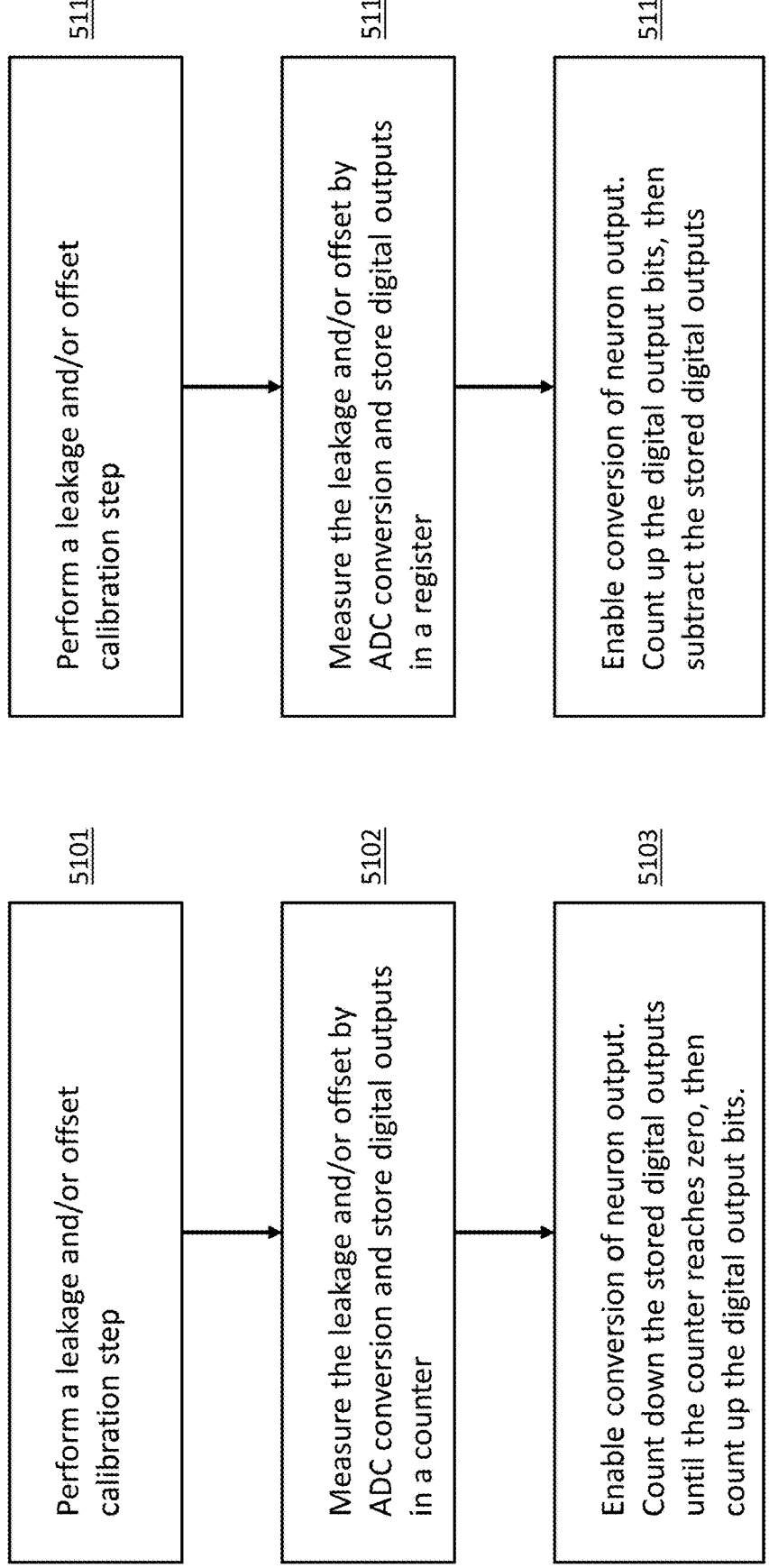
FIG. 51A depicts a calibration and conversion method.
FIG. 51B depicts another calibration and conversion method.

FIG. 51A depicts calibration and conversion method with automatic leakage and/or offset cancellation 5100. A leakage and/or offset calibration is performed (step 5101). The leakage and/or offset is measured such as by ADC conversion, and the measured digital outputs are stored in a counter (step 5102). The conversion of neuron output is enabled, and a count down is performed in the counter until the counter reaches zero (which compensates for the leakage and/or offset that was initial stored in the counter), then a count up is performed on the digital output bits (step 5103).

FIG. 51B depicts calibration and conversion method with automatic leakage and/or offset cancellation 5110, which is a variation of method 5100. A leakage and/or offset calibration is performed (step 5111). The leakage and/or offset is measured such as by ADC conversion, and the measured digital outputs are stored in a register (step 5112). The conversion of neuron output is enabled, and a count up is performed on the digital output bits and then the stored digital outputs are subtracted (step 5113).

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. An analog neural memory system comprising:
    a plurality of vector-by-matrix multiplication arrays, each array comprising non-volatile memory cells organized into rows and columns;
    an input block to provide an input to one of word line terminals and control gate terminals of non-volatile memory cells of a configurable number N of the plurality of vector-by-matrix multiplication arrays, where N can range between 1 and the total number of arrays in the plurality of vector-by-matrix multiplication arrays, wherein the arrays that receive the input provide array outputs formed of positive weight values and negative weight values in response to the input; and
    an activation function circuit to rectify the array outputs to generate a rectified output.

2. The system of claim 1, wherein the input is generated by the input block in response to an analog current received by the input block.

3. The system of claim 1, wherein the input is generated by the input block in response to a pulse of variable length received by the input block.

4. The system of claim 1, wherein the input is generated by the input block in response to a series of uniform pulses received by the input block.

5. The system of claim 1, wherein the input is generated by the input block in response to a set of bits received by the input block.

6. The system of claim 1, wherein the non-volatile memory cells are split-gate flash memory cells.

7. The system of claim 1, wherein the non-volatile memory cells are stacked-gate flash memory cells.

8. An analog neural memory system comprising:
    a plurality of vector-by-matrix multiplication arrays, each plurality of vector-by-matrix multiplication array comprising non-volatile memory cells organized into rows and columns;
    an output block to provide an output formed of positive weight values and negative weight values from a configurable number N of the plurality of vector-by-matrix multiplication arrays, where N can range between 1 and the total number of arrays in the plurality of vector-by-matrix multiplication arrays, in response to a neuron current received on one of bit line terminals and source line terminals of non-volatile memory cells of the configurable number N of the plurality of vector-by-matrix multiplication arrays; and
    an activation function circuit to rectify the output to generate a rectified output.

9. The system of claim 8, wherein the output block comprises:
    an analog-to-digital converter to convert analog current received from the N vector-by-matrix multiplication arrays into the output, wherein the output comprises a series of digital pulses.

10. The system of claim 9, wherein the analog-to-digital converter comprises a comparator.

11. The system of claim 10, wherein the comparator can be configured to operate in response to a first clock signal or a second clock signal, wherein the frequency of the second clock signal is greater than the frequency of the first clock signal.

12. The system of claim 9, wherein the analog-to-digital converter comprises an integrating analog-to-digital converter.

13. The system of claim 9, wherein the analog-to-digital converter comprises a ramp analog-to-digital converter.

14. The system of claim 9, wherein the analog-to-digital converter comprises an algorithmic analog-to-digital converter.

15. The system of claim 9, wherein the analog-to-digital converter comprises a sigma delta analog-to-digital converter.

16. The system of claim 9, wherein the analog-to-digital converter comprises a successive approximation register analog-to-digital converter.

17. The system of claim 9, wherein the system further comprises:
a digital data-to-voltage converter for converting the series of digital pulses into a voltage.

18. The system of claim 9, wherein the system further comprises:
an integrating analog-to-digital data converter for converting the analog current into a set of digital bits.

19. The system of claim 18, wherein the system further comprises:
a digital bits-to-pulse width converter to convert the set of digital bits into one or more pulses where the width of the one or more pulses is proportional to the value of the set of digital bits.

20. The system of claim 9, wherein the system further comprises:
a current-to-voltage converter to convert the output analog current into a voltage.

21. The system of claim 8, wherein the output is a pulse of variable length.

22. The system of claim 8, wherein the output is a series of uniform pulses.

23. The system of claim 8, wherein the output is a set of bits.

24. The system of claim 8, wherein the non-volatile memory cells are split-gate flash memory cells.

25. The system of claim 8, wherein the non-volatile memory cells are stacked-gate flash memory cells.

26. The system of claim 8, wherein the output block performs calibration to compensate for temperature.

27. The system of claim 8, wherein the output block performs calibration to compensate for process or voltage supply variation.

28. An analog neural memory system comprising:
a plurality of vector-by-matrix multiplication arrays, each array comprising non-volatile memory cells organized into rows and columns;
an output block to perform a verify operation after a programming operation based on an output formed of positive weight values and negative weight values from one of bit line terminals and source line terminals of non-volatile memory cells of a configurable number N of the vector-by-matrix multiplication arrays, where N can range between 1 and the total number of arrays in the plurality of vector-by-matrix multiplication arrays; and
an activation function circuit to rectify the output to generate a rectified output.

29. The system of claim 28, wherein accuracy of the verify operation exceeds inference accuracy.

30. The system of claim 29, wherein the inference is performed by an integrating ADC.

31. An analog neural memory system comprising:
a plurality of vector-by-matrix multiplication arrays, each array comprising non-volatile memory cells organized into rows and columns;
an input block to provide an input on one of word line terminals and control gate terminals of non-volatile memory cells of a first configurable number N of the vector-by-matrix multiplication arrays, where N can range between 1 and the total number of arrays in the plurality of vector-by-matrix multiplication arrays;
an output block to provide an output formed of positive weight values and negative weight values from a second configurable number M of the vector-by-matrix multiplication arrays, where M can range between 1 and the total number of arrays in the plurality of vector-by-matrix multiplication arrays, in response to a neuron current received on one of bit line terminals and source line terminals of non-volatile memory cells of the configurable number M of the plurality of vector-by-matrix multiplication arrays; and
an activation function circuit to rectify the output to generate a rectified output.

32. The system of claim 31, wherein the input is generated by the input block in response to an analog current received by the input block.

33. The system of claim 31, wherein the input is generated by the input block in response to a pulse of variable length received by the input block.

34. The system of claim 31, wherein the input is generated by the input block in response to a series of uniform pulses received by the input block.

35. The system of claim 31, wherein the input is generated by the input block in response to a set of bits received by the input block.

36. The system of claim 31, wherein the output is an analog current.

37. The system of claim 31, wherein the output is a pulse of variable length.

38. The system of claim 31, wherein the output is a series of uniform pulses.

39. The system of claim 31, wherein the output is a set of bits.

40. The system of claim 31, wherein the output block comprises an analog-to-digital converter comprising a comparator.

41. The system of claim 40, wherein the comparator can be configured to operate in response to a first clock signal or a second clock signal, wherein the frequency of the second clock signal is greater than the frequency of the first clock signal.

42. The system of claim 40, wherein the comparator can be configured to operate in a coarse comparison period or fine comparison period during the conversion.

43. The system of claim 31, wherein the non-volatile memory cells are split-gate flash memory cells.

44. The system of claim 31, wherein the non-volatile memory cells are stacked-gate flash memory cells.

45. The system of claim 31, wherein the output block performs calibration to compensate for temperature.

46. The system of claim 31, wherein the output block performs calibration to compensate for process variation.

47. The system of claim 31, wherein the output block performs calibration to compensate for voltage supply variation.

48. An analog neural memory system comprising:
a plurality of vector-by-matrix multiplication arrays, each vector-by-matrix multiplication array comprising non-volatile memory cells organized into rows and columns;
an output block to receive output neuron current formed of positive weight values and negative weight values from one of bit lines and source lines of one or more of the vector-by-matrix multiplication arrays and to generate digital output bits using a ramp analog-to-digital converter; and an activation function circuit to rectify the output neuron current to generate a rectified output.

49. The system of claim 48, further comprising a discrete or continues ramping reference voltage.

50. The system of claim 48, further comprising a sample-and-hold circuit and a comparator with a ramping reference voltage applied to an input of the comparator.

51. The system of claim 50, wherein the ramping reference voltage comprises a coarse voltage ramp followed by a plurality of fine voltage ramps.

52. The system of claim 51, wherein the coarse voltage ramp comprises multiple coarse ramping voltages.

53. An analog neural memory system comprising:

a plurality of vector-by-matrix multiplication arrays, each vector-by-matrix multiplication array comprising non-volatile memory cells; and an input block capable of converting a plurality of digital input bits into a binary-indexed, time-summation signal as a timing input for at least one of the vector-by-matrix multiplication arrays.

54. The system of claim 53, wherein the input block generates binary indexed pulses for each digit input bit.

55. The system of claim 53, wherein the input block comprises a storage latch for each input digital bit.

56. The system of claim 53, further comprising a generator to generate binary-indexed pulses.

57. The system of claim 53, wherein the input block comprises a row decoder.

58. The system of claim 53, wherein the binary-indexed, time summation signal is generated in response to digital input bits for each row.

59. The system of claim 53, wherein the time summation is from LSB to MSB or any random order.

60. A method of performing output conversion for an analog neural memory comprising a plurality of vector-by-matrix multiplication arrays, each vector-by-matrix multiplication array comprising non-volatile memory cells, the method comprising:

receiving output neuron current formed of positive weight values and negative weight values from one of bit lines and source lines of one or more of the plurality of vector-by-matrix multiplication arrays;

rectifying the output neuron current to generate a rectified output; and generating digital output bits using the rectified output and a ramp analog-to-digital converter, the converter operating in a coarse comparison mode and a fine comparison mode.

61. The method of claim of 60, wherein the generating step utilizes a dynamic comparator.

62. The method of claim of 61, wherein the dynamic comparator is configured differently for coarse comparison mode and the fine comparison mode.

63. The method of claim of 62, wherein the dynamic comparator receives a first comparison clock for coarse comparison mode and a second comparison clock for the fine comparison mode, wherein the frequency of the second comparison clock exceeds the frequency of the first comparison clock.

* * * * *